US012741982B2

(12) United States Patent
Che et al.

(10) Patent No.: US 12,741,982 B2

(45) Date of Patent: Sep. 22, 2026

(54) SPIRO-CYCLOMETALATED IRIDIUM EMITTERS FOR OLED APPLICATIONS

(71) Applicant: THE UNIVERSITY OF HONG KONG, Hong Kong (HK)

(72) Inventors: Chi Ming Che, Hong Kong (HK); Tsz Lung Lam, Hong Kong (HK); Wenquan Lai, Hong Kong (HK); Gang Cheng, Hong Kong (HK)

(73) Assignee: THE UNIVERSITY OF HONG KONG, Hong Kong (HK)

( * ) Notice: Subject to any disclaimer, the term of this patent is extended or adjusted under 35 U.S.C. 154(b) by 885 days.

(21) Appl. No.: 18/021,886

(22) PCT Filed: Aug. 18, 2021

(86) PCT No.: PCT/CN2021/113254

§ 371 (c)(1),
(2) Date: Feb. 17, 2023

(87) PCT Pub. No.: WO2022/037613

PCT Pub. Date: Feb. 24, 2022

(65) Prior Publication Data

US 2023/0357294 A1 Nov. 9, 2023

Related U.S. Application Data

(60) Provisional application No. 63/068,389, filed on Aug. 21, 2020, provisional application No. 63/067,386, filed on Aug. 19, 2020.

(51) Int. Cl.

| | |
|---|---|
| ***C07F 15/00*** | (2006.01) |
| ***C09K 11/06*** | (2006.01) |
| ***H10K 50/11*** | (2023.01) |
| ***H10K 85/30*** | (2023.01) |
| ***H10K 85/40*** | (2023.01) |
| ***H10K 85/60*** | (2023.01) |

(52) U.S. Cl.

CPC .......... *C07F 15/0033* (2013.01); *C09K 11/06* (2013.01); *H10K 50/11* (2023.02); *H10K 85/342* (2023.02); *H10K 85/40* (2023.02); *H10K 85/615* (2023.02); *H10K 85/653* (2023.02); *H10K 85/654* (2023.02); *C09K 2211/185* (2013.01)

(58) Field of Classification Search

CPC .............. C07F 15/0033; H10K 85/342; C09K 2211/185

See application file for complete search history.

(56) References Cited

U.S. PATENT DOCUMENTS

2019/0341561 A1* 11/2019 Tsai ....................... C09K 11/06

OTHER PUBLICATIONS

International Search Report, Written Opinion a for International Application No. PCT/CN2021/113254 mailed on Nov. 17, 2021, 11 pages.

* cited by examiner

*Primary Examiner* — Jenna N Chandhok

(74) *Attorney, Agent, or Firm* — Amin, Turocy & Watson, LLP

(57) ABSTRACT

Disclosed are spiro-cyclometalated iridium emitters and their preparation, OLED devices including the spiro-cyclometalated iridium emitters, and methods related thereto.

12 Claims, 13 Drawing Sheets

Ir(L1)L^X

Ir(L2)L^X

Ir(L3)L^X

Ir(L4)L^X

Ir(L5)L^X

Ir(L6)L^X

Ir(L1)L^X

Ir(L2)L^X

Ir(L3)L^X

Ir(L4)L^X

Ir(L5)L^X

Ir(L6)L^X

= ppy , dfppy , acac
acac (R = Me)
acac-tBu, (R = tBu)
acac-mes, (R = mes)

, pic ,

SPN , piq , dpfiq , mpq , acNac

NacNac

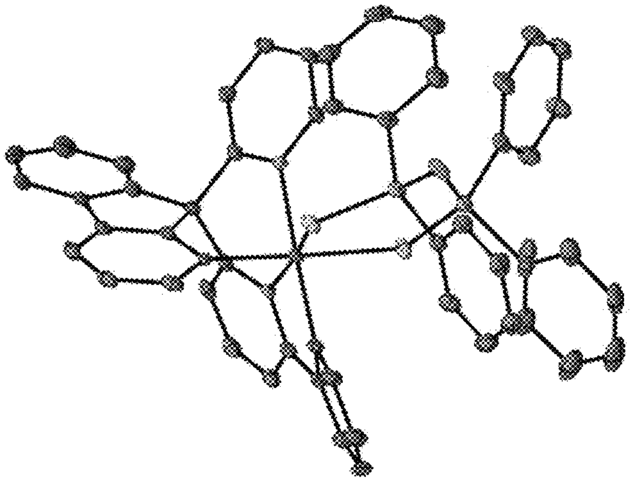
Ir(L1)SPN
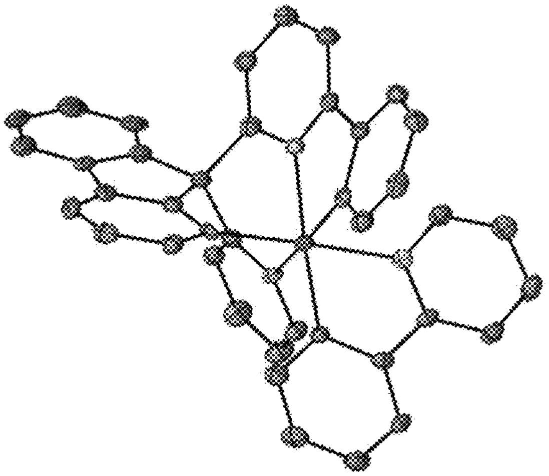
Ir(L1)ppy
Fig. 2

| Emitter | Medium[a] | $\lambda_{abs}$ / nm ($\varepsilon$ / × $10^3$ $mol^{-1}$ $dm^3$ $cm^{-1}$) | $\lambda_{max}$ / nm (Φ; τ / μs)[b] | $k_r$ / ×$10^5$ $s^{-1}$ | $k_{nr}$ / ×$10^5$ $s^{-1}$ |
|---|---|---|---|---|---|
| Ir($L_1$)ppy | $CH_2Cl_2$ | 267 (37.1), 353 (8.8), 389 (8.1), 470(br) (1.3), 497 (0.7) | 562 (0.663; 1.7) | 3.9 | 2.0 |
| | 2% in PMMA | | 551 (0.752; 1.7) | 4.4 | 1.5 |
| | 5% in PMMA | | 543 (0.679; 1.4) | 4.9 | 2.3 |
| | 77K 2-MeTHF | | 536 (6.0), 559(sh) | | |
| Ir($L_1$)acac | $CH_2Cl_2$ | 255 (38.0), 288 (36.0), 336 (8.7), 387 (5.7), 462(br) (1.0), 499 (0.5) | 567 (0.673; 3.4) | 2.0 | 1.0 |
| | 2% in PMMA | | 546 (0.342; 2.7) | 1.3 | 2.4 |
| | 5% in PMMA | | 551 (0.310; 2.6) | 1.2 | 2.7 |
| | 77K 2-MeTHF | | 536 (11.6), 566(sh) | | |
| Ir($L_1$)acac-tBu | $CH_2Cl_2$ | 258 (37.7), 345 (8.1), 398 (4.1) | 567 (0.620; 3.8) | 1.6 | 1.0 |
| | toluene | 292 (23.4), 353 (7.7), 400 (5.5) | 551 (0.700; 3.2) | 2.2 | 0.9 |
| | 5% PMMA | | 554 (0.680; 2.1) | 3.2 | 1.5 |
| Ir($L_1$)piq | $CH_2Cl_2$ | 278 (34.7), 331 (14.6), 349 (12.0), 409 (10.2), 465 (4.1) | 647 (0.480; 2.0) | 2.4 | 2.6 |
| | toluene | 291 (29.1), 335 (14.2), 349 (11.9), 420 (9.0), 474 (3.2) | 630 (0.520; 2.1) | 2.5 | 2.3 |
| | 5% PMMA | | 627 (0.460; 1.5) | 3.1 | 3.6 |
| Ir($L_1$)SPN | $CH_2Cl_2$ | 260 (40.7), 347 (6.2), 393 (5.1), 467(br) (0.8), 490 (0.5) | 554 (0.021; 0.1) | 2.1 | 97.9 |
| | 2% in PMMA | | 556 (0.439; 1.5) | 2.9 | 3.7 |
| | 5% in PMMA | | 556 (0.430; 1.5) | 2.9 | 3.8 |
| | 77K 2-MeTHF | | 520 (9.6), 545(sh) | | |
| Ir($L_1$)pic | $CH_2Cl_2$ | 260 (24.4), 284 (18.5), 332 (6.4), 364 (5.7), 410 (2.5), 492 (0.3) | 556 (0.076; 0.4) | 1.9 | 23.1 |
| | 2% in PMMA | | 553 (0.365; 1.6) | 2.3 | 4.0 |
| | 5% in PMMA | | 553 (0.347; 1.5) | 2.3 | 4.4 |
| | 77K 2-MeTHF | | 514 (6.7), 543(sh) | | |
| Ir($L_2$)pic | $CH_2Cl_2$ | 262 (28.7), 282 (26.2), 324 (11.3), 362 (9.4), 492 (0.5) | 561 (0.029; 0.1) | 2.9 | 97.1 |
| | 2% in PMMA | | 554 (0.396; 1.5) | 2.6 | 4.0 |
| | 5% in PMMA | | 554 (0.466; 1.2) | 3.9 | 4.5 |
| | 77K 2-MeTHF | | 512 (6.5), 542(sh) | | |

[a] Measured at 298K unless specified. [b] Measured by integration sphere.

Fig. 3

Device structure:

ITO/HAT-CN(5 nm)/TAPC(40 nm)/TCTA(10 nm)/TCTA:B3:[Ir($L_1$)(ppy)](20 nm)/B3(10 nm)/TmPyPb (40 nm)/LiF(1.2 nm)/Al(100 nm)

| Concentration | *L* [cd $m^{-2}$][a] | CE [cd $A^{-1}$][b] | | PE [lm $W^{-1}$][c] | | EQE [%][d] | | CIE [(x, y)][e] |
|---|---|---|---|---|---|---|---|---|
| | | Max | at 1000 cd $m^{-2}$ | Max | at 1000 cd $m^{-2}$ | Max | at 1000 cd $m^{-2}$ | |
| 2 wt% | 109000 | 57.14 | 56.91 | 52.86 | 37.48 | 17.00 | 16.89 | 0.42, 0.56 |
| 4 wt% | 91500 | 51.36 | 49.50 | 55.32 | 31.10 | 15.82 | 15.17 | 0.44, 0.55 |
| 6 wt% | 94300 | 49.74 | 48.11 | 51.08 | 30.36 | 15.46 | 14.88 | 0.44, 0.55 |

Fig. 5

Ir(L1)(SPN)

Ir(L3)(acac)

Ir(L1)(ppy)

Ir(L4)(ppy)

SPIRO-CYCLOMETALATED IRIDIUM EMITTERS FOR OLED APPLICATIONS

TECHNICAL FIELD

Disclosed are spiro-cyclometalated iridium emitters and their preparation, OLED devices including the spiro-cyclometalated iridium emitters, and methods related thereto.

BACKGROUND

Because of the privileged photophysical and electroluminescent properties, iridium (III) complexes are currently one of the most promising candidates of practical phosphorescent OLED (organic light emitting diode) emissive materials for application in flat-panel display and solid state lighting. The tris-bidentate iridium (III) complexes including the bis-cyclometalated and tris-cyclometalated complexes are among the most established Ir(III) OLED emitters. Nonetheless, the intrinsic vulnerability against geometrical isomerization under drastic conditions associated with this class of emitters has been a notorious issue. In the context of molecular architecture, assembling chelating ligand with higher denticities (e.g. tridentate, tetradentate, hexadentate) in the construction of iridium (III) phosphors has been considered a way to address this issue that accompanies a potential benefit of elevating the thermal and chemical stabilities. As such, there is a growing research in Ir(III) phosphors bearing multidentate cyclometalated ligand(s) for OLED applications in recent years. There are a number of reports on iridium(III) phosphors bearing two distinctive tridentate ligands in a [3+3] coordination mode and a suite of monodentate, bidentate and tridentate ligands in a [3+2+1] coordination mode. In terms of chelate effect, tetradentate iridium (III) chelates including those with [4+1+1] and [4+2] modes are in principal superior than the tridentate analogues, examples of which, particularly those with [4+2] mode which requires a non-planar tetradentate ligand, are scant, though.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Rather, the sole purpose of this summary is to present some concepts of the invention in a simplified form as a prelude to the more detailed description that is presented hereinafter.

In one embodiment, described herein are iridium containing emitters containing a coordination complex comprising a central iridium atom and a tetradentate cyclometalated ligands including at least one spiro linkage and a bidentate ligand.

In another embodiment, described herein are organic light emitting devices (OLED) containing an anode; a cathode; and an organic layer disposed between the anode and the cathode, the organic layer comprising an iridium containing emitter layer comprising from 0.1% by weight to 25% by weight of a coordination complex comprising a central iridium atom and a tetradentate cyclometalated ligands including at least one spiro linkage and a bidentate ligand. In yet another embodiment, the organic layer comprises an iridium containing emitter layer comprising from 1% by weight to 20% by weight of a coordination complex.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF SUMMARY OF THE DRAWINGS

FIG. 2 depicts the X-ray crystal structure of two Ir(III) emitters in accordance with two embodiments.

FIG. 3 reports a Table showing the photophysical data of the new iridium (III) emitters.

FIG. 5 reports a Table with device data.

DETAILED DESCRIPTION

Described herein is a novel molecular design approach to phosphorescent iridium (III) emitters for OLED applications which feature a [4+2] coordination architecture by combining a tripodal arranged, cross-shaped tetradentate cyclometalated ligand scaffold and an auxiliary bidentate ligand. This new class of Ir (III) emitters has privileged properties including one or more of: emissive dopant materials including ease of emission color tuning, high thermal and/or stereochemical stabilities, high emission quantum efficiency, and short radiative lifetime. A prototype device fabricated with one of the Ir (III) emitters achieved maximum luminance and EQE (external quantum efficiency) of 109,000 $cd/m^2$ and 17.0%, respectively.

The novelty and unobvious elements of the emitters described herein lie in one or more of: (i) the spatial and morphological design of the non-planar tetradentate ligand with tripodal-like coordination mode by introducing a spiro linkage to connect three equatorial coordination sites with an apical coordination site and/or (ii) the rare demonstration of the combined use of a tetradentate ligand and a bidentate ligand to construct octahedral iridium (III) emitters with a [4+2] coordination architecture as high-performance OLED material.

The rigid structure of the cross-shaped tetradentate cyclometalated ligand with a stable pre-defined coordination geometry offers high stereochemical stability to the resulting Ir (III) emitters described in this invention against fac-mer stereoisomerism. The [4+2] molecular architecture would also allow a stronger ligand coordination due to enhanced chelating effect, affording iridium (III) emitters with higher chemical and thermal stabilities, which is advantageous for practical use.

Figure 1:
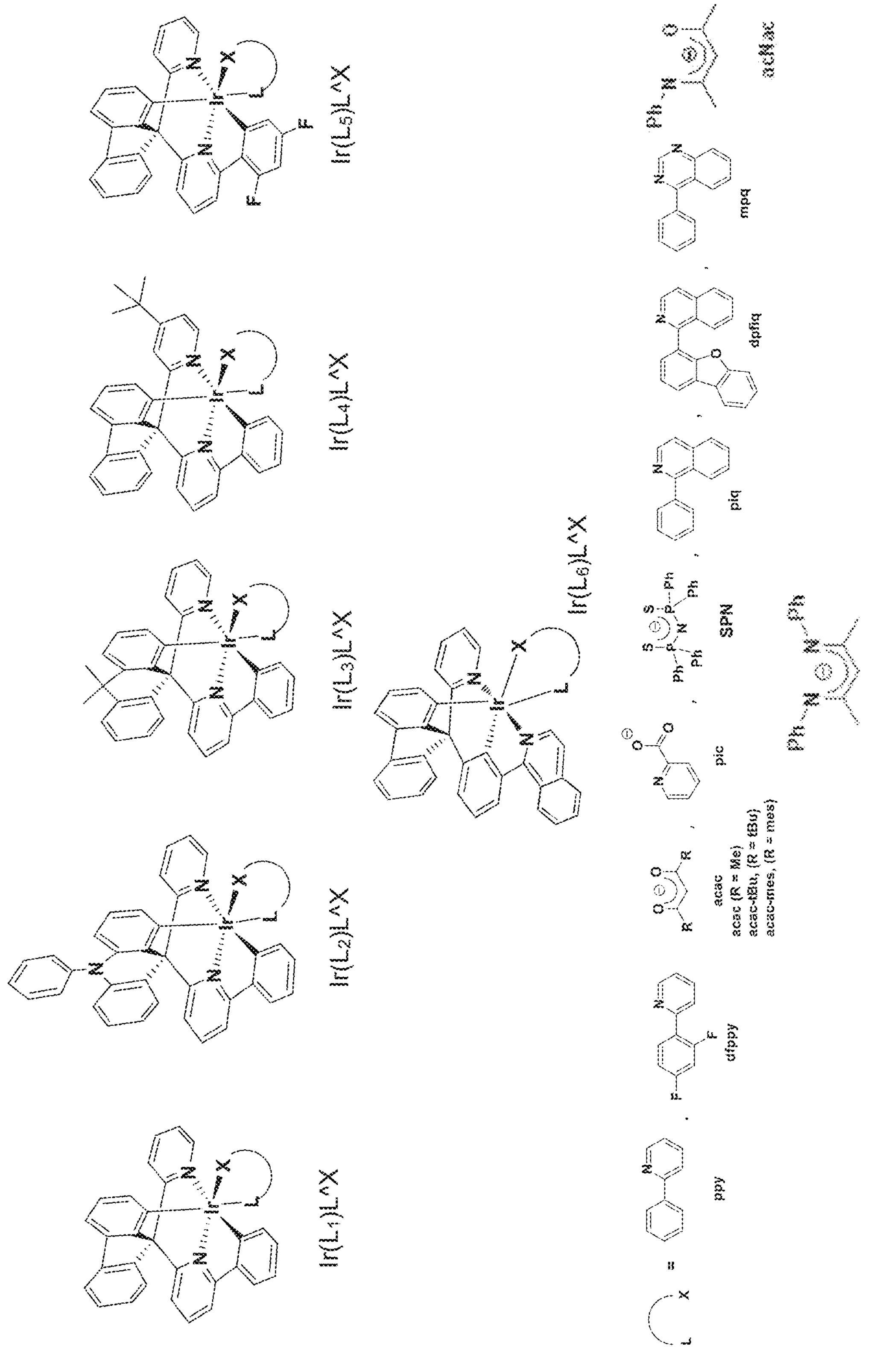
FIG. 1 depicts the chemical structures of the new Ir(III) emitters.

Referring to FIG. 1, the chemical structures of new Ir (III) emitters are shown. The rigid cross-shaped tetradentate cyclometalated ligands include at least one of a spiro-aryl linkage, including spiro-fluorene, spiro-triphenylamine, and spiro-dimethyl acridine, affording a stable tripodal-like coordination environment. The bidentate ligands described herein are the ancillary ligands commonly employed for Ir (III) emitters, and can be changed readily to a various set of monoanionic ligands, which could serve to modulate the photophysical properties of the Ir (III) emitters, as desired or dictated by specific instances.

As used herein, ppy is 2-phenylpyridine; dfppy is 2-(2, 4-difluorophenyl) pyridine; piq is 1-phenylisoquinoline; acac is acetylacetonate; acac-tBu is 2,2,6,6-tetramethylheptane-3,5-dionate; acac-mes is 1,3-dimesitylpropane-1,3-dione; SPN is tetraphenyldithioimidodiphosphinate; acNac is a phenyl-substituted β-ketoiminate; NacNac is a phenyl-substituted β-diketiminate; dpfiq is 1-(dibenzo[b,d]furan-4-yl) isoquinoline; mpq is 4-phenylquinazoline; and pic is picolinic acid.

Referring to FIG. 2, the X-ray crystal structures of two Ir (III) emitters from FIG. 1 are shown.

Referring to FIG. 3, a Table is shown reporting the photophysical data of the new iridium (III) emitters. As can be observed, the Ir (III) emitters display high phosphorescence quantum yields of up to 75% and/or radiative rate constants of $4.4\times10^5$ $s^{-1}$, which are attractive for employment as an emissive dopant.

Figure 4:
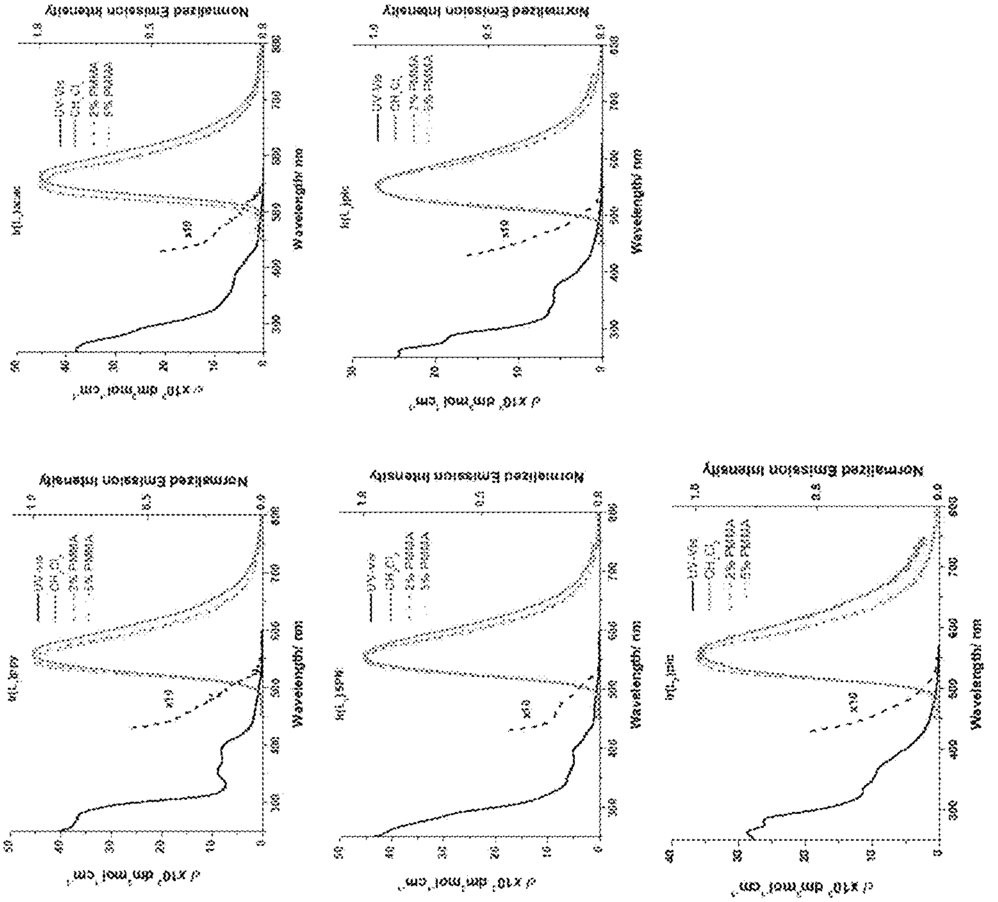
FIG. 4 represents graphical data from the Table of FIG. 3.

Referring to FIG. 4, data in graphical format is reported from the iridium (III) emitters described in the Table of FIG. 3.

Referring to FIG. 5, a Table with device data is reported. The devices fabricated with $Ir(L_1)$ ppy using different doping concentrations show efficient yellow electroluminescence. The maximum luminance and EQE of these devices were measured up to 109,000 $cd/m^2$ and 17.0%, respectively.

Figure 6:
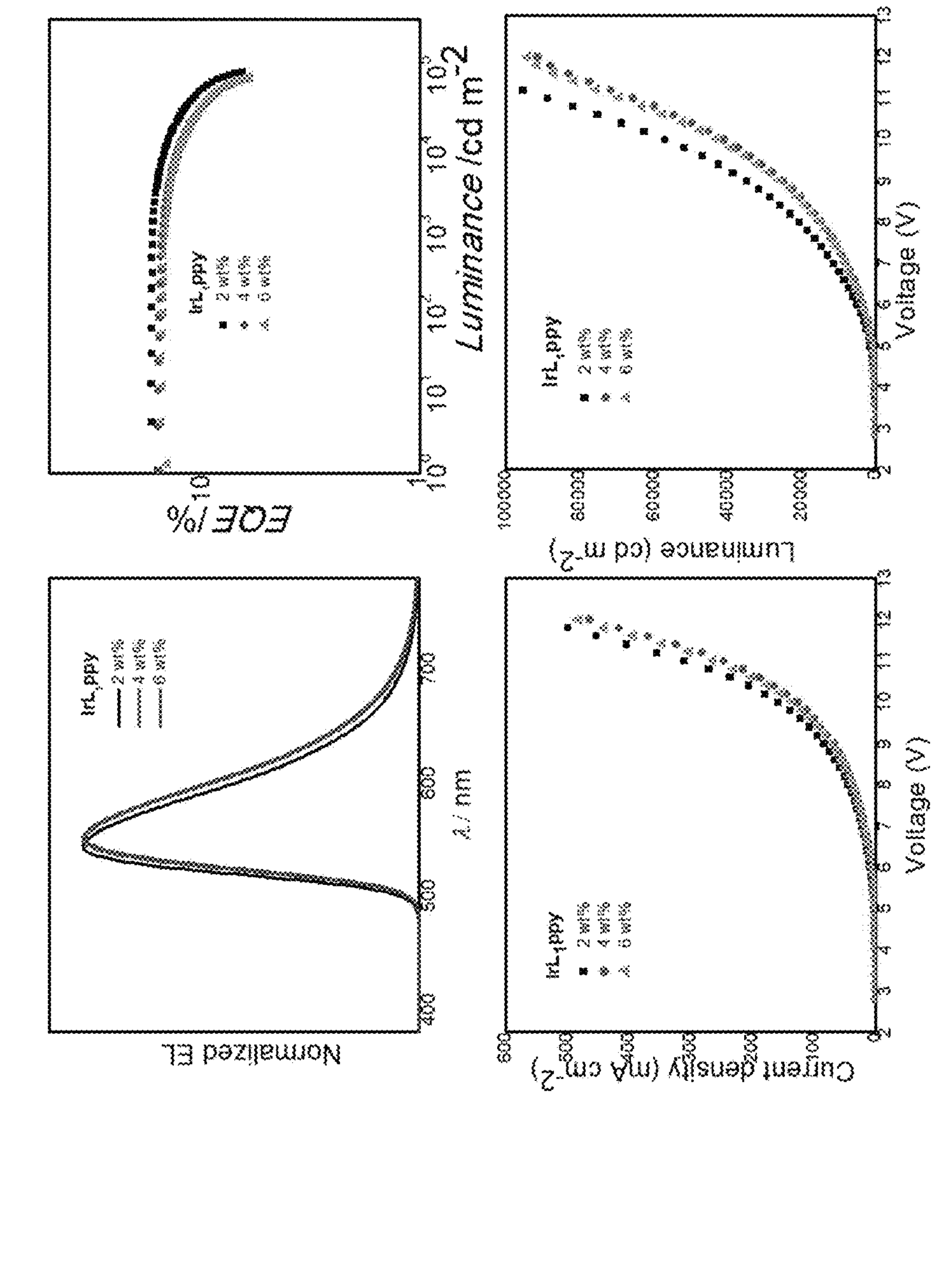
FIG. 6 represents graphical format of device data.

Referring to FIG. 6, data in graphical format as a compliment to the Table data of FIG. 5 is reported.

Figure 7:
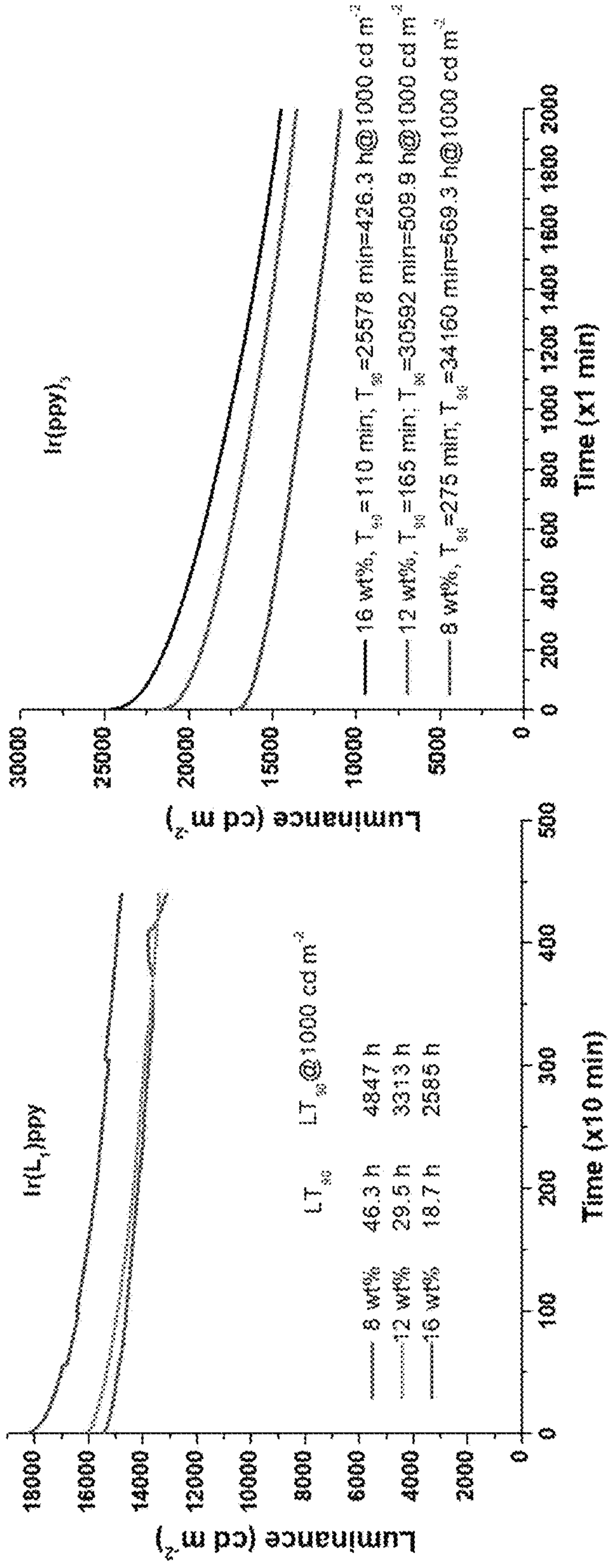
FIG. 7 represents graphical format of device lifetime data.
Figure 8:
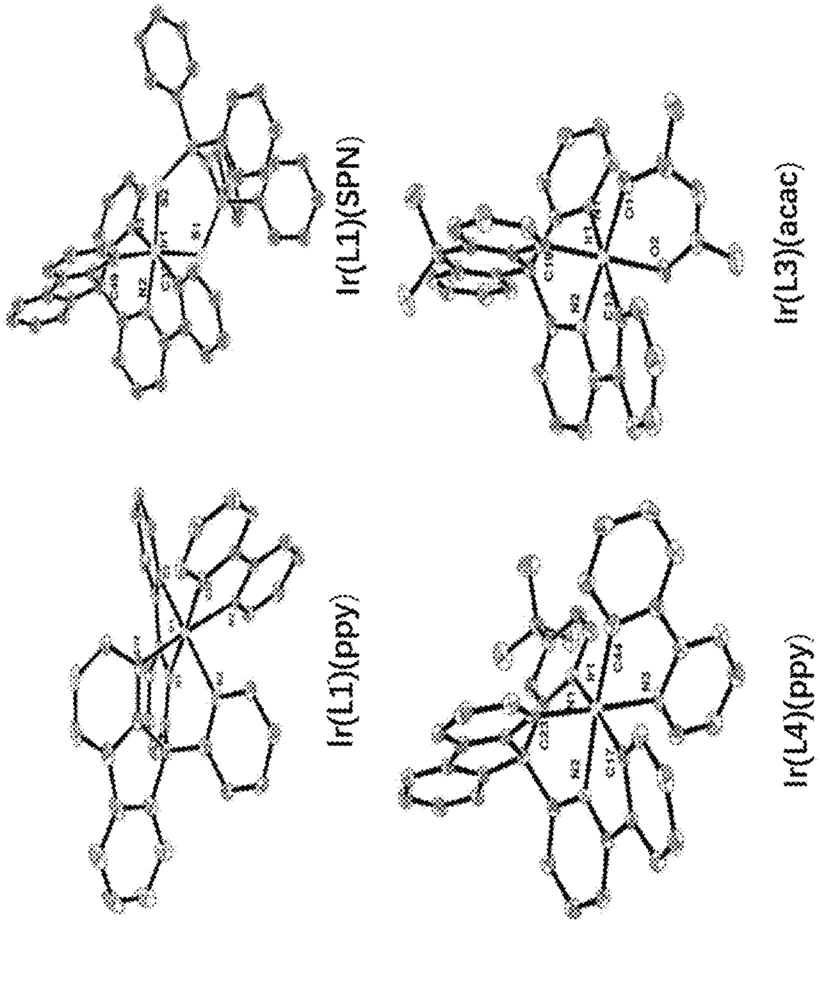
FIG. 8 depicts X-ray crystal structures of four Ir(III) complexes in accordance with various embodiments.
Figure 10:
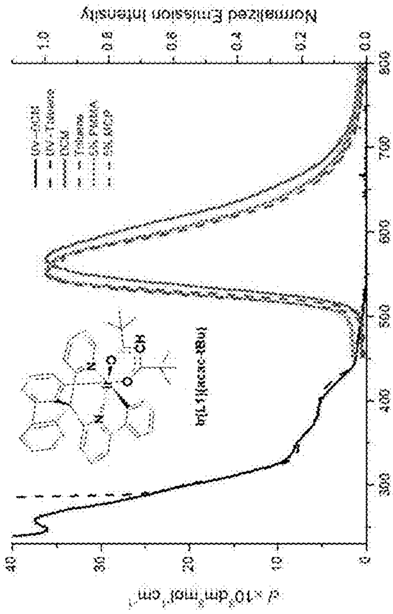
FIGS. 9-18 represent graphical data from various embodiments of the new iridium (III) emitters.
Figure 9:
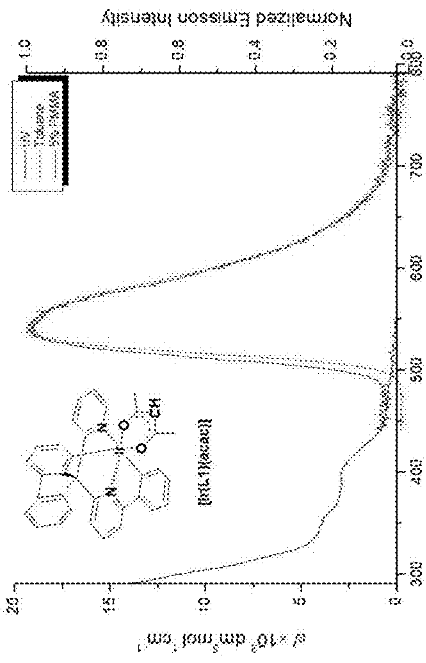
Figure 11:
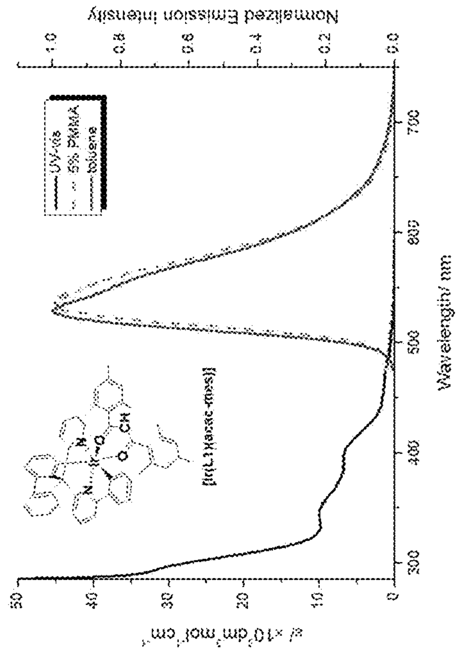
Figure 12:
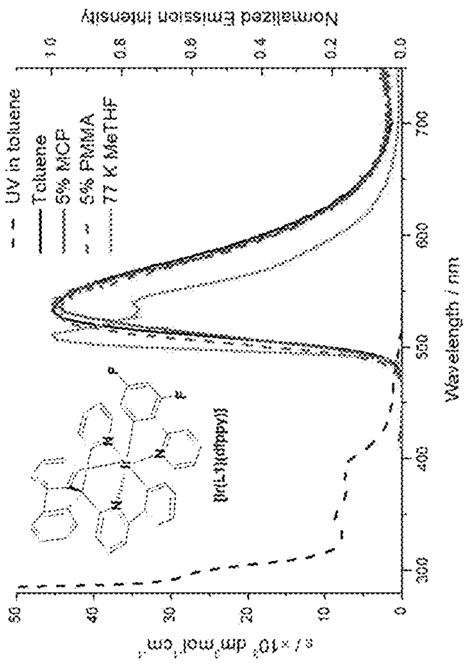
Figure 14:
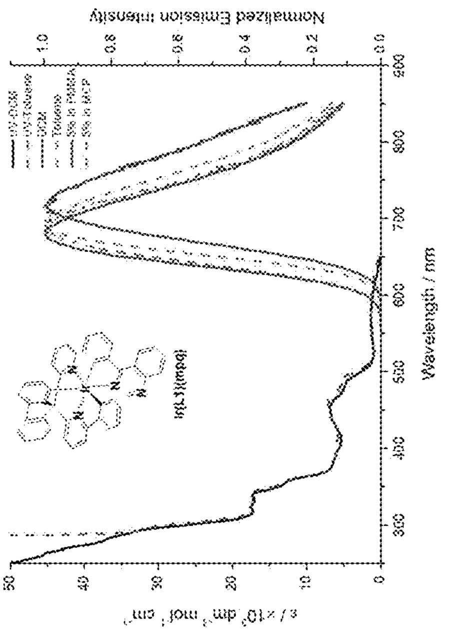
Figure 13:
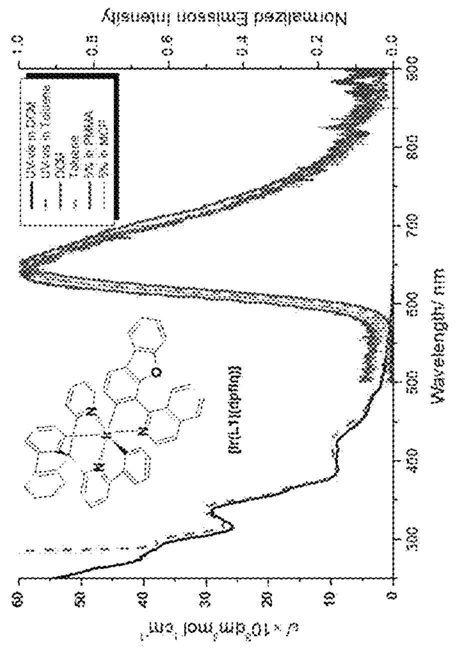
Figure 15:
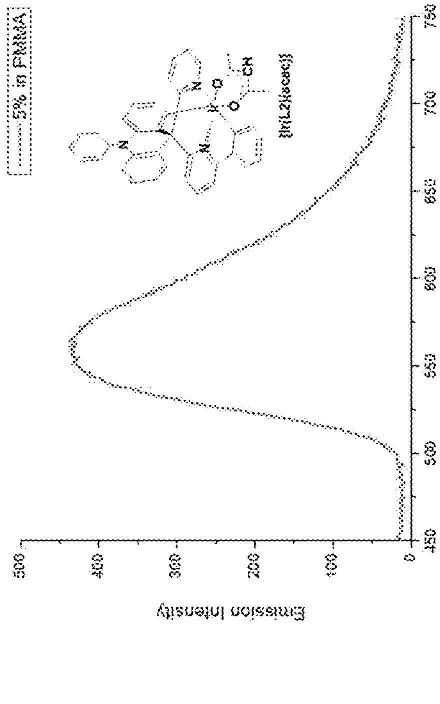
Figure 16:
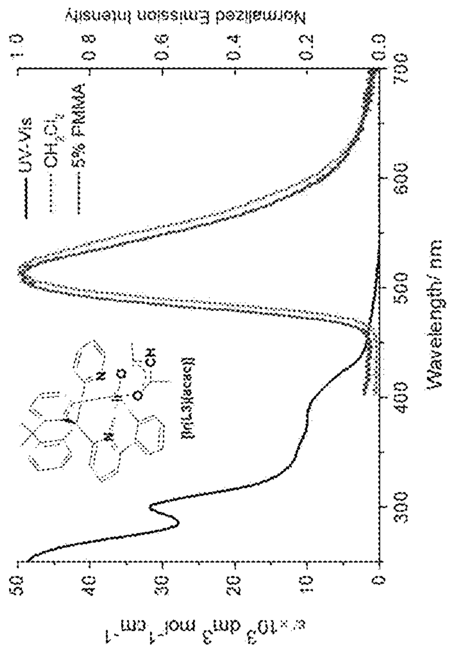
Figure 18:
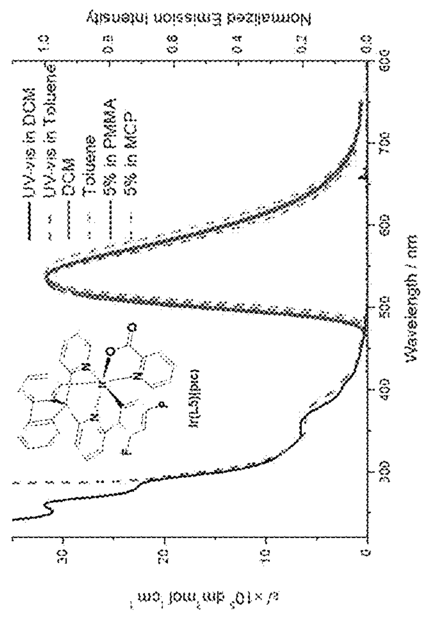
Figure 17:
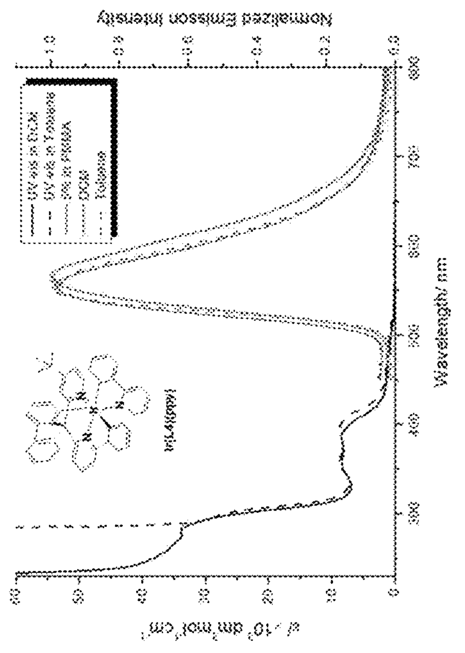

Referring to FIG. 7, device lifetime is reported. Significantly, device evaluation revealed that at practical initial luminance of 1000 cd $m^{-2}$, the operational lifetime of the $Ir(L_1)$ ppy device is more than 5 times longer than that of $Ir(ppy)_3$ having the same device configuration. These results highlight the distinct stability advantage of the iridium (III) emitters described herein for practical OLED applications.

The emitters of the invention can be formed into thin films by vacuum deposition, spin-coating, inkjet printing or other known fabrication methods. Different multilayer OLEDs have been fabricated using the compounds of the present invention as light-emitting material or as dopant in the emitting layer. In general, the OLEDs are comprised on an anode and a cathode, between which are the hole transporting layer, light-emitting layer, and electron transporting or injection layer. The present invention makes use of an additional carrier confinement layer to improve the performance of the devices.

In one embodiment, the OLED is fabricated by vacuum deposition.

In another embodiment, the OLED is fabricated by solution process including spin coating and printing.

The term "alkyl" refers to a radical of a straight or branched, saturated hydrocarbon group having 1 to 20 carbon atoms. In some embodiments, $C_{1-10}$ alkyl is preferred. In some embodiments, $C_{1-6}$ alkyl is preferred. In some embodiments, $C_{1-4}$ alkyl is preferred. Examples of $C_{1-6}$ alkyl include methyl ($C_1$), ethyl ($C_2$), n-propyl ($C_3$), iso-propyl ($C_5$), n-butyl ($C_4$), tert-butyl ($C_4$), sec-butyl ($C_4$), iso-butyl ($C_4$), n-pentyl ($C_5$), 3-pentyl ($C_5$), pentyl ($C_5$), neopentyl ($C_5$), 3-methyl-2-butyl ($C_5$), tert-pentyl ($C_5$) and n-hexyl ($C_6$). Alkyl groups can be optionally substituted with one or more substituents, for example, with 1 to 5 substituents, 1 to 3 substituents or 1 substituent. Conventional abbreviations of alkyl include Me ($—CH_3$), Et ($—CH_2CH_3$), iPr ($—CH(CH_3)_2$), nPr ($—CH_2CH_2CH_3$), n-Bu ($—CH_2CH_2CH_2CH_3$) or i-Bu ($—CH_2CH(CH_3)_2$).

The term "halogen" refers to fluorine (F), chlorine (Cl), bromine (Br) and iodine (I).

The term "haloalkyl" represents the "$C_1$-20 alkyl" described above, which is substituted with one or more halogen groups. Examples include the mono-, di-, polyhalogenated, including perhalogenated, alkyl. A monohalogen substituent may have one iodine, bromine, chlorine or fluorine atom in the group; a dihalogen substituent and a polyhalogen substituent may have two or more identical halogen atoms or a combination of different halogens. Examples of preferred haloalkyl groups include monofluoromethyl, difluoromethyl, trifluoromethyl, chloromethyl, dichloromethyl, trichloromethyl, pentafluoroethyl, heptafluoropropyl, difluorochloromethyl, dichlorofluoromethyl, difluoroethyl, difluoropropyl, dichloroethyl and dichloropropyl. The haloalkyl groups can be substituted at any available point of attachment, for example, with 1 to 5 substituents, 1 to 3 substituents or 1 substituent.

The term "alkoxy" refers to a radical of —OR, wherein R has the same meaning as the term "alkyl" and "haloalkyl".

The term "amino" refers to a radical of —NRR', wherein R, and R' are independently selected from H, alkyl, and haloalkyl as defined above.

The term "acyl" refers to a radical of —C(O)R, wherein R is selected from alkyl, and haloalkyl as defined above.

The term "acyloxy" refers to a radical of —O—C(O)R, wherein R is selected from alkyl, and haloalkyl as defined above.

The term "acylamino" refers to a radical of —NR'—C (O)R, wherein R is selected from alkyl, and haloalkyl as defined above, and R' is selected from H, alkyl, and haloalkyl as defined above.

The term "carboxyl" refers to a radical of —C(O) OH.

The term "thiol" refers to a radical of —SR, wherein R is selected from alkyl, and haloalkyl as defined above.

The term "carbonyl", whether used alone or in conjunction with other terms (e.g., aminocarbonyl), is represented by —C(O)—.

The term "aminocarbonyl" refers to a radical of —C(O)—NRR', wherein R, and R' are independently selected from H, alkyl, and haloalkyl as defined above.

The term "carbamoyl" refers to a radical of —C(O)—$NH_2$.

The term "alkoxycarbonyl" refers to a radical of —C(O)—OR, wherein R has the same meaning as the term "alkyl" and "haloalkyl".

The term "aryl" refers to a radical of monocyclic or polycyclic (e.g., bicyclic) 4n+2 aromatic ring system having 6-14 ring carbon atoms and zero heteroatoms (e.g., having 6, 10 or 14 shared IT electrons in a cyclic array). In some embodiments, the aryl group has six ring carbon atoms ("$C_6$ aryl"; for example, phenyl). In some embodiments, the aryl group has ten ring carbon atoms ("$C_{10}$ aryl"; for example, naphthyl, e.g., 1-naphthyl and 2-naphthyl). The aryl group also includes a ring system in which the aryl ring described above is fused with one or more cycloalkyl or heterocyclyl groups, and the point of attachment is on the aryl ring, in which case the number of carbon atoms continues to represent the number of carbon atoms in the aryl ring system. The aryl can be substituted with one or more substituents, for example, with 1 to 5 substituents, 1 to 3 substituents or 1 substituent.

The term “heteroaryl” refers to a radical of 5- to 14-membered monocyclic or bicyclic 4n+2 aromatic ring system (e.g., having 6, 10, or 14 shared IT electrons in a cyclic array) having ring carbon atoms and 1-4 ring heteroatoms, wherein each heteroatom is independently selected from nitrogen, oxygen and sulfur. In the heteroaryl group containing one or more nitrogen atoms, the point of attachment can be a carbon or nitrogen atom as long as the valence permits. Heteroaryl bicyclic systems may include one or more heteroatoms in one or two rings. Heteroaryl also includes ring systems wherein the heteroaryl ring described above is fused with one or more cycloalkyl or heterocyclyl groups, and the point of attachment is on the heteroaryl ring. In such case, the number the carbon atoms continues to represent the number of carbon atoms in the heteroaryl ring system. In some embodiments, 5- to 6-membered heteroaryl groups are particularly preferred, which are radicals of 5- to 6-membered monocyclic or bicyclic 4n+2 aromatic ring systems having ring carbon atoms and 1-4 ring heteroatoms. Exemplary 5-membered heteroaryl groups containing one heteroatom include, but are not limited to, pyrrolyl, furyl and thienyl. Exemplary 5-membered heteroaryl groups containing two heteroatoms include, but are not limited to, imidazolyl, pyrazolyl, oxazolyl, isoxazolyl, thiazolyl, and isothiazolyl. Exemplary 5-membered heteroaryl groups containing three heteroatoms include, but are not limited to, triazolyl, oxadiazolyl (such as, 1,2,4-oxadiazoly), and thiadiazolyl. Exemplary 5-membered heteroaryl groups containing four heteroatoms include, but are not limited to, tetrazolyl. Exemplary 6-membered heteroaryl groups containing one heteroatom include, but are not limited to, pyridyl. Exemplary 6-membered heteroaryl groups containing two heteroatoms include, but are not limited to, pyridazinyl, pyrimidinyl, and pyrazinyl. Exemplary 6-membered heteroaryl groups containing three or four heteroatoms include, but are not limited to, triazinyl and tetrazinyl, respectively. Exemplary 7-membered heteroaryl groups containing one heteroatom include, but are not limited to, azepinyl, oxepinyl, and thiepinyl. Exemplary 5,6-bicyclic heteroaryl groups include, but are not limited to, indolyl, isoindolyl, indazolyl, benzotriazolyl, benzothiophenyl, isobenzothiophenyl, benzofuranyl, benzoisofuranyl, benzimidazolyl, benzoxazolyl, benzoisoxazolyl, benzoxadiazolyl, benzothiazolyl, benzoisothiazolyl, benzothiadiazolyl, indolizinyl and purinyl. Exemplary 6,6-bicyclic heteroaryl groups include, but are not limited to, naphthyridinyl, pteridinyl, quinolyl, isoquinolyl, cinnolinyl, quinoxalinyl, phthalazinyl and quinazolinyl. The heteroaryl can be substituted with one or more substituents, for example, with 1 to 5 substituents, 1 to 3 substituents or 1 substituent.

The term “aralkyl” refers to a radical of —R—R', wherein R has the same meaning as the term “alkyl” and “haloalkyl” as defined above, and R' has the same meaning as the term “aryl” and “heteroaryl” as defined above.

The term “aryloxycarbonyl” refers to a radical of —C(O)—OR, wherein R has the same meaning as the term “aryl” and “heteroaryl” as defined above.

Examples of the structures of the iridium (III) emitters described herein include one or more of the following:

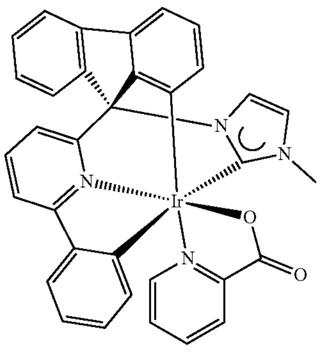

Ir(L1)(pic)

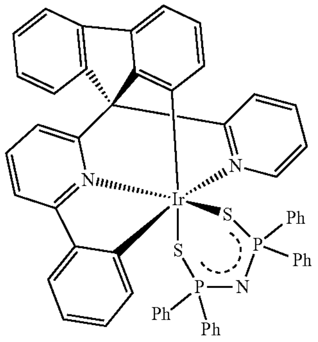

Ir(L1)(SPN)

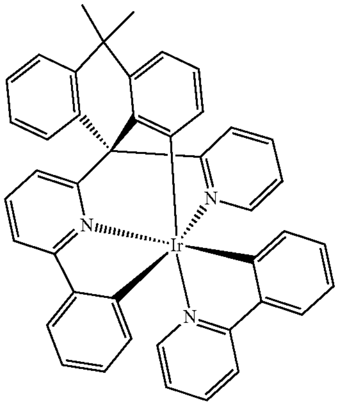

Ir(L3)(ppy)

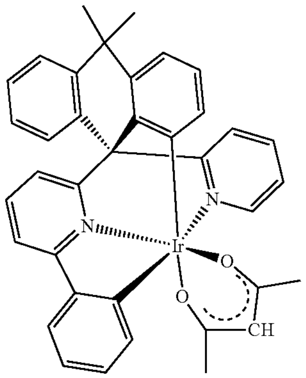

Ir(L3)(acac)

-continued
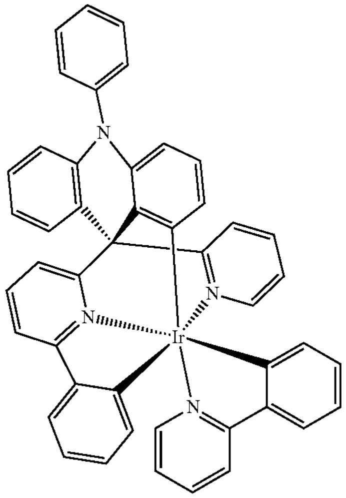
Ir(L2)(ppy)
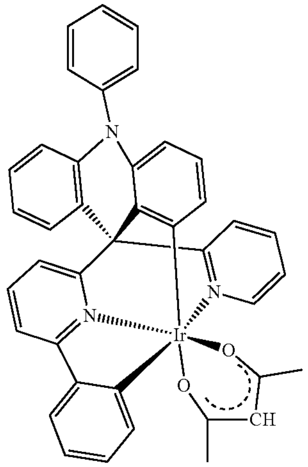
Ir(L2)(acac)
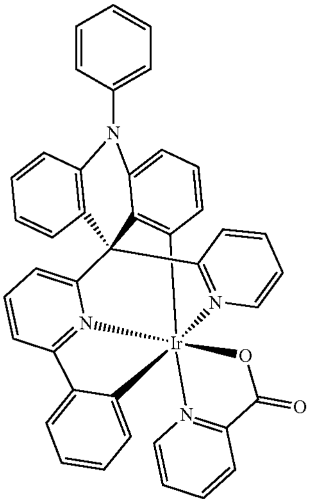
Ir(L2)(pic)
-continued
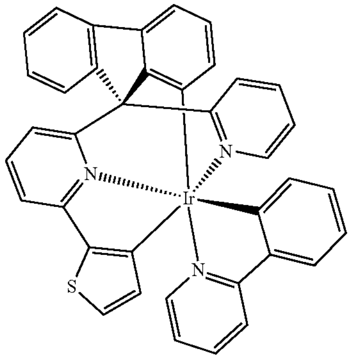
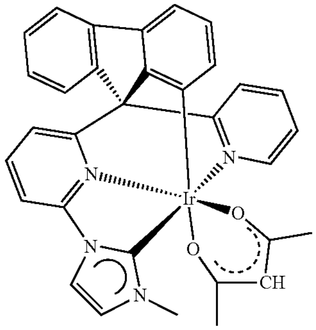
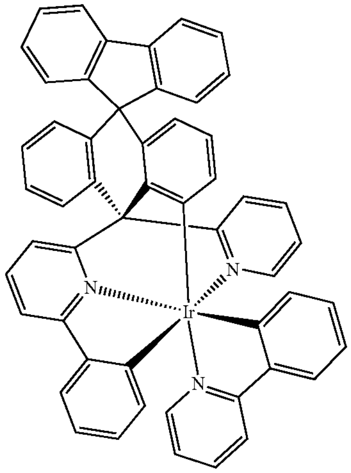
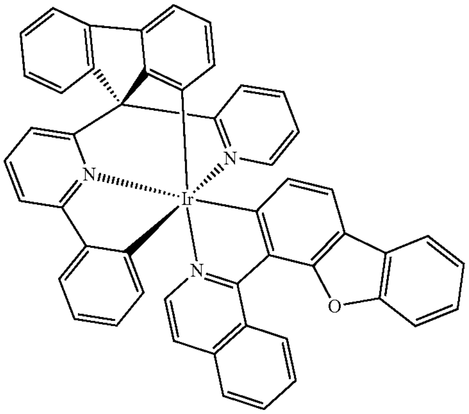

-continued
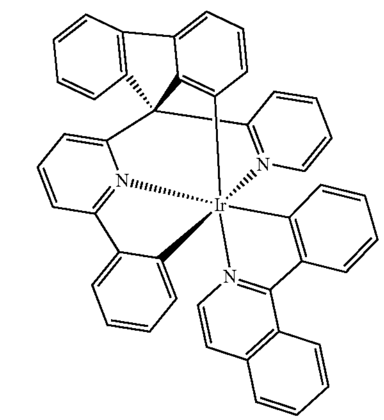
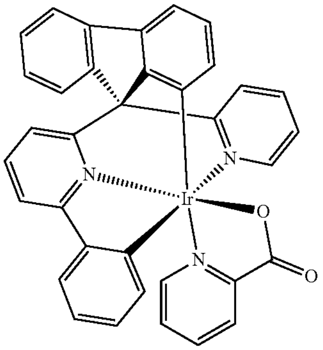
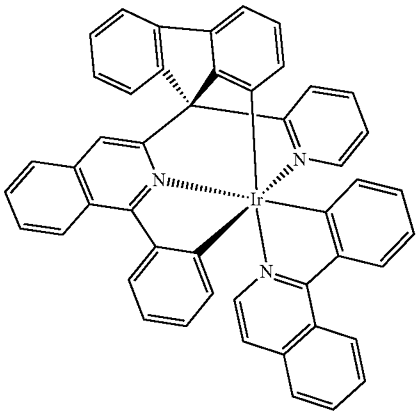
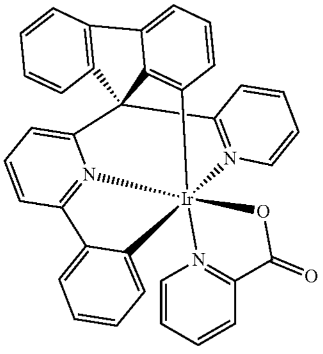
-continued
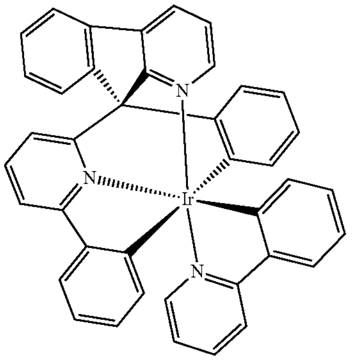
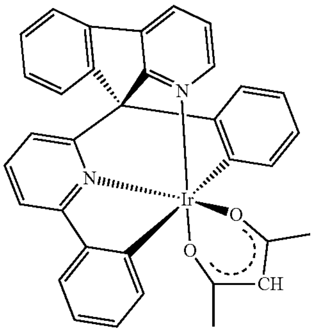
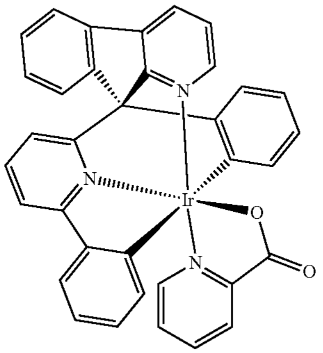
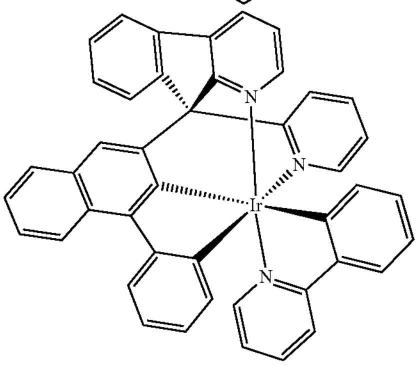
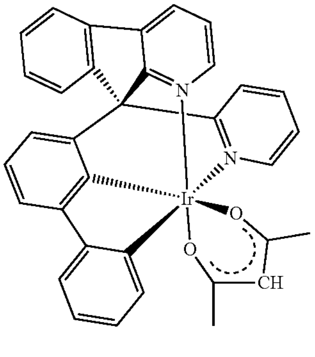

-continued
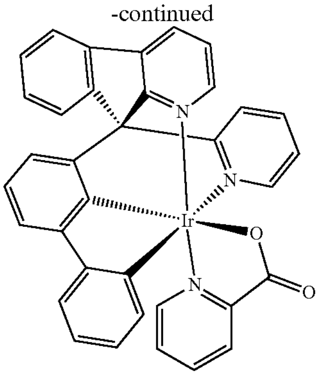
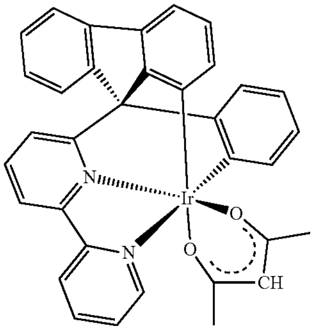
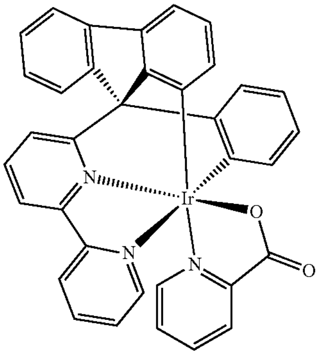
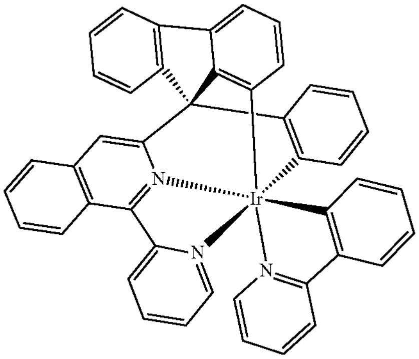
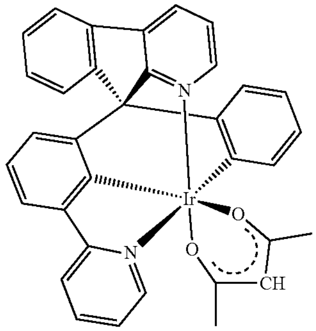
-continued
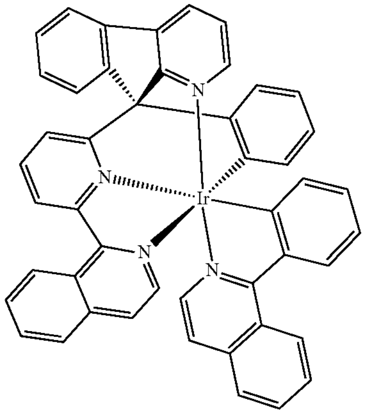
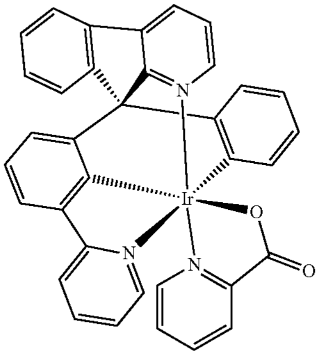
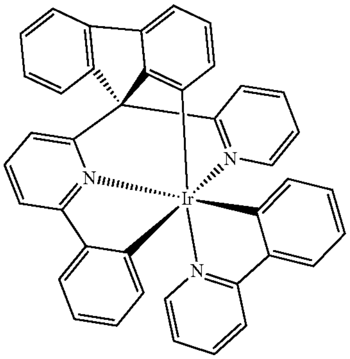
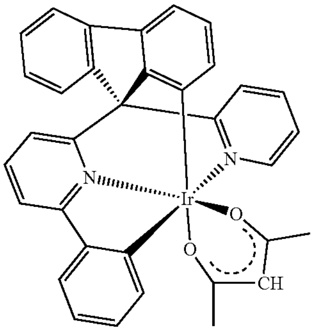

-continued
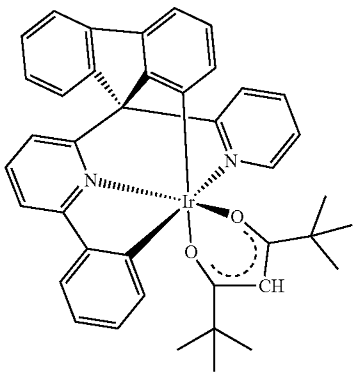
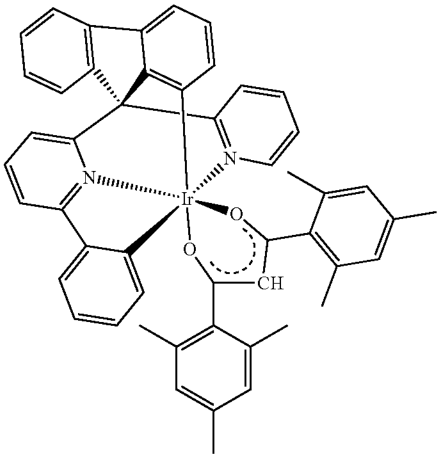
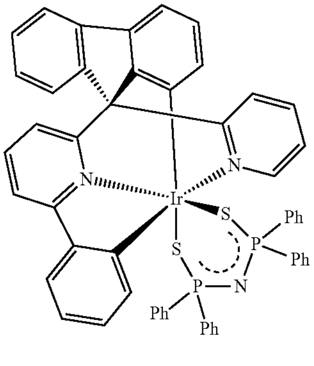
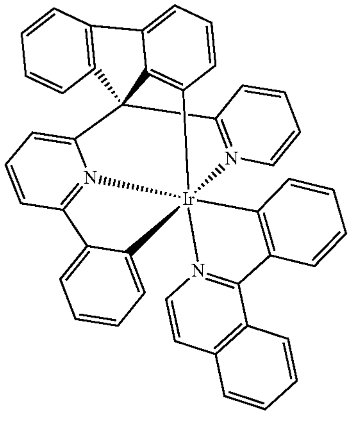
-continued
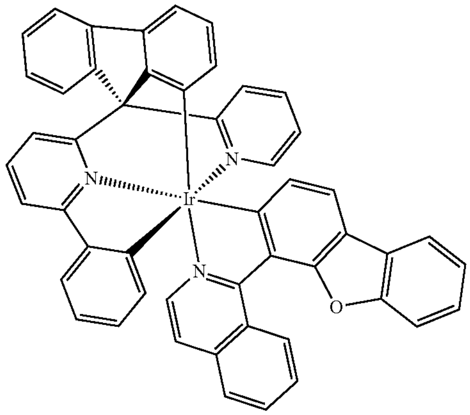
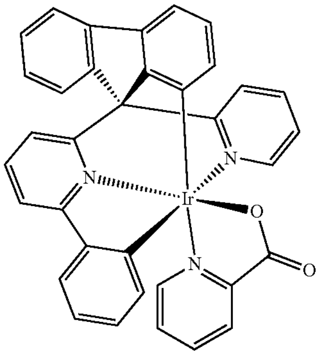
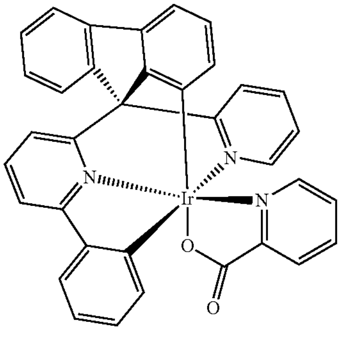
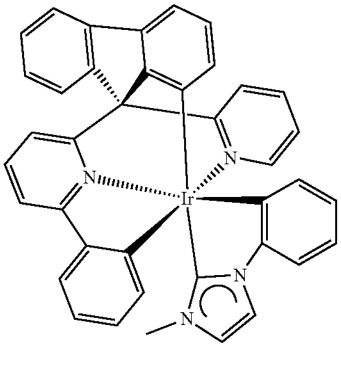

-continued
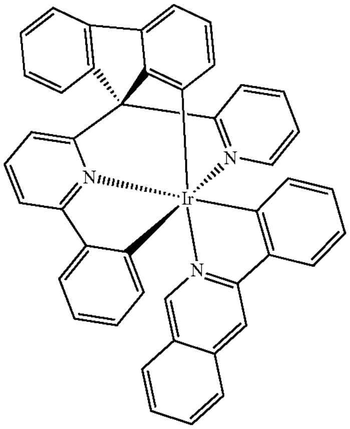
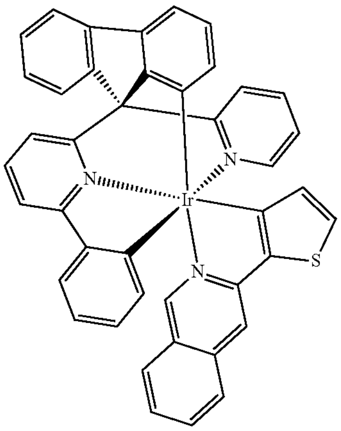
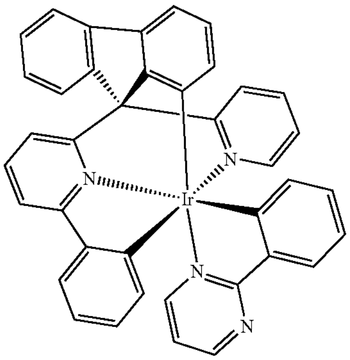
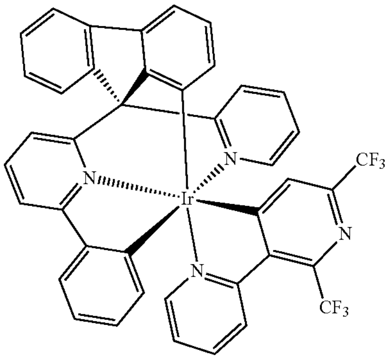
-continued
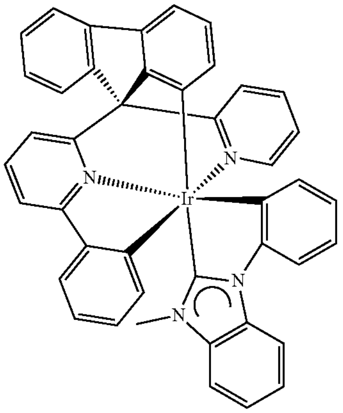
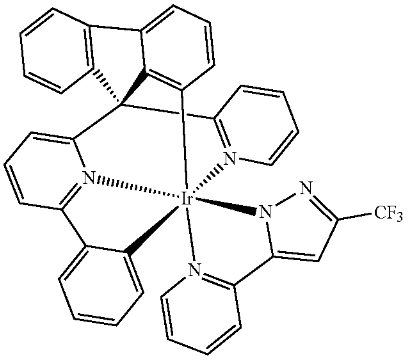
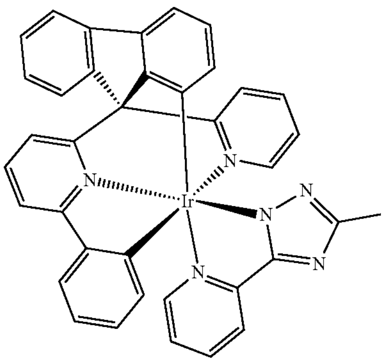
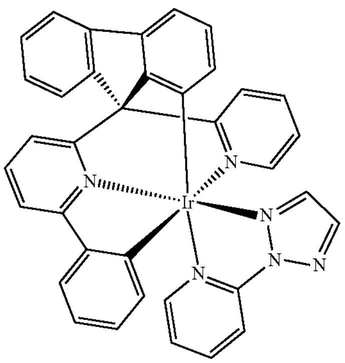

-continued
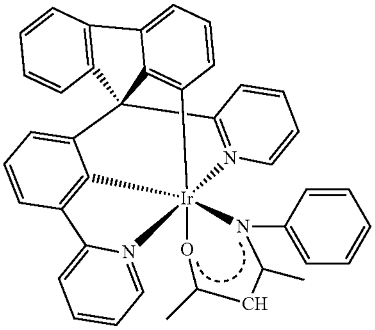
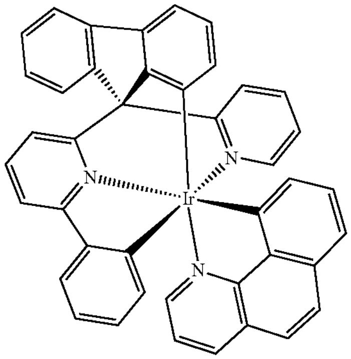
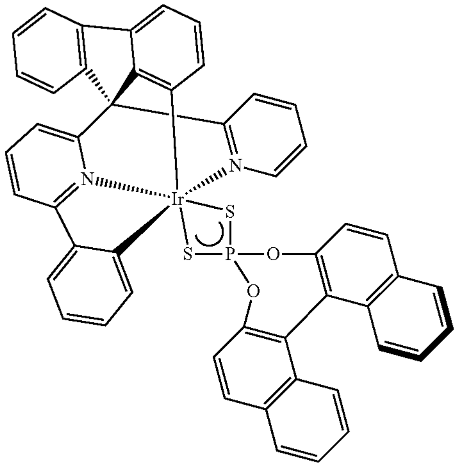
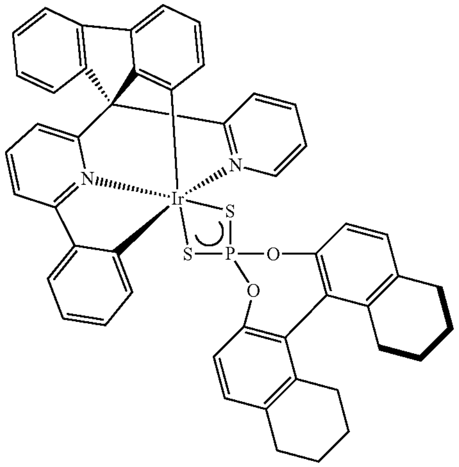
-continued
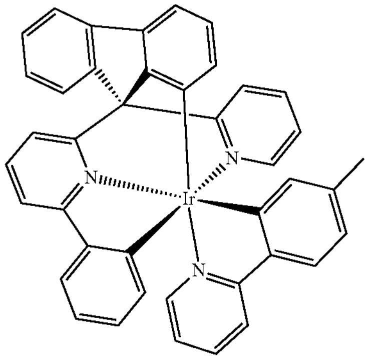
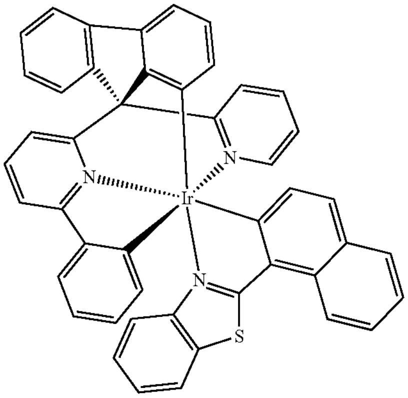
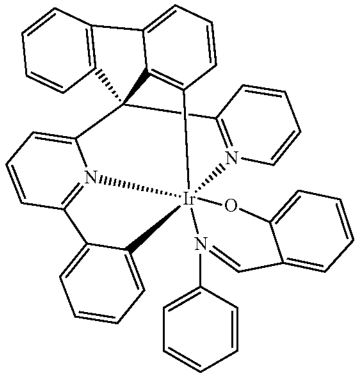
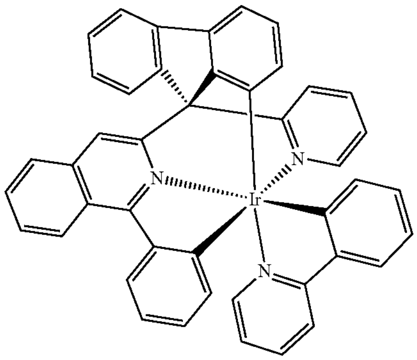

-continued
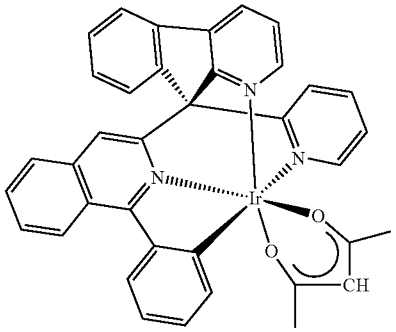
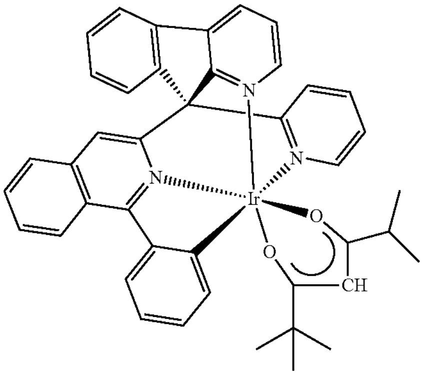
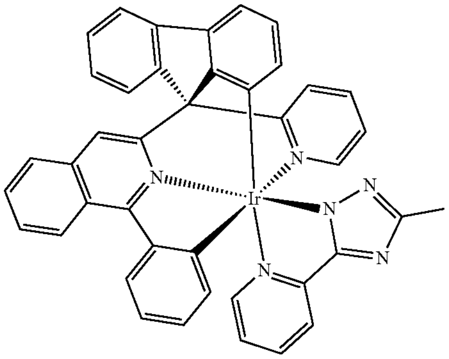
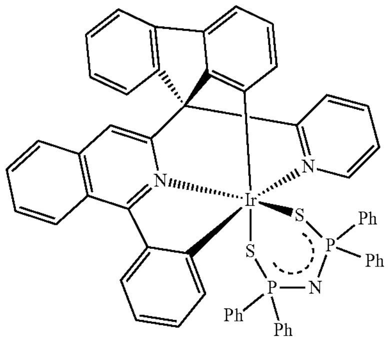
-continued
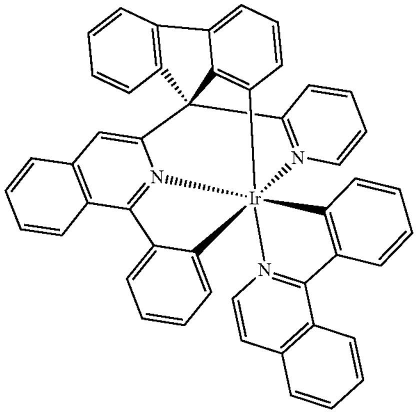
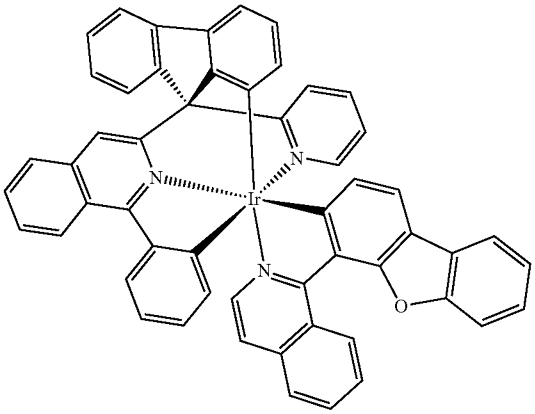
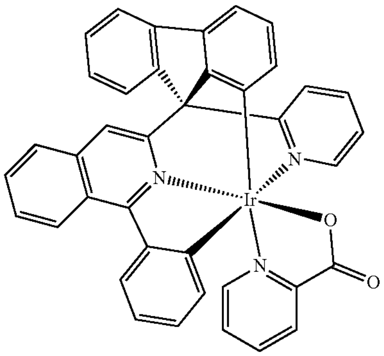
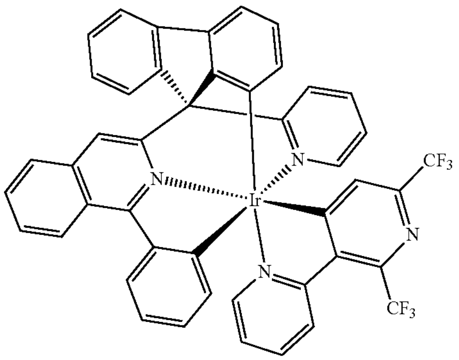

-continued
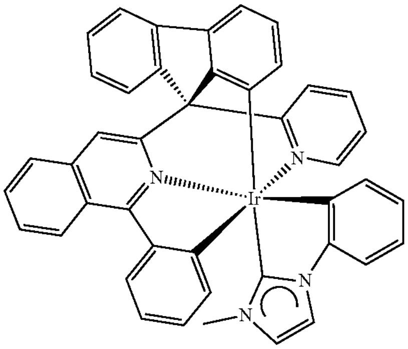
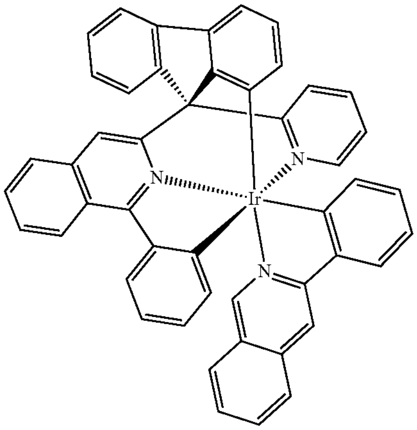
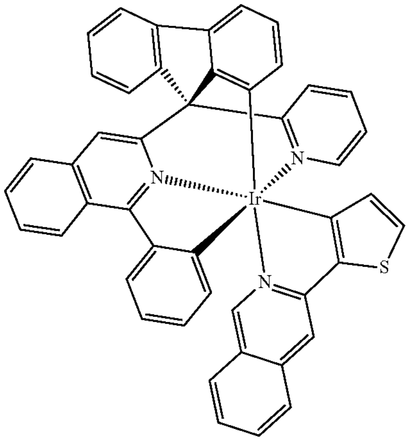
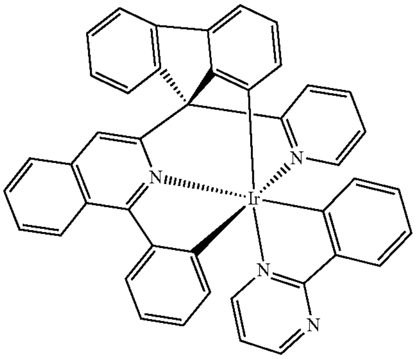
-continued
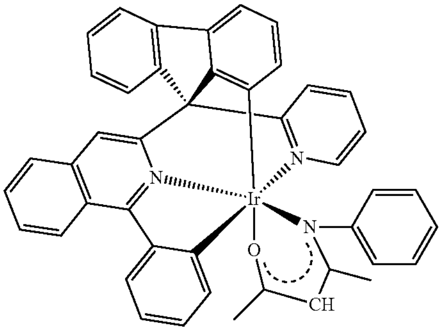
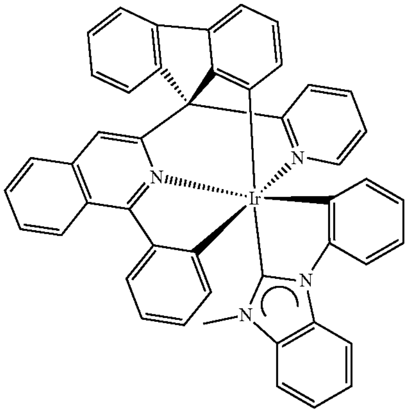
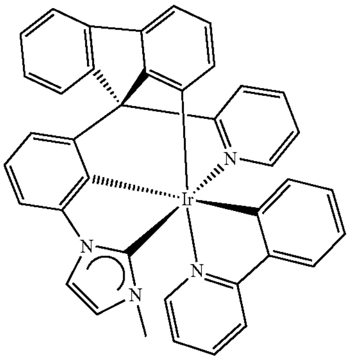
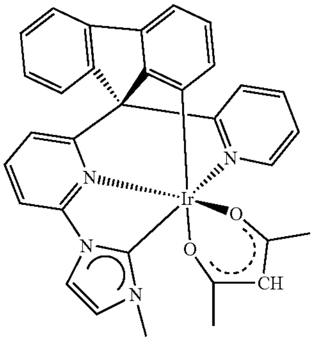

-continued
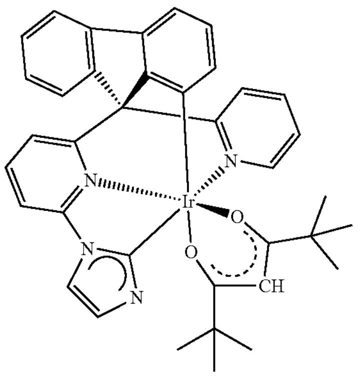
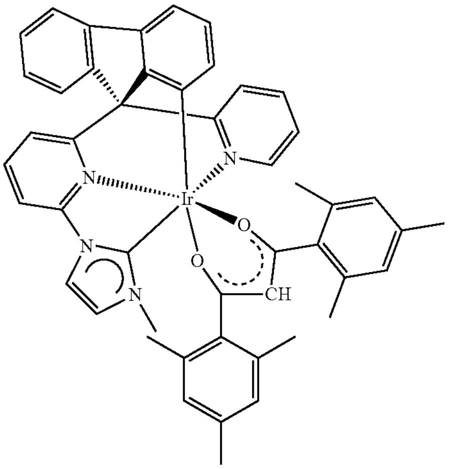
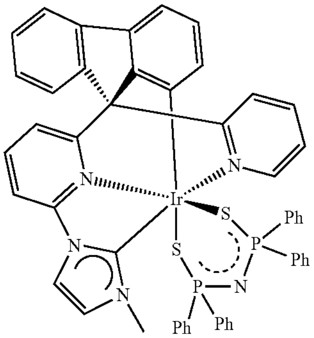
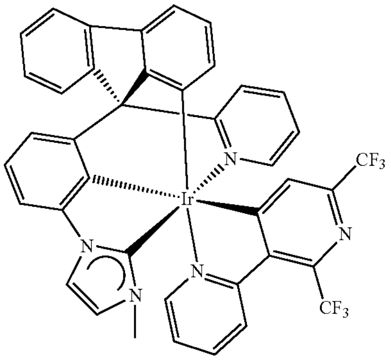
-continued
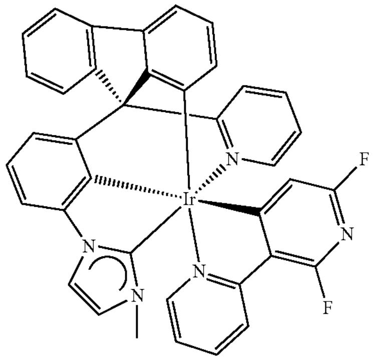
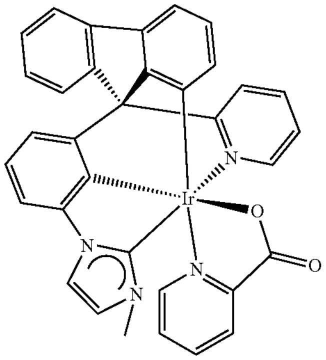
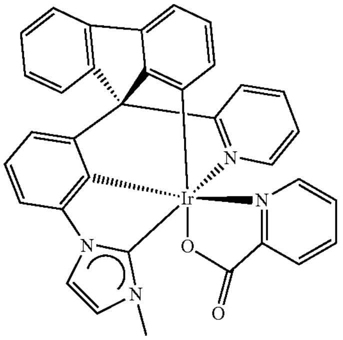
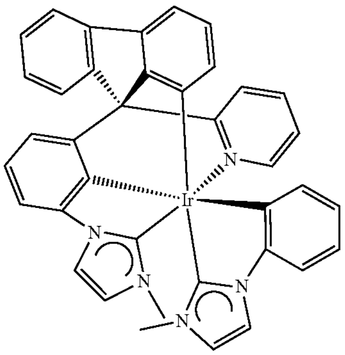

-continued
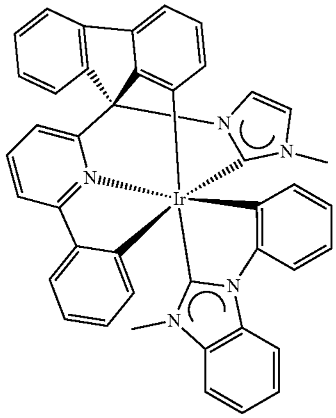
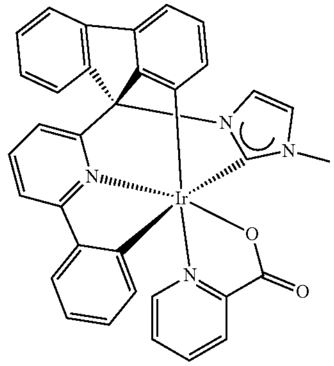
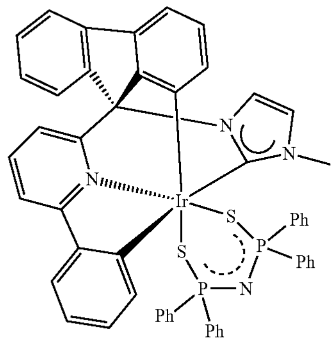
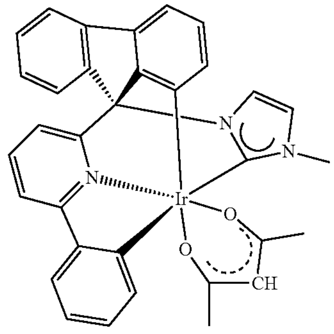
-continued
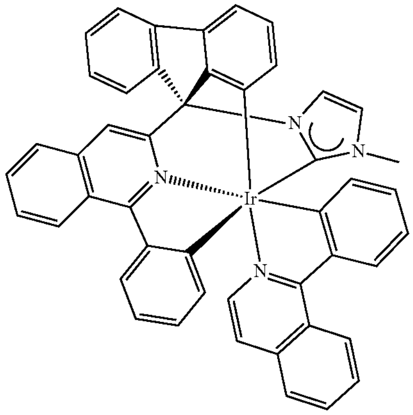
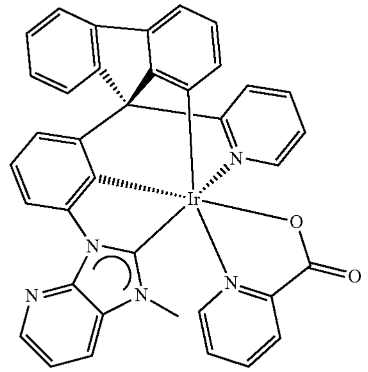
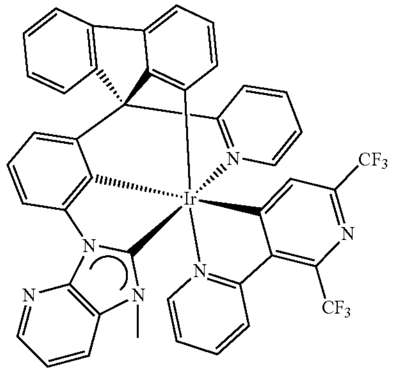
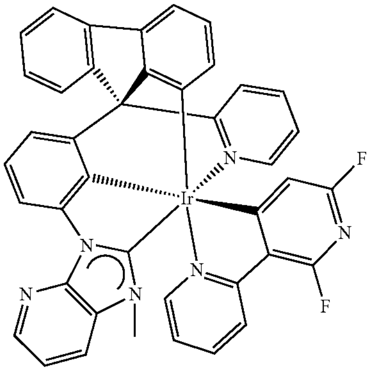

-continued
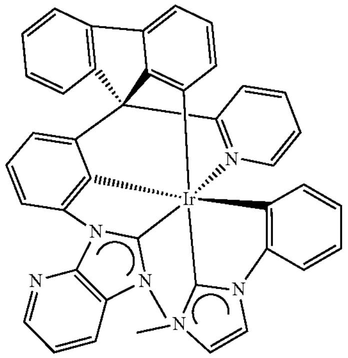
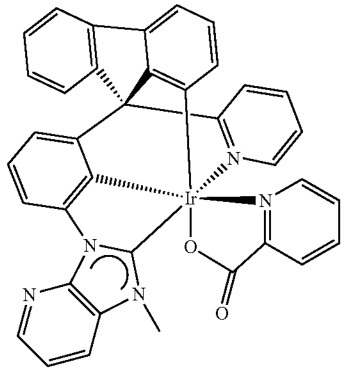
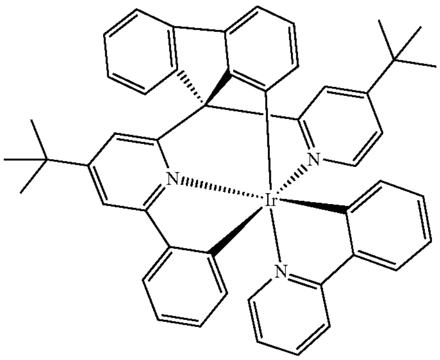
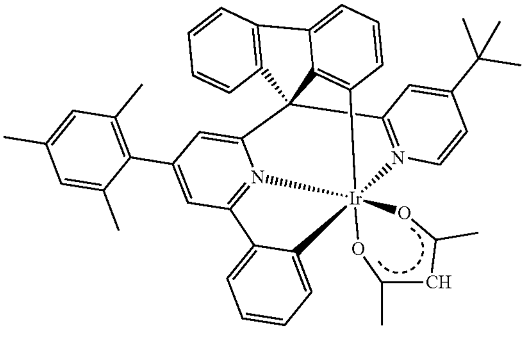
-continued
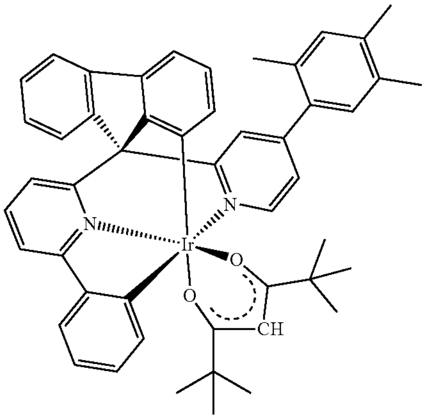
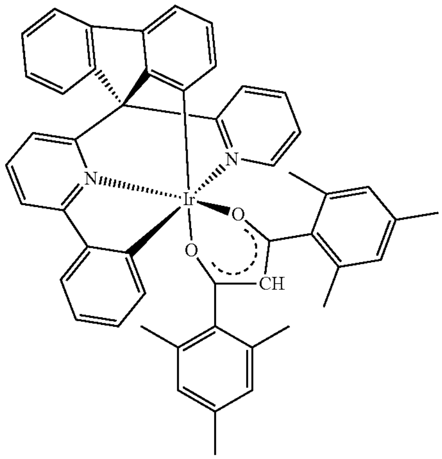
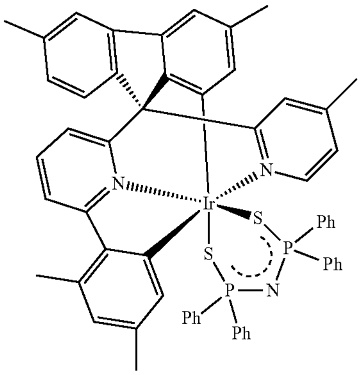
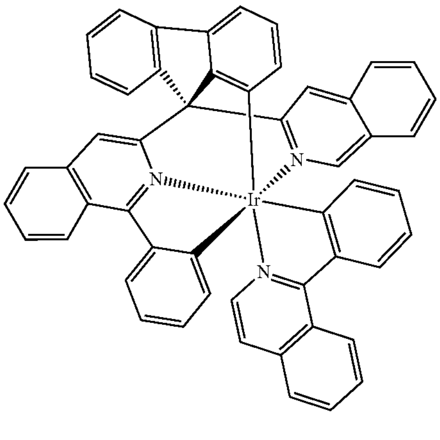

-continued
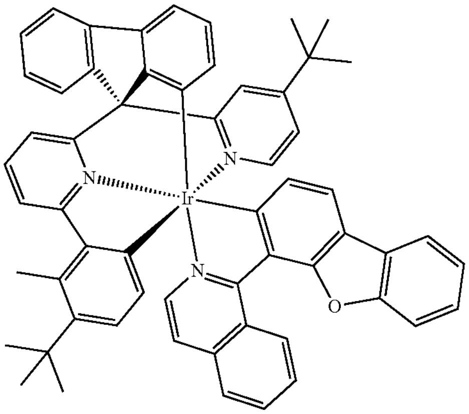
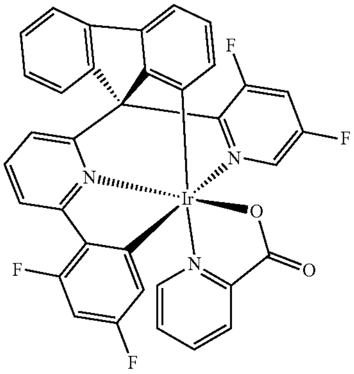
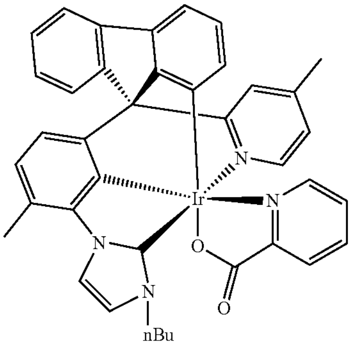
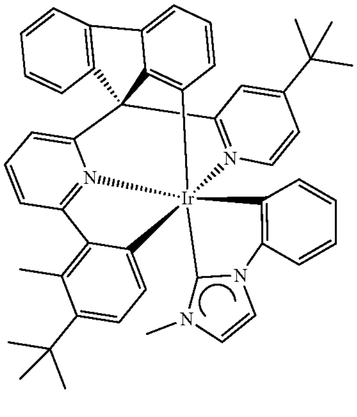
-continued
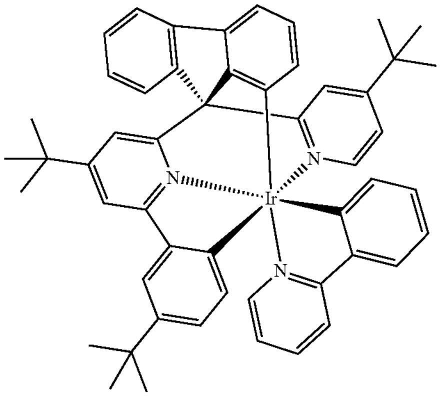
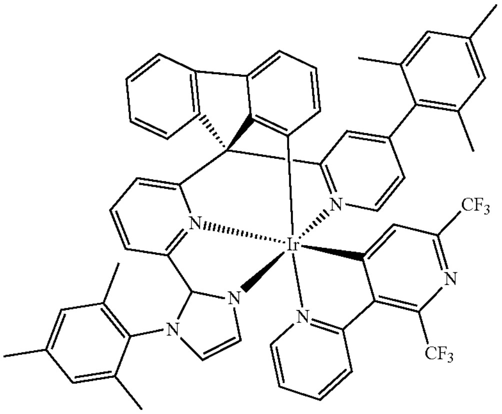
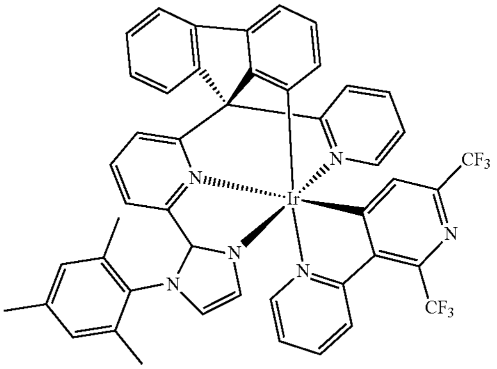
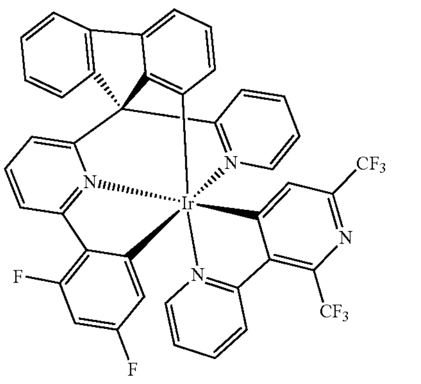

-continued
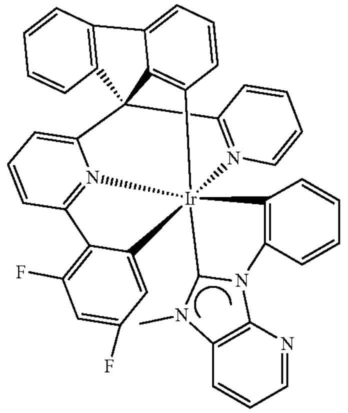
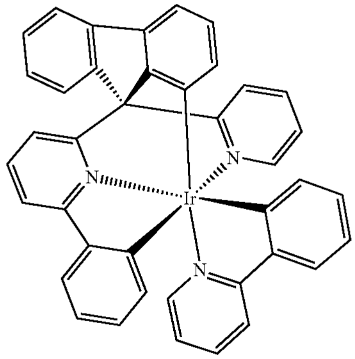
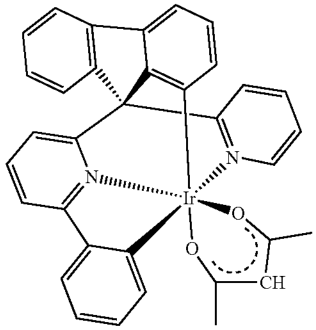
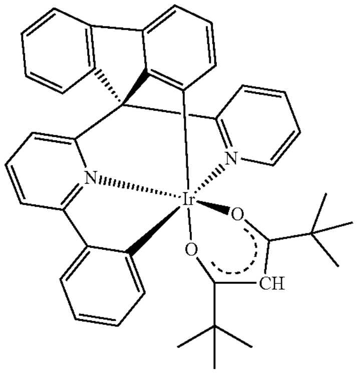
-continued
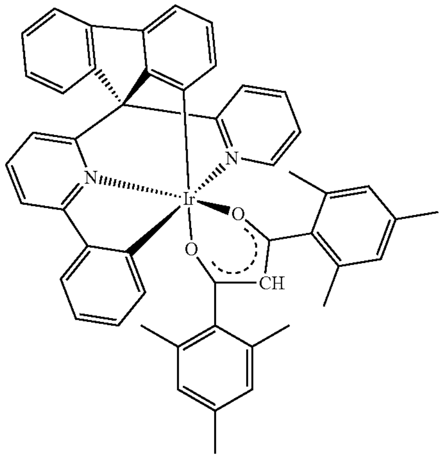
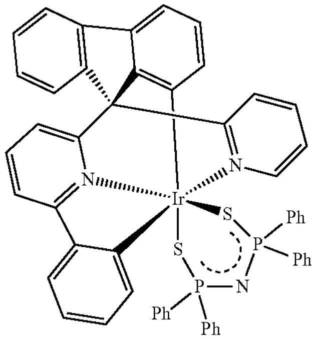
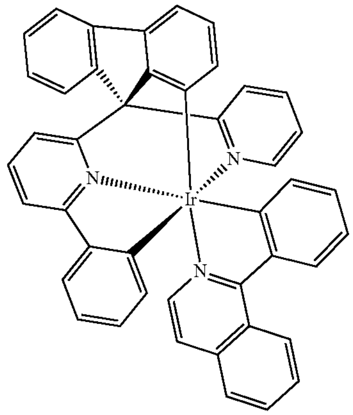
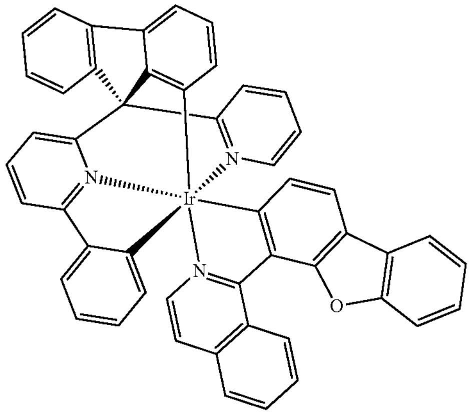

-continued
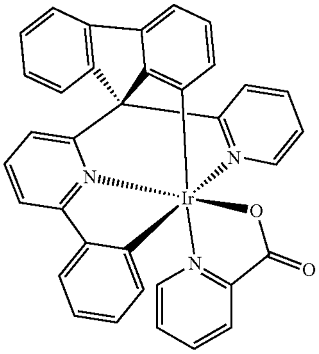
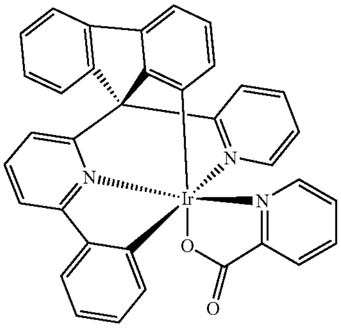
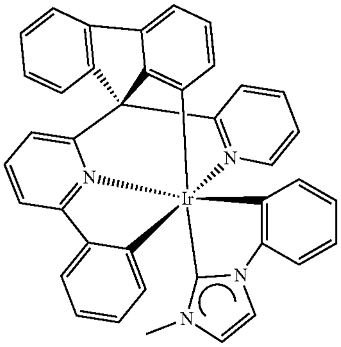
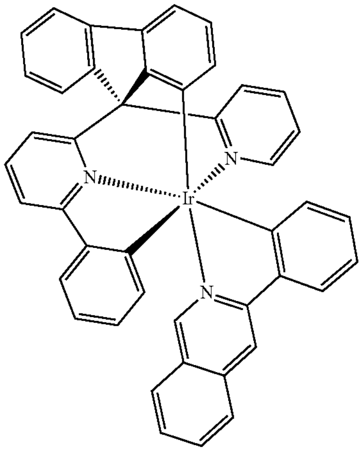
-continued
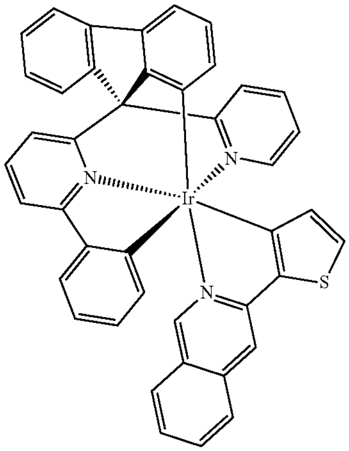
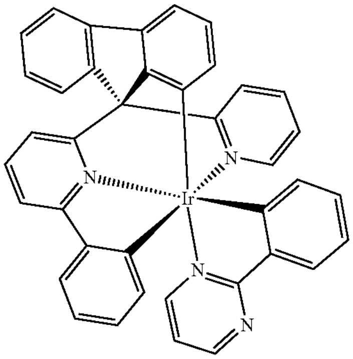
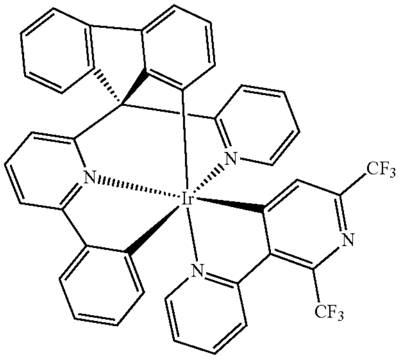
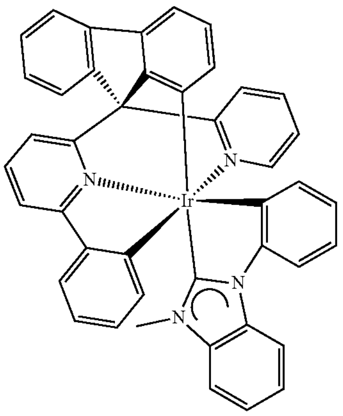

-continued
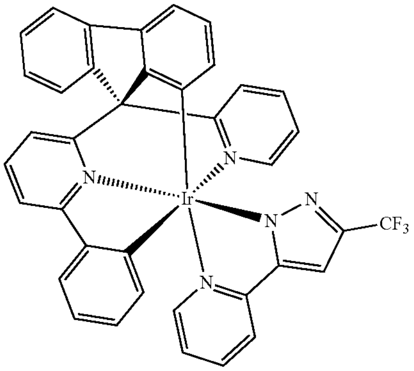
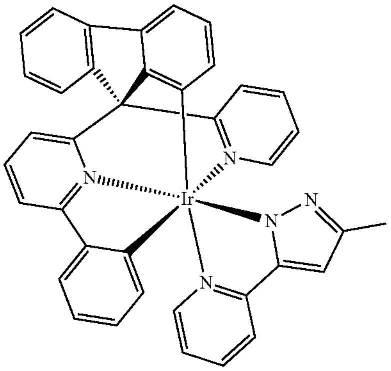
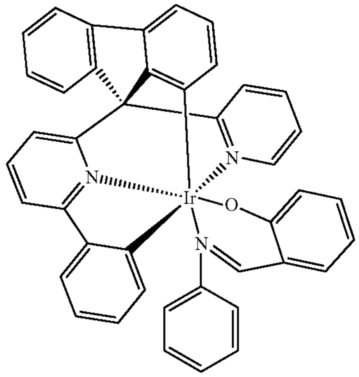
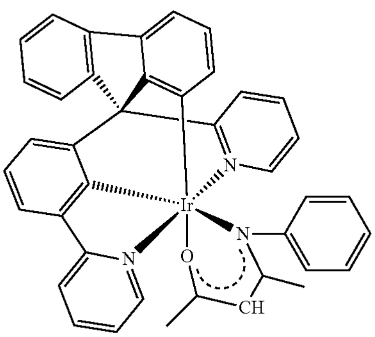
-continued
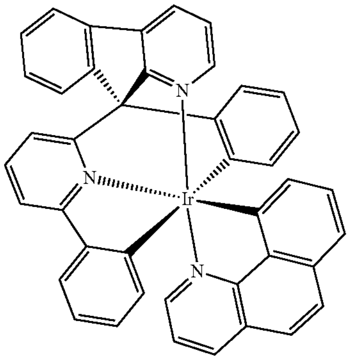
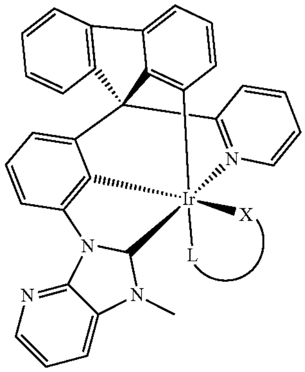
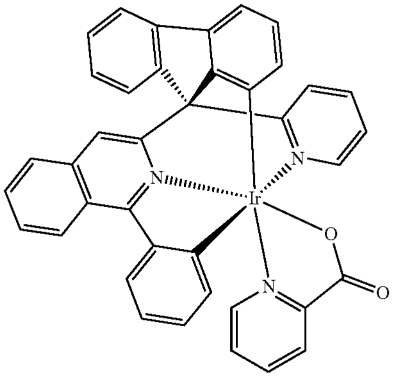
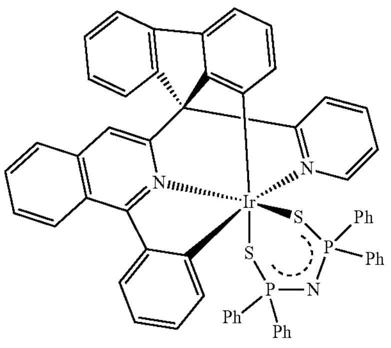

-continued
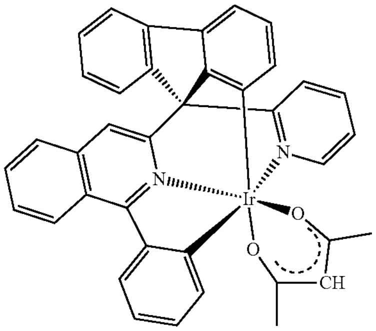
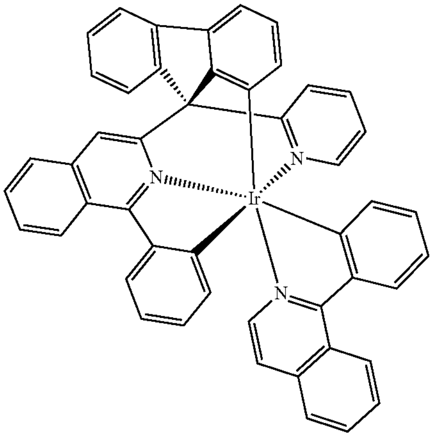
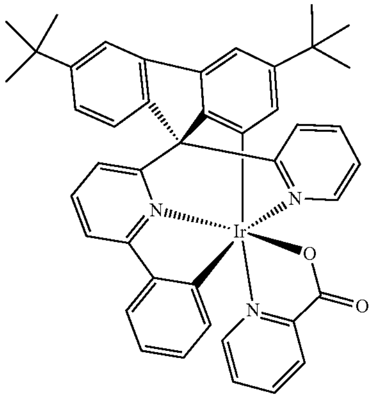
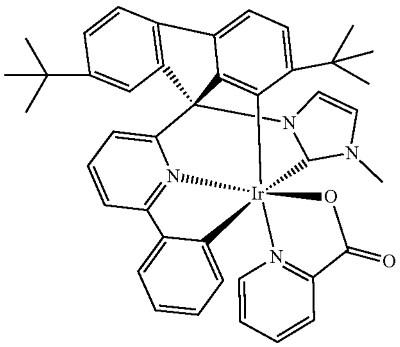
-continued
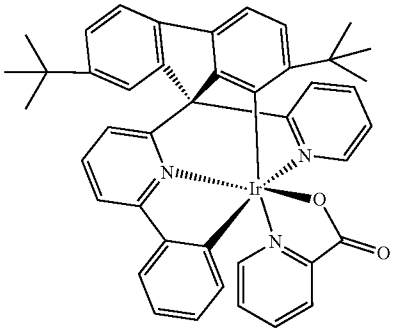
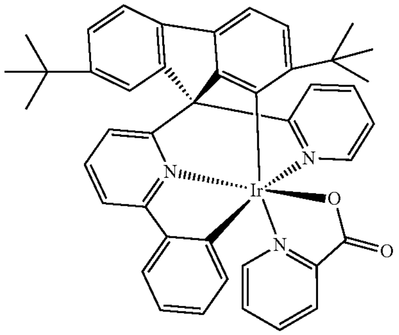
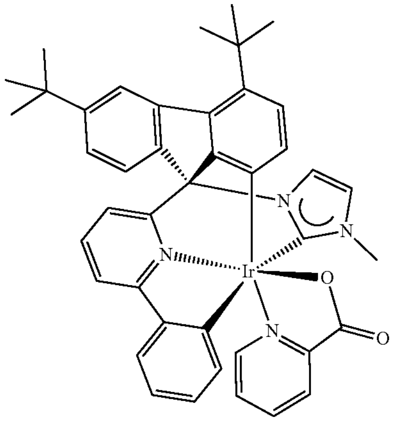
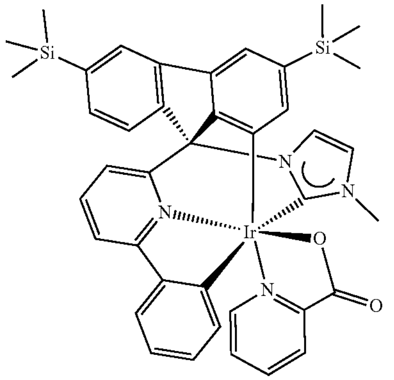

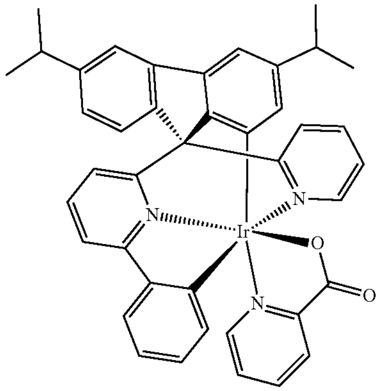
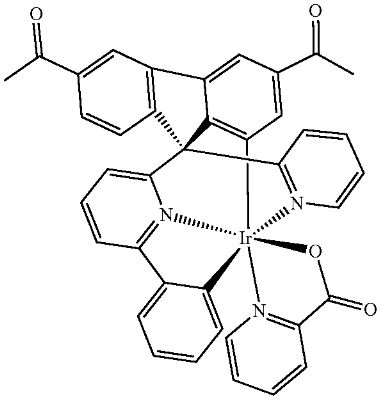
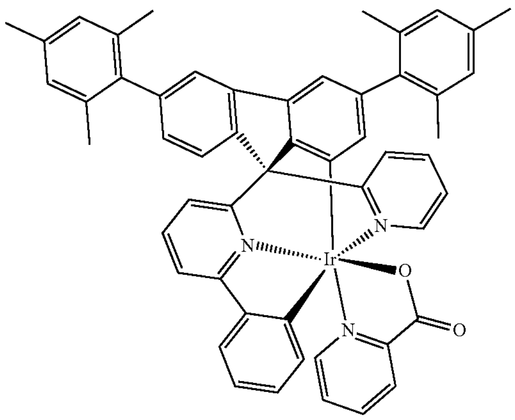
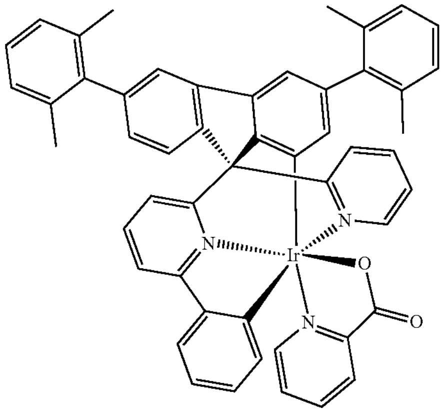
-continued
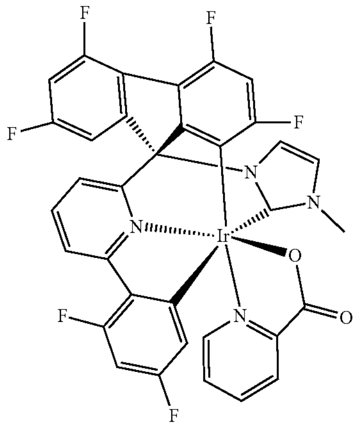
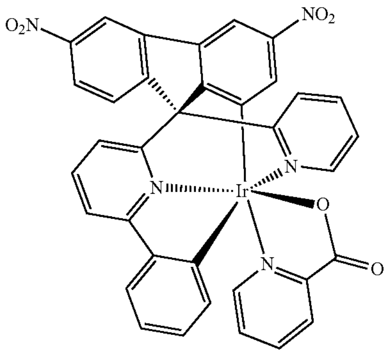
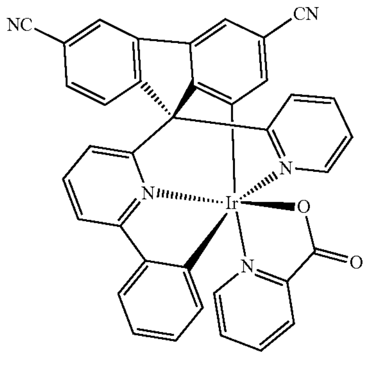
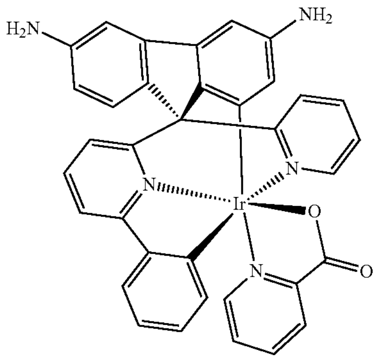

-continued
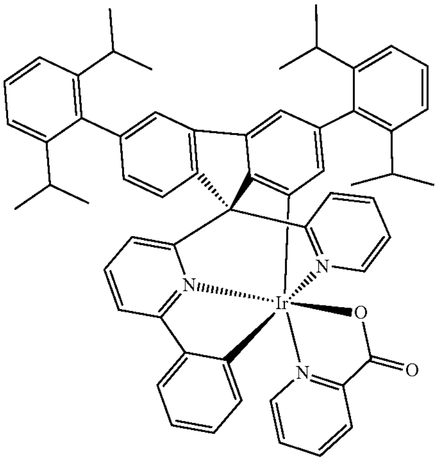
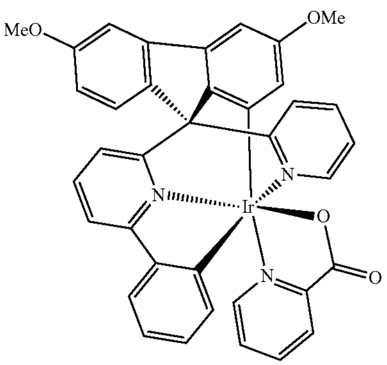
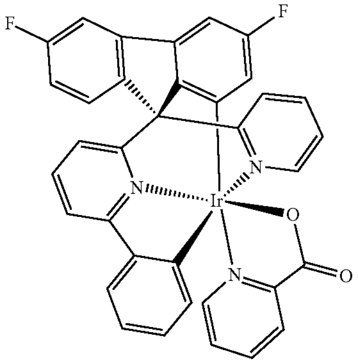
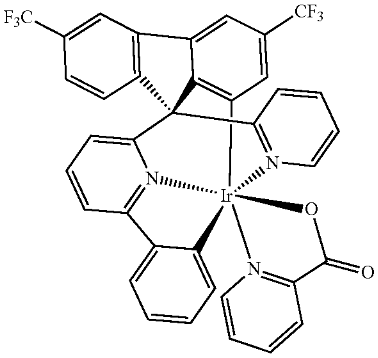
-continued
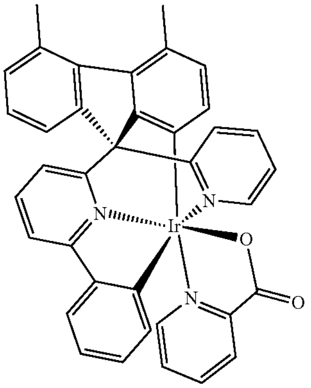
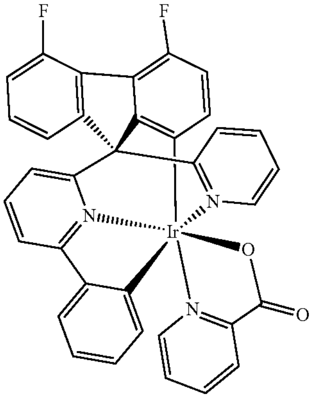
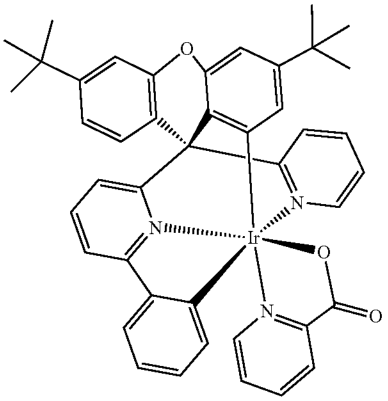
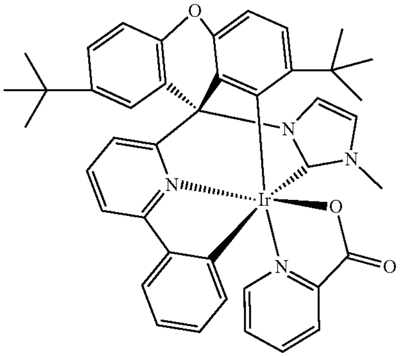

-continued
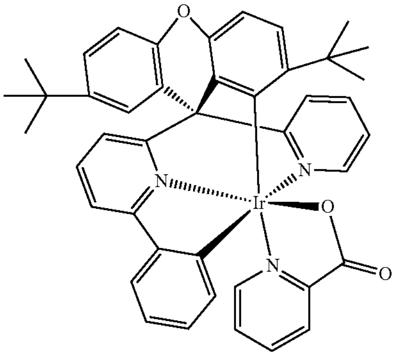
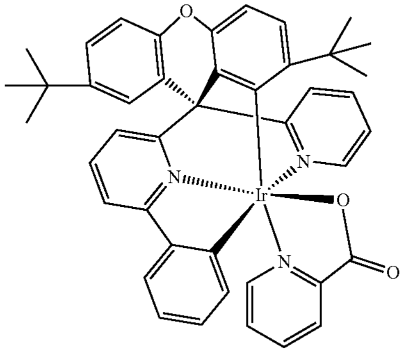
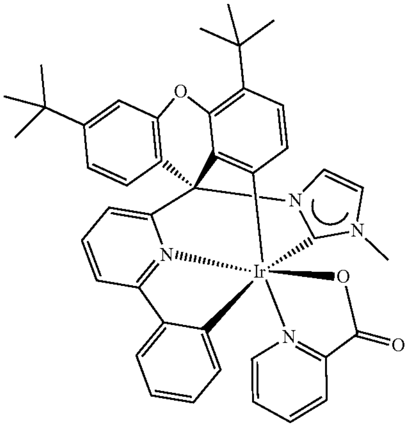
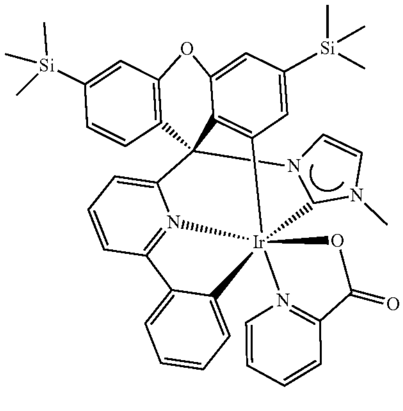
-continued
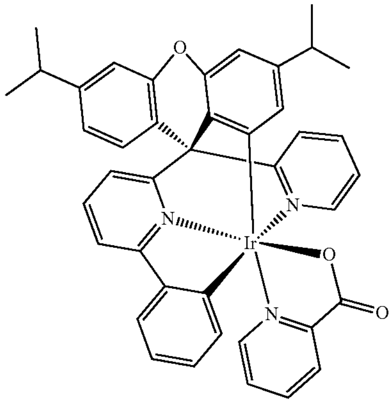
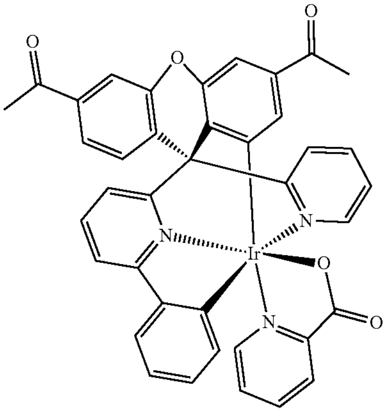
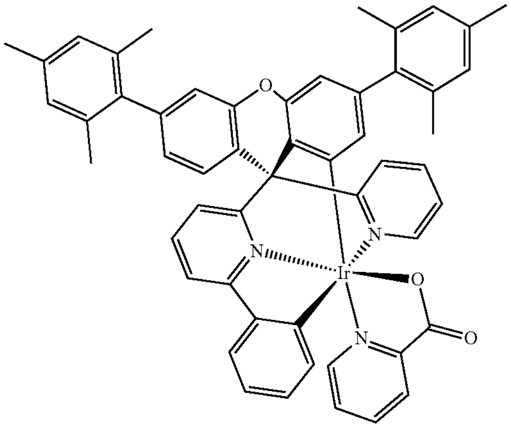
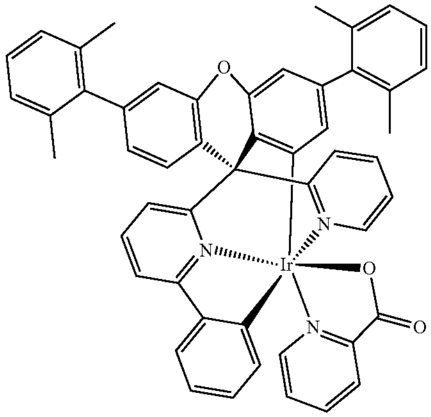

-continued
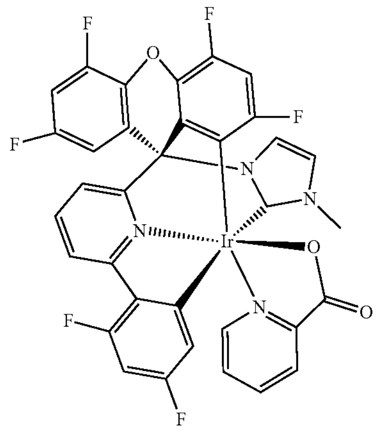
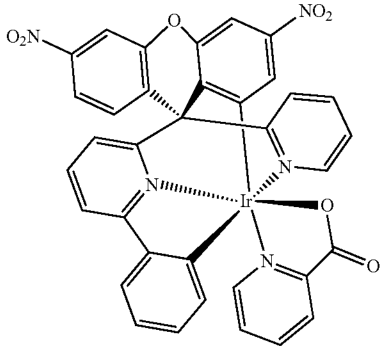
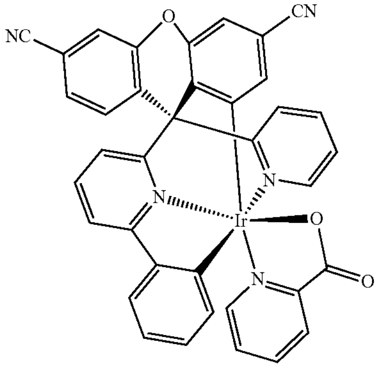
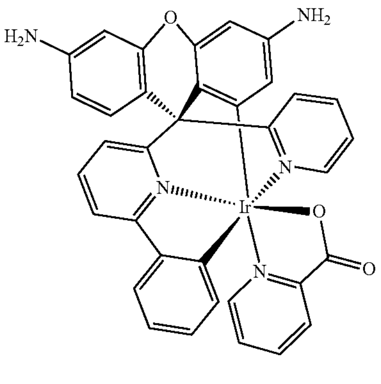
-continued
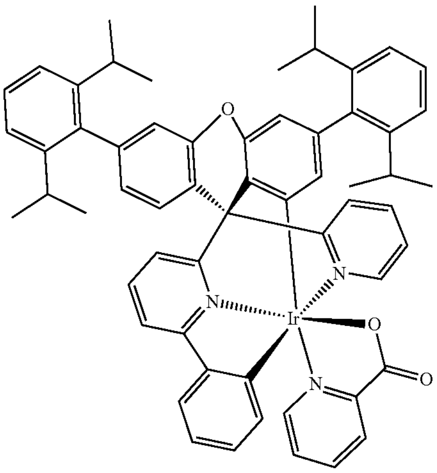
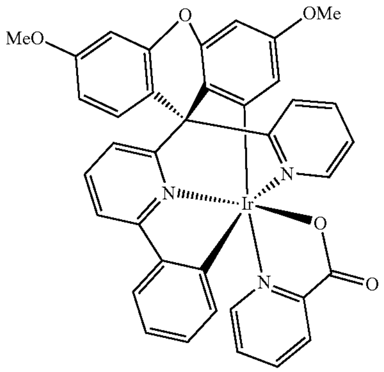
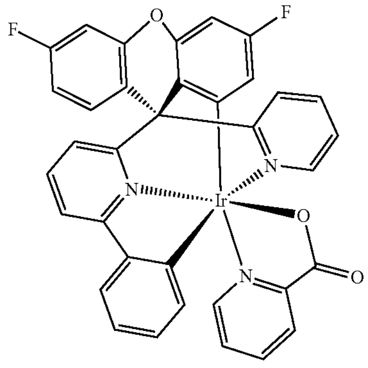
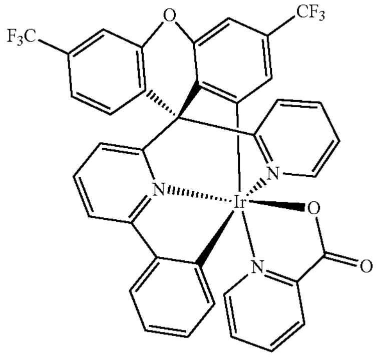

-continued
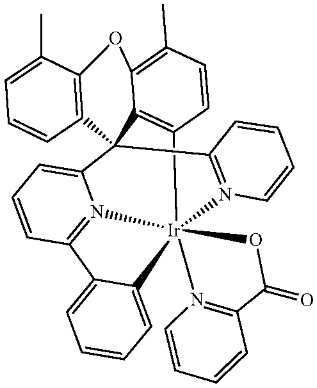
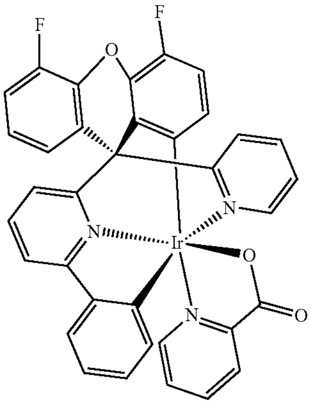
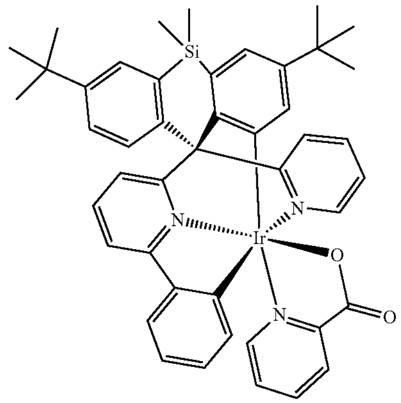
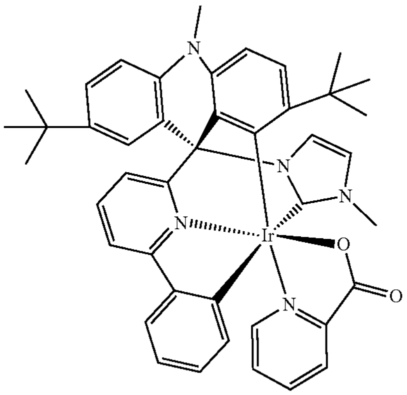
-continued
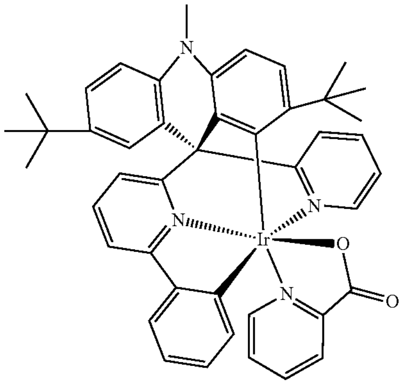
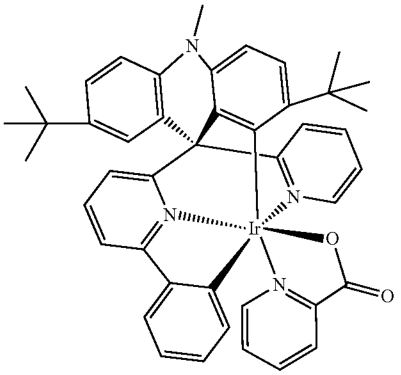
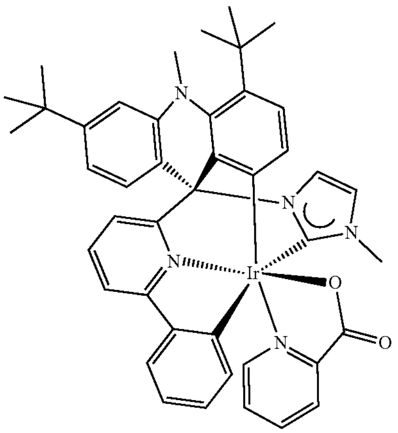
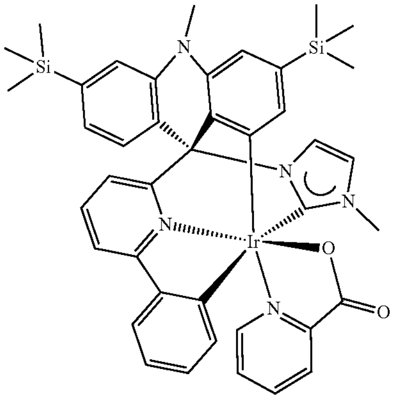

-continued
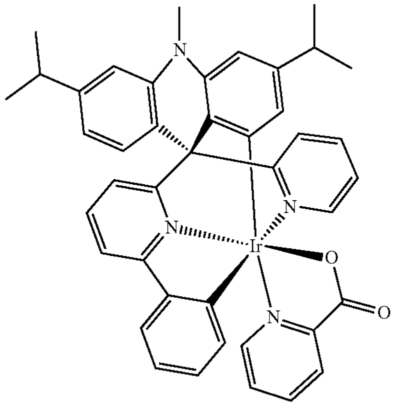
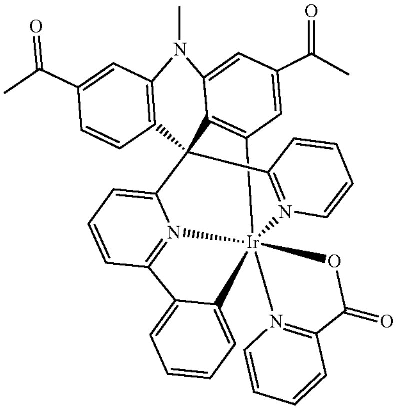
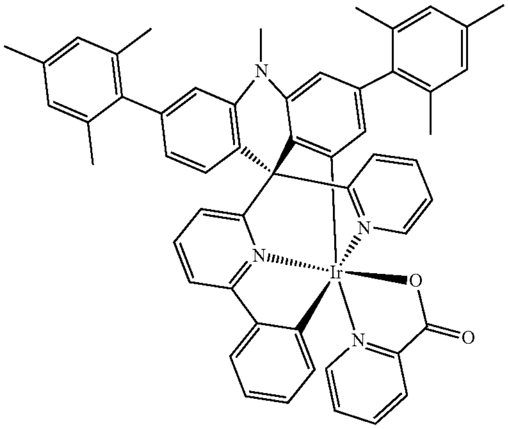
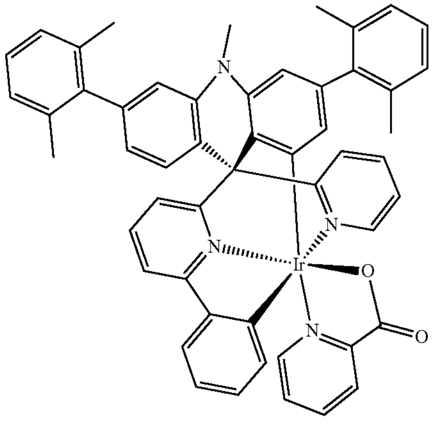
-continued
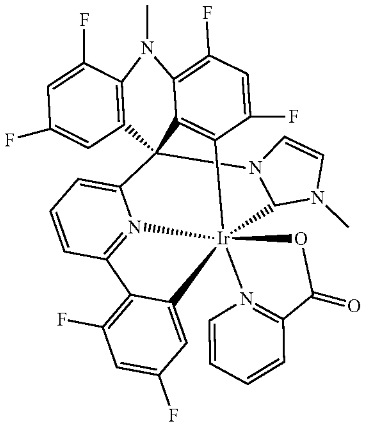
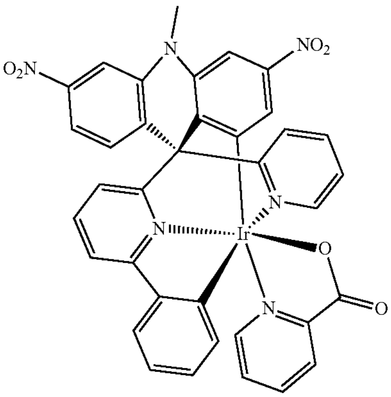
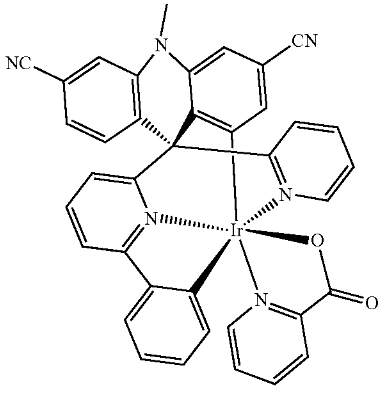
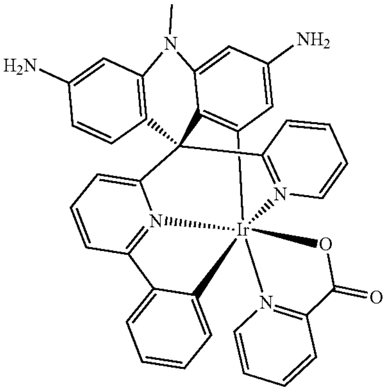

-continued
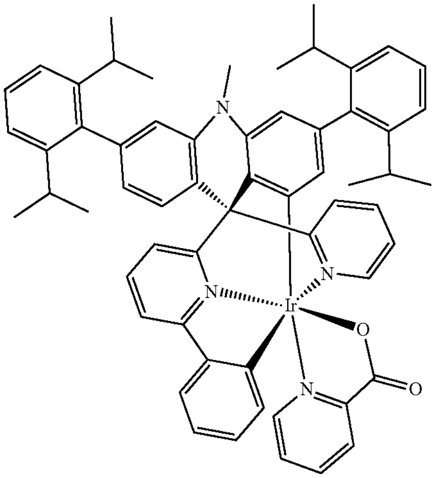
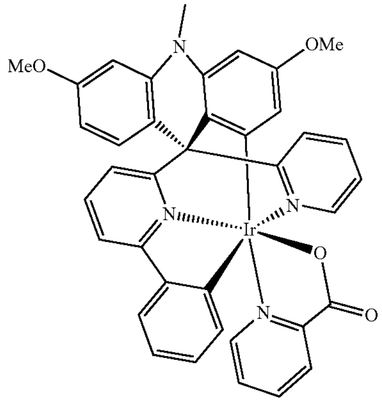
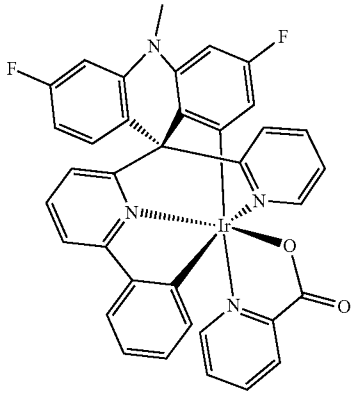
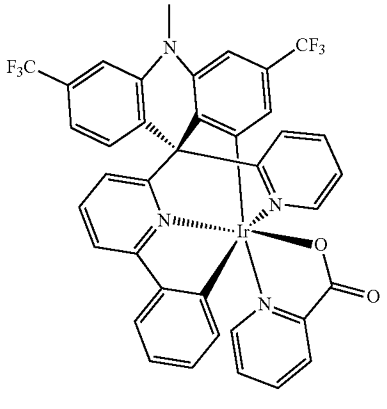
-continued
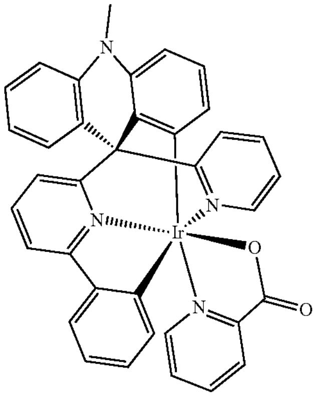
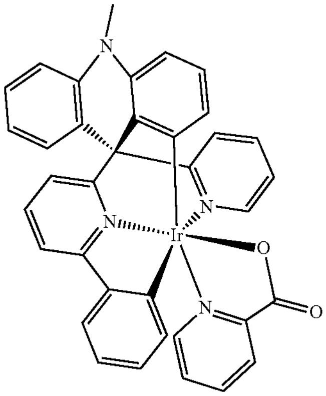
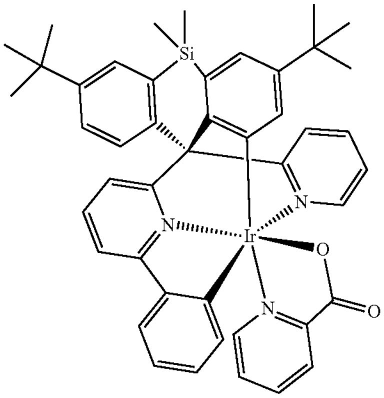
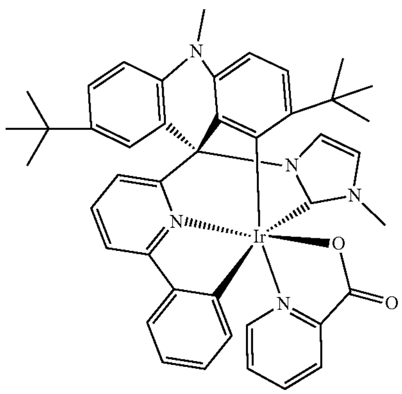

-continued
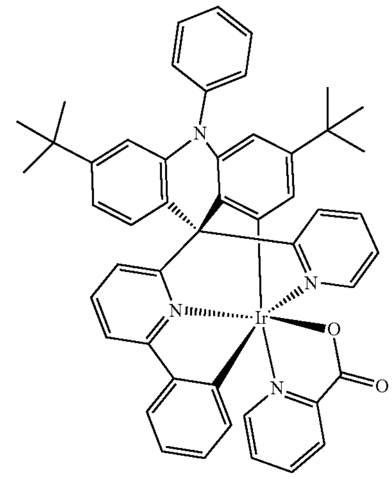
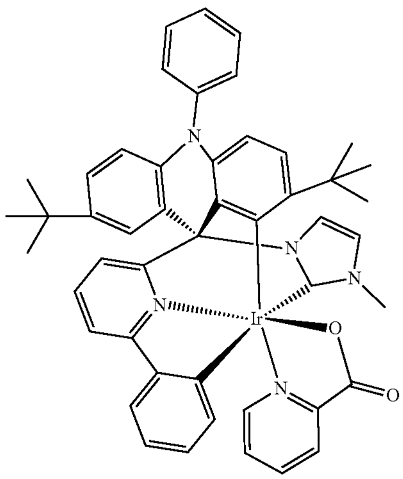
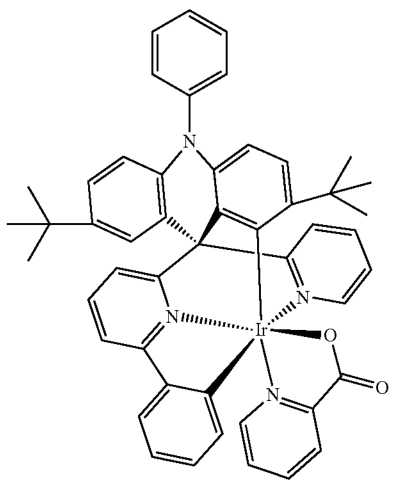
-continued
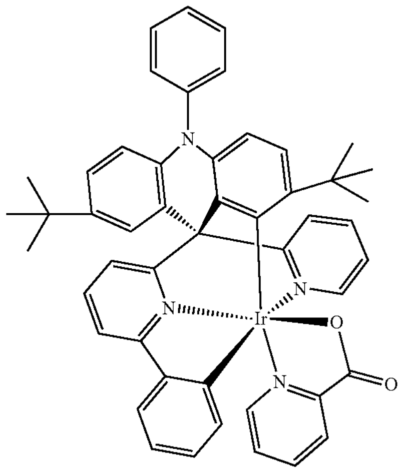
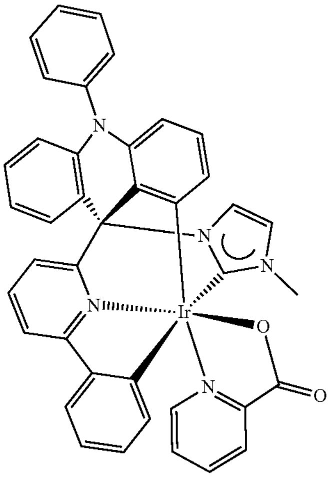
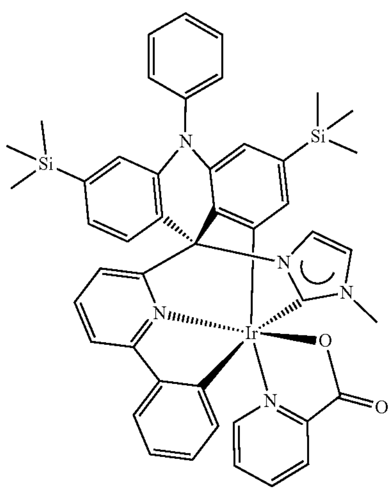

-continued
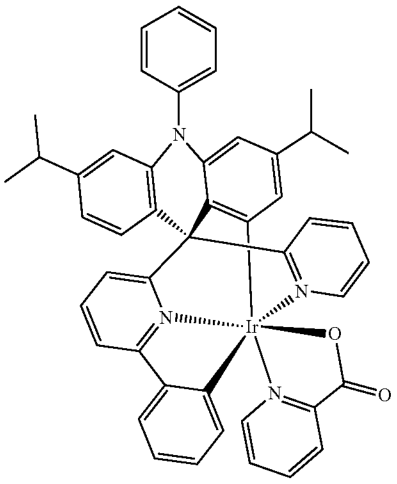
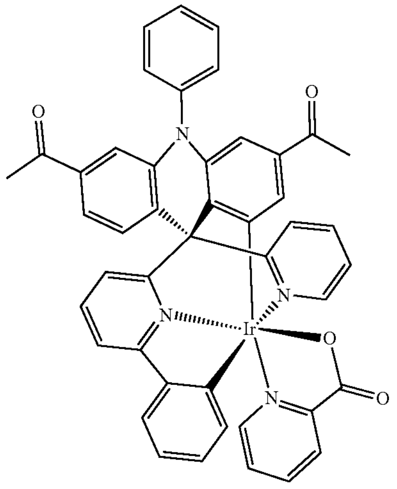
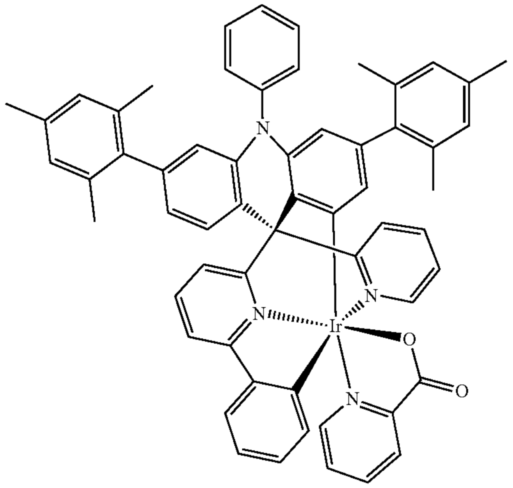
-continued
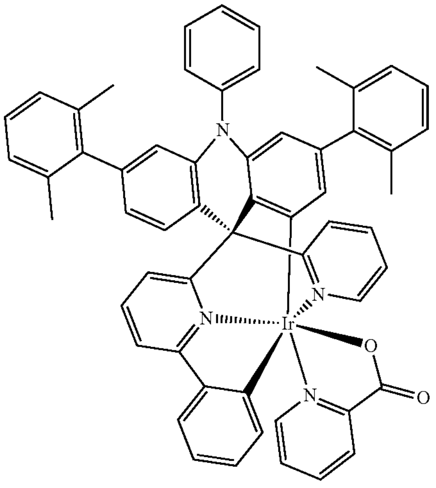
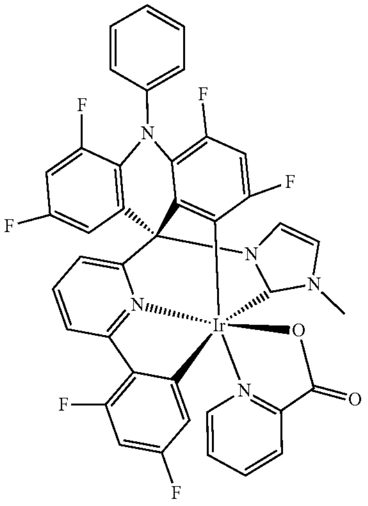
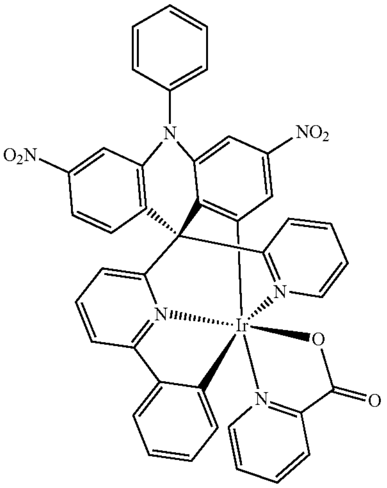

-continued
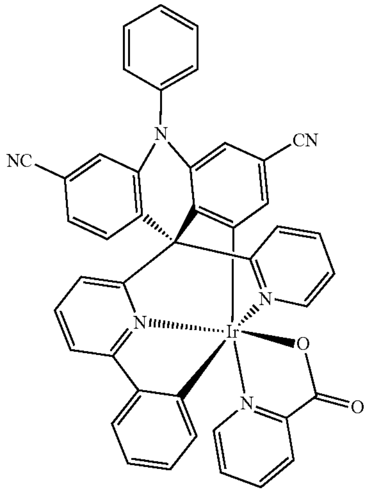
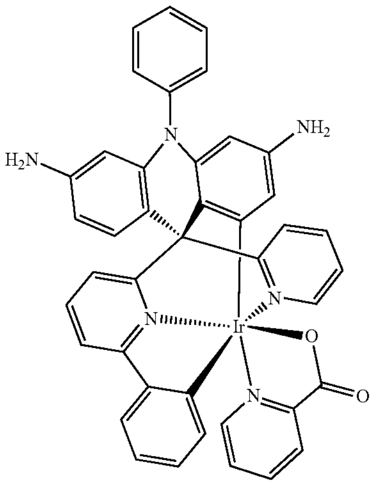
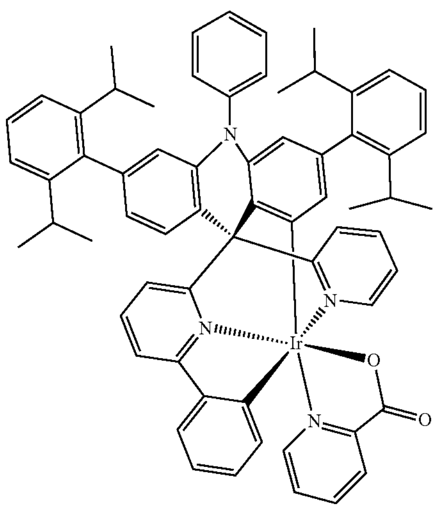
-continued
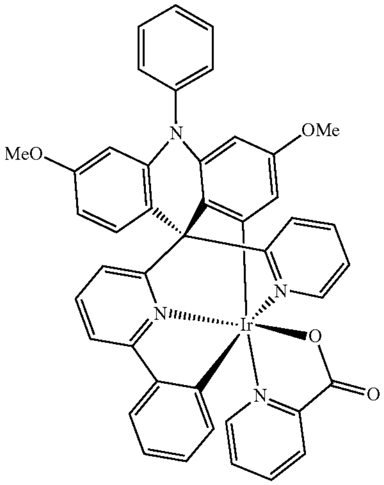
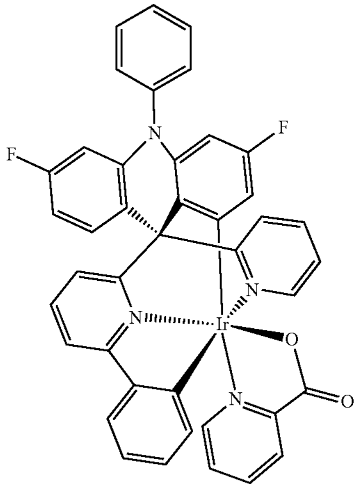
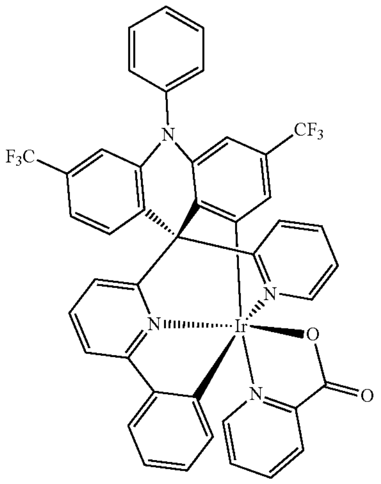

-continued

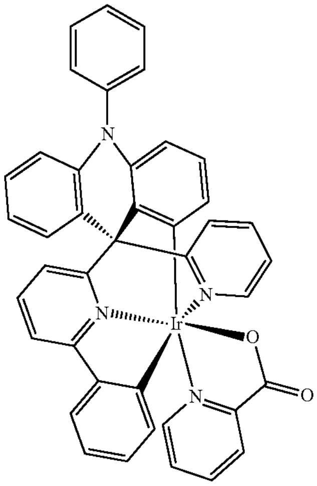

-continued

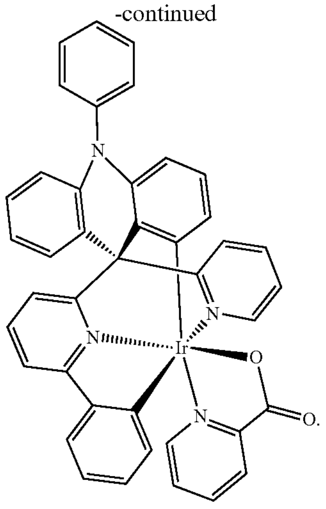

EXAMPLES

Unless otherwise indicated in the examples and elsewhere in the specification and claims, all parts and percentages are by weight, al temperatures are in degrees Centigrade, and pressure is at or near atmospheric pressure.

Synthesis of Tetradentate Ligands and Iridium Complexes

Scheme 1. Synthesis of L1 and L2 and L3

The synthesis of (6-phenylpyridin-2-yl)(pyridin-2-yl)methanone was reported in *Synthesis* 2001, 16, 2484.

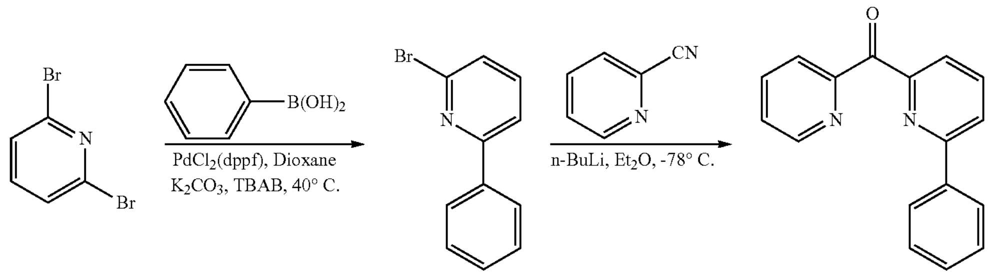

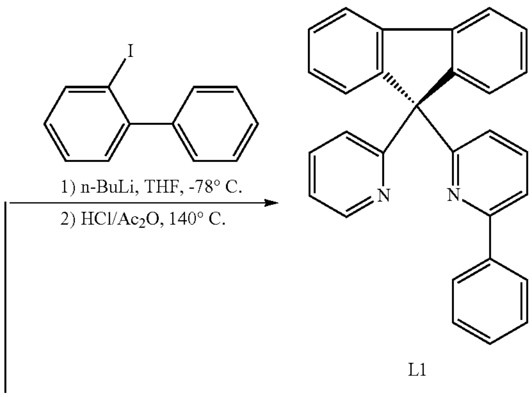

L1

-continued

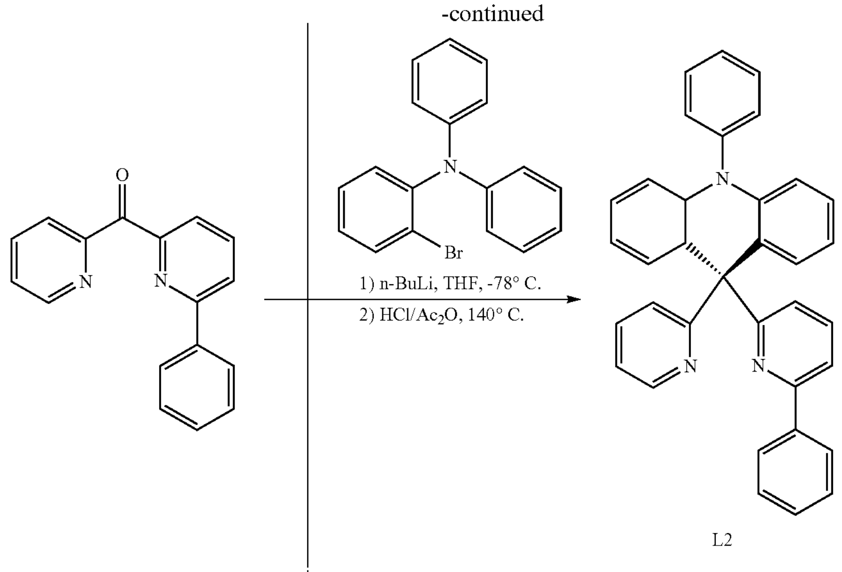

L2

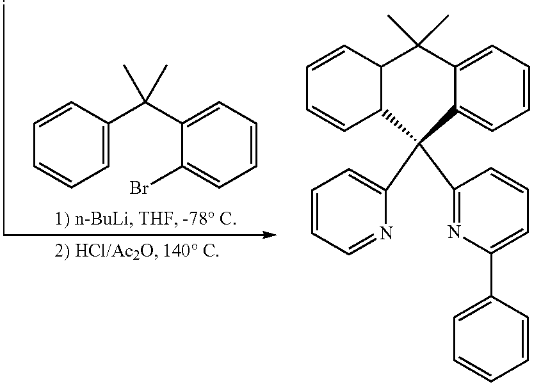

L3

General Synthesis of Tetradentate Ligands L1, L2 and L3

A solution of 2-iodobiphenyl (600 mg, 2.14 mmol) in dry THF (20 mL) was treated with n-BuLi (1.0 mL, 2.5 M in n-hexane) under argon at −78° C. After 1 h, a solution of (6-phenylpyridin-2-yl) (pyridin-2-yl) methanone (532 mg, 2.0 mmol) in THF (5 mL) was added dropwise. The resulting mixture was stirred for 30 min at −78° C., and allowed to warm to room temperature. After 12 h, the organic layer was washed with water and brine, then extracted with DCM, dried over anhydrous $MgSO_4$. The solvent was removed under reduced pressure, and the residue was purified by column chromatography on silica gel using (EA:PE=1:5) as eluent to afford the intermediate tertiary alcohol (500 mg, 60%) The intermediate tertiary alcohol was added to a mixture of concentrated aqueous HCl (1 mL) and acetic anhydride (50 mL). After refluxing for 24 h, the reaction was quenched with cold water after cooling to room temperature and neutralized with $NaHCO_3$(aq) to basic, then extracted with DCM, dried over anhydrous $MgSO_4$, and the residue was purified by column chromatography on silica gel using (EA:PE=1:4) as eluent to afford a white solid L1 (430 mg, 90%). 1H NMR (500 MHz, Chloroform-d) δ 8.63 (d, J=4.3 Hz, 1H), 7.96 (d, J=7.7 Hz, 2H), 7.93 (d, J=7.3 Hz, 2H), 7.84 (d, J=7.5 Hz, 2H), 7.57 (d, J=7.8 Hz, 1H), 7.54-7.33 (m, 9H), 7.15-7.08 (m, 2H), 7.01 (d, J=7.6 Hz, 1H). 13C NMR (126 MHZ, $CDCl_3$) δ 164.5, 163.6, 156.2, 149.3, 148.1, 140.8, 139.4, 137.0, 136.0, 128.6, 128.4, 127.9, 127.6, 127.4, 126.7, 121.3, 121.1, 120.0, 119.1, 117.9, 68.9. HR-MS (ESI) m/z: calculated for $C_{29}H_{20}N_2$ $[M+H]^+$, 397.1705; observed $[M+H]^+$, 397.1698.

L2 was prepared following the procedure described for L1 replacing 2-iodobiphenyl with 2-Bromotriphenylamine. 1H NMR (500 MHz, Chloroform-d) δ 8.69 (d, J=4.7 Hz, 1H), 7.86 (d, J=6.8 Hz, 2H), 7.64 (t, J=7.8 Hz, 1H), 7.62-7.55 (m, 4H), 7.48 (t, J=7.4 Hz, 1H), 7.39-7.30 (m, 3H), 7.25-7.21 (m, 2H), 7.16 (dd, J=6.7, 4.9 Hz, 1H), 7.12 (d, J=8.0 Hz, 1H), 7.07-6.99 (m, 4H), 6.94 (d, J=7.6 Hz, 1H), 6.86 (t, J=7.0 Hz, 2H), 6.36 (d, J=8.2 Hz, 2H). 13C NMR (126 MHz, $CDCl_3$) δ 166.2, 164.8, 155.1, 148.9, 141.6, 140.9, 139.3, 136.6, 135.4, 131.4, 131.1, 130.6, 128.6, 128.4, 128.2, 127.0, 126.9, 126.8, 125.3, 122.9, 120.8, 120.0, 116.9, 113.9, 60.5. HR-MS (ESI) m/z: calculated for $C_{35}H_{25}N_3$ $[M+H]^+$, 488.2127; observed $[M+H]^+$, 488.2125.

L3 was prepared following the procedure described for L1 replacing 2-iodobiphenyl with 1-bromo-2-(2-phenylpropan-2-yl)benzene. 1H NMR (400 MHz, Chloroform-d) δ 8.64-8.59 (m, 1H), 7.86-7.80 (m, 2H), 7.62 (dd, J=8.0, 1.1 Hz, 2H), 7.55-7.46 (m, 3H), 7.38-7.26 (m, 5H), 7.20 (dd, J=8.0, 1.4 Hz, 2H), 7.15-7.04 (m, 3H), 7.01 (d, J=8.1 Hz, 1H), 6.83-6.77 (m, 1H), 1.70 (s, 3H), 1.50 (s, 3H).

Scheme 2. Synthesis of [IrL(CO)Cl] and [IrL(MeCN)Cl] complexes

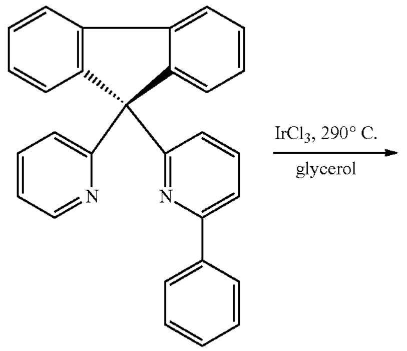

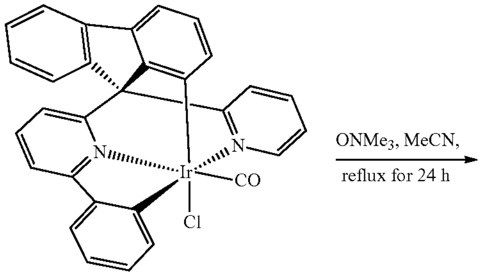

[Ir(L1)(CO)Cl]

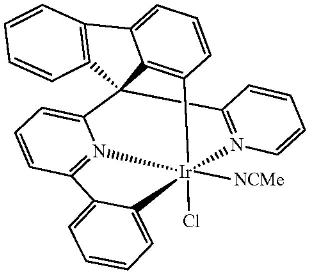

[Ir(L1)(MeCN)Cl]

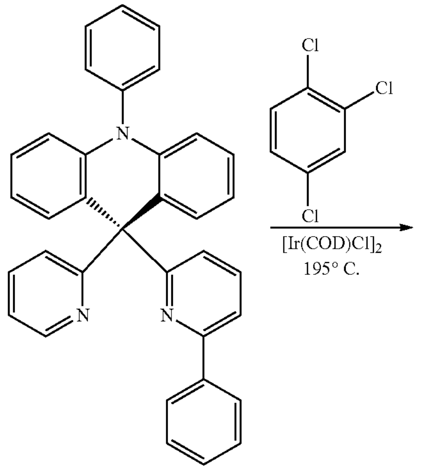

-continued

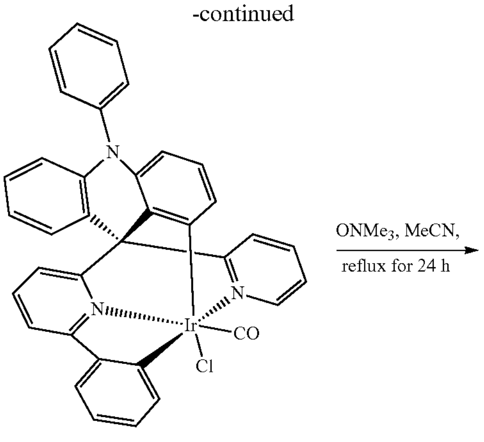

[Ir(L2)(CO)Cl]

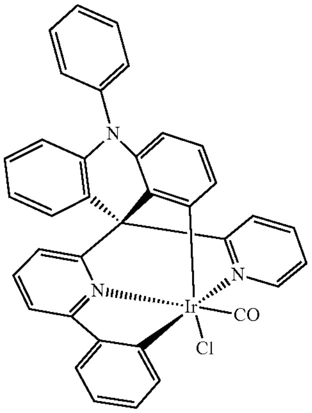

[Ir(L2)(MeCN)Cl]

Preparation of [Ir(L1)(CO)Cl]

A mixture of L1 (100 mg, 0.25 mmol) and $IrCl_3$ (90 mg, 0.30 mmol) in glycerol (6 mL) was stirred at 290° C. in open air for 2 h. After cooling to room temperature, the mixture was washed with water and extracted with DCM (3x20 mL), the organic layer was dried over anhydrous $MgSO_4$, the solvent was removed under reduced pressure. The residue was purified by column chromatography on silica gel using (EA:PE=1:2) as eluent to afford a yellow solid [Ir(L1](CO)Cl] (105 mg, 65%). 1H NMR (400 MHz, Methylene Chloride-$d_2$) δ 9.33 (d, J=4.8 Hz, 1H), 8.27 (d, J=7.4 Hz, 1H), 8.06-7.95 (m, 2H), 7.86 (d, J=7.2 Hz, 1H), 7.80 (t, J=7.7 Hz, 1H), 7.75-7.62 (m, 3H), 7.62-7.51 (m, 4H), 7.34 (d, J=7.4 Hz, 1H), 7.28 (t, J=6.3 Hz, 1H), 7.22 (t, J=7.2 Hz, 1H), 7.07 (t, J=7.5 Hz, 1H), 6.97 (t, J=7.4 Hz, 1H). 13C NMR (126 MHZ, $CDCl_3$) δ 170.2, 167.2, 157.3, 153.8, 152.9, 147.4, 144.4, 143.9, 143.9, 139.4, 139.3, 139.2, 137.0, 136.8, 136.1, 130.9, 129.9, 129.0, 128.4, 128.0, 126.8, 125.0, 124.5, 123.6, 122.3, 122.2, 118.2, 117.8, 115.9, 73.0. HR-MS (ESI) m/z: calculated for $C_{30}H_{18}ClIrN_2O$ $[M-Cl]^+$, 615.1048; observed $[M-Cl]^+$, 615.1016.

Preparation of [Ir(L2)(CO)Cl]

A mixture of L2 (120 mg, 0.25 mmol) and $[Ir(cod)Cl]_2$ (190 mg, 0.28 mmol) in 1,2,4-trichlorobenzene (6 mL) was stirred at 190° C. in open air for 2 h. After cooling to room temperature, the residue was purified by column chromatography on silica gel using (EA:DCM=1:10) as eluent to afford a yellow solid [Ir(L2](CO)Cl] (110 mg, 60%). 1H NMR (500 MHz, Chloroform-d) δ 9.48 (d, J=5.4 Hz, 1H), 8.02 (d, J=7.4 Hz, 1H), 7.79-7.75 (m, 1H), 7.66 (d, J=8.3 Hz, 1H), 7.61-7.54 (m, 4H), 7.54-7.45 (m, 4H), 7.34 (d, J=7.9 Hz, 1H), 7.31-7.26 (m, 2H), 7.25-7.15 (m, 4H), 7.10 (t, J=7.4 Hz, 1H), 7.01 (t, J=7.5 Hz, 1H), 6.49 (t, J=7.8 Hz, 1H), 6.39 (d, J=8.5 Hz, 1H), 5.76 (d, J=8.1 Hz, 1H). 13C NMR (126 MHZ, $CDCl_3$) δ 171.0, 167.9, 159.6, 157.8, 156.7, 151.0, 144.5, 141.9, 140.5, 139.0, 138.8, 138.8, 136.6, 135.2, 134.9, 132.4, 131.2, 130.9, 130.8, 129.8, 128.6, 127.3, 126.5, 124.8, 123.8, 123.4, 121.7, 118.6, 118.5, 117.7, 116.1, 115.4, 112.0, 65.3. HR-MS (ESI) m/z: calculated for $C_{36}H_{23}IrN_3O$ $[M-Cl]^+$, 706.1470; observed $[M-Cl]^+$, 706.1458.

Preparation of [Ir(L1) (MeCN)Cl]

[Ir(L1)(CO)Cl] (50 mg, 0.07 mmol), trimethylamine N-oxide (12 mg, 0.16 mmol) and MeCN (4 mL) was stirred at 65° C. under Ar atmosphere for about 24 h. After cooling to room temperature, the solvent was removed under reduced pressure and the residue was purified by silica gel column chromatography with EA/DCM=1:5 as eluent to afford yellow-green solid [Ir(L1)(MeCN)Cl] (40 mg, 80%). $^1H$ NMR (500 MHz, Chloroform-d) δ 9.32 (d, J=5.2 Hz, 1H), 8.23 (d, J=7.3 Hz, 1H), 7.93 (d, J=7.4 Hz, 1H), 7.88 (d, J=8.1 Hz, 1H), 7.81 (d, J=7.3 Hz, 1H), 7.70-7.57 (m, 3H), 7.52 (d, J=7.7 Hz, 1H), 7.49 (d, J=7.4 Hz, 1H), 7.47-7.36 (m, 3H), 7.25-7.18 (m, 3H), 6.99 (t, J=7.4 Hz, 1H), 6.92 (t, J=7.4 Hz, 1H), 2.75 (s, 3H). HR-MS (ESI) m/z: calculated for $C_{31}H_{21}ClIrN_3$ $[M-Cl]^+$, 628.1365; observed $[M-Cl]^+$, 628.1360.

Preparation of [Ir(L2)(MeCN)Cl]

[Ir(L2)(MeCN)Cl] was prepared following the procedure described for [Ir(L1)(MeCN)Cl] replacing [Ir(L1)(CO)Cl] with [Ir(L2)(CO)Cl].

$^1H$ NMR (500 MHz, Chloroform-d) δ 9.41 (s, 1H), 7.91 (d, J=7.3 Hz, 1H), 7.68 (t, J=7.5 Hz, 1H), 7.62-7.51 (m, 4H), 7.49-7.42 (m, 3H), 7.25-7.13 (m, 8H), 7.07 (t, J=7.4 Hz, 1H), 6.99 (t, J=7.4 Hz, 1H), 6.45 (t, J=7.7 Hz, 1H), 6.34 (d, J=8.4 Hz, 1H), 5.64 (d, J=8.0 Hz, 1H), 2.66 (s, 3H). $^{13}C$ NMR (126 MHZ, $CDCl_3$) δ 170.7, 160.7, 158.8, 157.4, 153.5, 146.4, 142.2, 140.9, 138.1, 137.0, 136.5, 135.2, 133.3, 131.1, 129.9, 129.7, 129.4, 129.0, 128.3, 126.3, 125.6, 124.2, 123.2, 122.0, 121.0, 118.8, 118.2, 116.5, 116.5, 115.8, 110.2, 64.9, 29.3. HR-MS (ESI) m/z: calculated for $C_{37}H_{26}ClIrN_4$ $[M-Cl]^+$, 719.1787; observed $[M-Cl]^+$, 719.1779.

Scheme 3. Synthesis of [Ir(L1)(O^O)] complexes

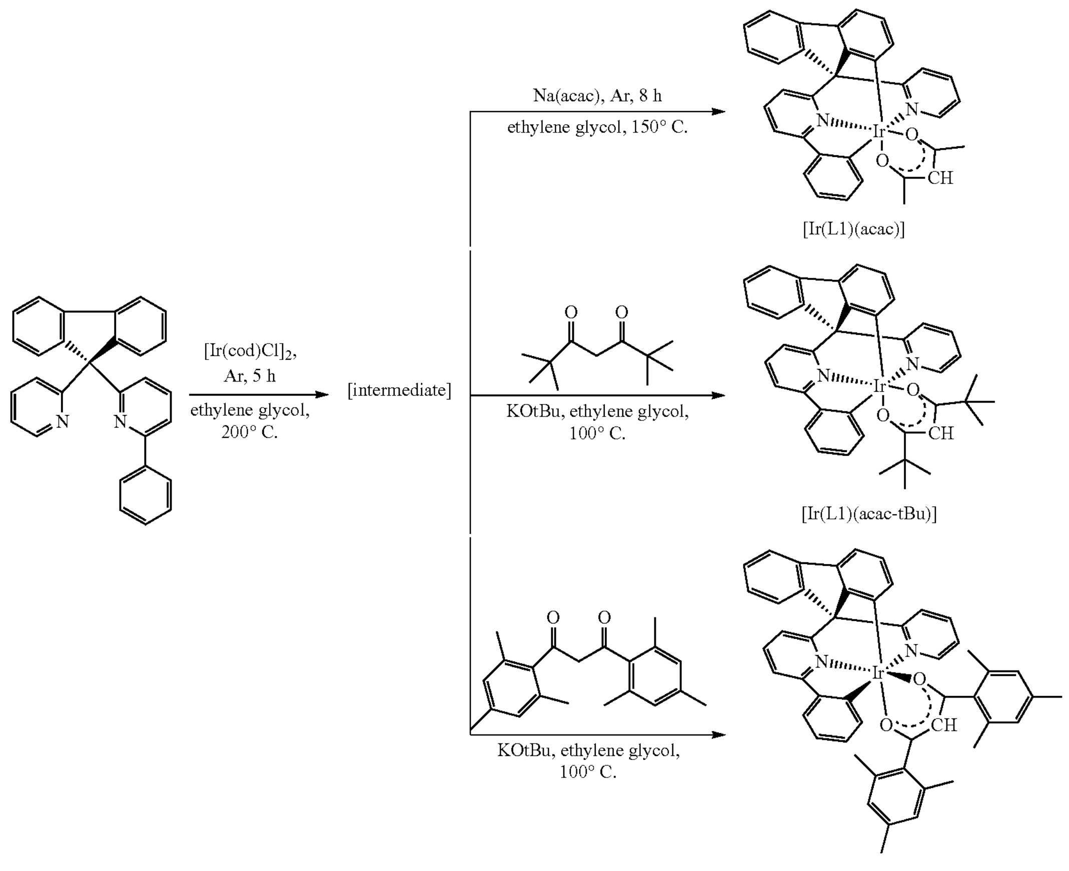

[Ir(L1)(acac)]

[Ir(L1)(acac-tBu)]

[Ir(L1)(acac-mes)]

Preparation of [Ir(L1) (acac)]

A mixture of L1 (100 mg, 0.25 mmol) and $[Ir(cod)Cl]_2$ (180 mg, 0.27 mmol) in ethylene glycol (8 mL) was stirred at 200° C. under Ar atmosphere for about 5 h. After cooling to room temperature, the mixture was washed with water and extracted with DCM, the organic layer was dried over anhydrous $MgSO_4$. The crude intermediate mixture was treated with sodium 2,4-pentanedionate hydrate (90 mg, 0.74 mmol) in ethylene glycol (10 mL) and stirred at 1500° C. under Ar atmosphere for about 8 h. After cooling to room temperature, the mixture was washed with water and extracted with DCM, the organic layer was dried over anhydrous $MgSO_4$. The solvent was removed under reduced pressure and the residue was purified by silica gel column chromatography with PE/DCM=1:1 as eluent to afford yellow solid [Ir(L1)(acac)] (40 mg, 23%).

$^1$H NMR (500 MHz, Chloroform-d) δ 8.37 (d, J=4.9 Hz, 1H), 8.20 (d, J=7.0 Hz, 1H), 7.88 (d, J=8.1 Hz, 1H), 7.80 (d, J=6.8 Hz, 1H), 7.67-7.54 (m, 4H), 7.52 (d, J=7.4 Hz, 1H), 7.44 (d, J=7.6 Hz, 1H), 7.38-7.30 (m, 3H), 7.22-7.14 (m, 2H), 7.12 (t, J=7.3 Hz, 1H), 6.99-6.90 (m, 2H), 5.44 (s, 1H), 2.21 (s, 3H), 1.58 (s, 3H). $^{13}$C NMR (126 MHZ, $CDCl_3$) δ 184.6, 184.4, 170.8, 157.8, 156.8, 155.9, 152.0, 146.9, 146.2, 145.1, 140.3, 137.0, 135.6, 134.8, 134.2, 133.8, 130.8, 129.2, 129.1, 127.8, 126.6, 125.7, 123.9, 123.6, 122.0, 121.9, 121.6, 117.1, 115.7, 113.9, 101.4, 72.4, 28.2. HR-MS (ESI) m/z: calculated for $C_{34}H_{25}IrN2O_2$ $[M+H]^+$, 687.1624; observed $[M+H]^+$, 687.1619.

Preparation of [Ir(L1)(acac-tBu)]

The intermediate mixture and 2,2,6,6-tetramethyl-3,5-heptanedione (170 mg, 0.96 mmol) and KOtBu (230 mg, 2 mmol) in ethylene glycol (10 mL) was stirred at 100° C. under Ar atmosphere overnight. After cooling to room temperature, the mixture was washed with water and extracted with DCM, the organic layer was dried over anhydrous $MgSO_4$. The solvent was removed under reduced pressure and the residue was purified by silica gel column chromatography with PE/DCM=5:1 as eluent to afford yellow solid [Ir(L1)(acac-tBu)] (15 mg, 48%). $^1$H NMR (500 MHz, Chloroform-d) δ 8.24-8.19 (m, 1H), 8.15 (d, J=5.2 Hz, 1H), 7.89 (d, J=8.1 Hz, 1H), 7.80 (d, J=7.3 Hz, 1H), 7.64-7.48 (m, 5H), 7.42 (d, J=7.6 Hz, 1H), 7.38 (m -7.30, 3H), 7.17 (d, J=7.3 Hz, 1H), 7.15-7.07 (m, 1H), 7.03 (t, J=7.4 Hz, 1H), 6.94 (t, J=7.3 Hz, 1H), 6.89 (t, J=7.4 Hz, 1H), 5.68 (s, 1H), 1.35 (s, 9H), 0.71 (s, 9H).

Preparation of [Ir(L1)(acac-mes)]

The intermediate mixture and 1,3-dimesitylpropane-1,3-dione (15 mg, 0.05 mmol) and KOtBu (5 mg, 0.05 mmol) in ethylene glycol (10 mL) was stirred at 100° C. under Ar atmosphere overnight. After cooling to room temperature, the mixture was washed with water and extracted with DCM, the organic layer was dried over anhydrous $MgSO_4$. The solvent was removed under reduced pressure and the residue was purified by silica gel column chromatography with Hex/DCM=3:1 as eluent to afford yellow solid [Ir(L1)(acac-mes)] (17 mg, 80%). $^1$H NMR (500 MHz, Methylene Chloride-$d_2$) δ 8.98 (d, J=5.0 Hz, 1H), 8.21 (d, J=7.3 Hz, 1H), 7.92-7.86 (m, 2H), 7.75 (d, J=7.3 Hz, 1H), 7.67 (t, J=7.6 Hz, 1H), 7.60-7.50 (m, 2H), 7.43 (d, J=7.6 Hz, 1H), 7.39-7.29 (m, 4H), 7.24-7.17 (m, 1H), 7.10 (d, J=7.2 Hz, 1H), 7.06 (t, J=7.3 Hz, 1H), 6.94 (t, J=7.4 Hz, 1H), 6.81 (d, J=4.5 Hz, 4H), 6.53 (s, 2H), 5.54 (s, 1H), 2.41 (s, 6H), 2.16-2.24 (m, 6H), 2.05 (s, 3H), 1.18 (s, 3H).

Scheme 4. Synthesis of [Ir(L1)(C^N)] complexes

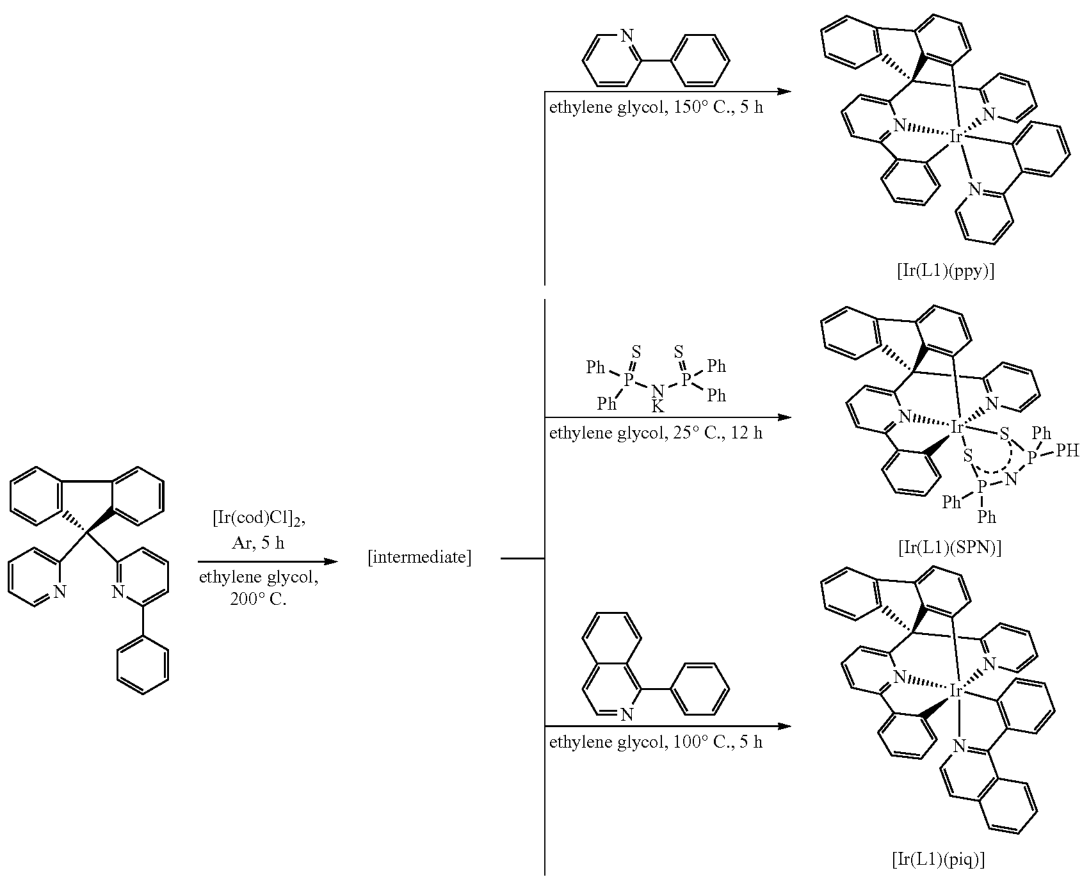

-continued

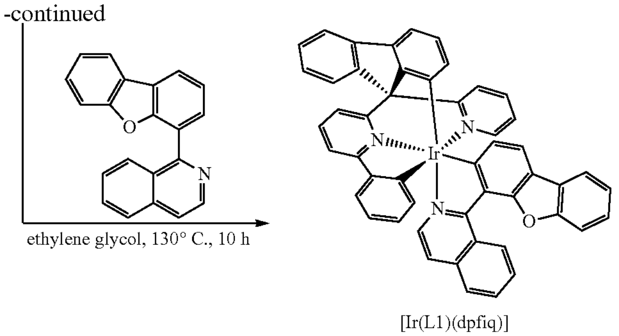

[Ir(L1)(dpfiq)]

Preparation of [Ir(L1)(ppy)]

The intermediate mixture and 2-phenylpyridine (120 mg, 0.77 mmol) in ethylene glycol (10 mL) was stirred at 150° C. under Ar atmosphere for about 8 h. After cooling to room temperature, the mixture was washed with water and extracted with DCM, the organic layer was dried over anhydrous $MgSO_4$. The solvent was removed under reduced pressure and the residue was purified by silica gel column chromatography with PE/DCM=1:1 as eluent to afford yellow solid [Ir(L1) (ppy)] (46 mg, 25%). 1H NMR (500 MHz, Chloroform-d) δ 8.43 (d, J=7.4 Hz, 1H), 8.30 (d, J=6.9 Hz, 1H), 8.04 (d, J=7.2 Hz, 1H), 8.00 (d, J=8.0 Hz, 1H), 7.90 (t, J=8.5 Hz, 2H), 7.84 (d, J=6.9 Hz, 1H), 7.64-7.55 (m, 3H), 7.57-7.38 (m, 7H), 7.26 (t, J=6.6 Hz, 2H), 7.20 (t, J=7.1 Hz, 1H), 7.05 (t, J=7.3 Hz, 1H), 6.96 (d, J=8.1 Hz, 1H), 6.70-6.61 (m, 3H), 6.58 (t, J=6.2 Hz, 1H). HR-MS (ESI) m/z: calculated for $C_{40}H_{26}IrN_3$ $[M+H]^+$, 742.1834; observed $[M+H]^+$, 742.1828.

Preparation of [Ir(L1)(SPN)]

The intermediate mixture and K(SPN) (94 mg, 0.20 mmol) in ethylene glycol (10 mL) was stirred at r.t. overnight. After cooling to room temperature, the mixture was washed with water and extracted with DCM, the organic layer was dried over anhydrous $MgSO_4$. The solvent was removed under reduced pressure and the residue was purified by silica gel column chromatography to afford yellow solid [Ir(L1)(SPN)] (50 mg, 50%). 1H NMR (400 MHz, Chloroform-d) δ 9.53-9.45 (m, 1H), 8.18 (d, J=6.7 Hz, 1H), 8.14 (d, J=7.5 Hz, 1H), 8.10-8.00 (m, 2H), 7.97-7.87 (m, 2H), 7.79-7.71 (m, 2H), 7.68-7.42 (m, 9H), 7.41-7.30 (m, 6H), 7.27 (s, 1H), 7.25-7.15 (m, 5H), 7.15-7.07 (m, 4H), 6.87 (t, J=7.4 Hz, 1H), 6.76-6.69 (m, 1H), 6.57-6.49 (m, 1H), 6.48-6.40 (m, 1H).

Preparation of [Ir(L1)(piq)]

The intermediate mixture and 1-phenylisoquinoline (14 mg, 0.07 mmol) in ethylene glycol (10 mL) was stirred at 100° C. under Ar atmosphere overnight. After cooling to room temperature, the mixture was washed with water and extracted with DCM, the organic layer was dried over anhydrous $MgSO_4$. The solvent was removed under reduced pressure and the residue was purified by silica gel column chromatography with Hex/DCM=1:1 as eluent to afford yellow solid [Ir(L1)(piq)] (7 mg, 15%). 1H NMR (400 MHz, Chloroform-d) δ 9.07 (d, J=8.5 Hz, 1H), 8.56-8.49 (m, 1H), 8.47-8.40 (m, 1H), 8.35-8.30 (m, 1H), 8.07 (d, J=7.3 Hz, 1H), 8.02 (d, J=8.0 Hz, 1H), 7.87-7.82 (m, 1H), 7.71-7.65 (m, 2H), 7.65-7.53 (m, 6H), 7.51 (dd, J=5.5, 1.3 Hz, 1H), 7.46 (td, J=7.9, 1.7 Hz, 1H), 7.39-7.34 (m, 1H), 7.32 (d, J=6.1 Hz, 1H), 7.27-7.21 (m, 3H), 7.10-7.03 (m, 2H), 6.99 (d, J=6.1 Hz, 1H), 6.68-6.58 (m, 2H), 6.55-6.50 (m, 1H).

Preparation of [Ir(L1)(dpfiq)]

The intermediate mixture and 1-(dibenzo[b,d]furan-4-yl) isoquinoline (24 mg, 0.08 mmol) in ethylene glycol (10 mL) was stirred at 100° C. under Ar atmosphere overnight. After cooling to room temperature, the mixture was washed with water and extracted with DCM, the organic layer was dried over anhydrous $MgSO_4$. The solvent was removed under reduced pressure and the residue was purified by silica gel column chromatography with Hex/DCM=2:1 as eluent to afford red solid [Ir(L1)(dpfiq)] (7 mg, 20%). 1H NMR (500 MHz, Chloroform-d) δ 8.98-8.93 (m, 1H), 8.51 (d, J=7.9 Hz, 1H), 8.33 (d, J=7.1 Hz, 1H), 8.10 (d, J=7.2 Hz, 1H), 8.06-7.98 (m, 2H), 7.86 (d, J=7.7 Hz, 2H), 7.70-7.50 (m, 8H), 7.50-7.30 (m, 8H), 7.14-7.06 (m, 3H), 6.59-6.54 (m, 2H), 6.50-6.46 (m, 1H).

Scheme 5. Synthesis of [Ir(L1)(pic)] complex

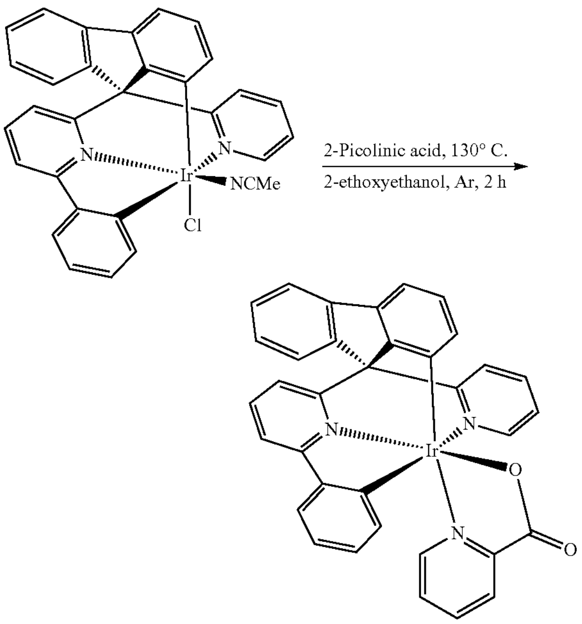

Preparation of [Ir(L1)(pic)]

[Ir(L1)(MeCN)Cl] (30 mg, 0.045 mmol), 2-picolinic acid (13 mg, 0.10 mmol) and $NaHCO_3$ (15 mg, 0.18 mmol) was stirred in 4 mL ethylene glycol at 130° C. under Ar atmosphere for about 2 h. After cooling to room temperature, the mixture was washed with water and extracted with DCM, dried over $MgSO_4$. The solvent was removed under vacuum and the residue was purified by silica gel column chromatography with DCM/EA=5:1 as eluent to afford yellow-green solid [Ir(L1)(pic)] (20 mg, 63%).

$^1$H NMR (400 MHz, Chloroform-d) δ 8.28 (d, J=7.8 Hz, 1H), 8.23 (d, J=6.6 Hz, 1H), 7.99 (d, J=4.7 Hz, 1H), 7.89 (dd, J=11.3, 7.8 Hz, 2H), 7.85-7.75 (m, 3H), 7.65-7.54 (m, 3H), 7.53-7.46 (m, 3H), 7.38 (d, J=6.9 Hz, 2H), 7.23 (d, J=7.5 Hz, 1H), 7.15-7.08 (m, 1H), 7.05-6.90 (m, 3H), 6.81 (t, J=7.4 Hz, 1H).

stirred in 4 mL ethylene glycol at 130° C. under Ar atmosphere for about 2 h. After cooling to room temperature, the mixture was washed with water and extracted with DCM, dried over $MgSO_4$. The solvent was removed under vacuum and the residue was purified by silica gel column chromatography to afford yellow-green solid [Ir(L2)(pic)] (34 mg, 94%). $^1$H NMR (500 MHz, Chloroform-d) δ 8.29 (d, J=7.5 Hz, 1H), 8.00 (d, J=4.9 Hz, 1H), 7.79 (t, J=7.1 Hz, 1H), 7.76-7.65 (m, 3H), 7.65-7.50 (m, 6H), 7.50-7.35 (m, 4H), 7.25-7.12 (m, 4H), 7.06 (t, J=7.3 Hz, 1H), 7.04-6.90 (m, 2H), 6.82 (t, J=7.2 Hz, 1H), 6.51 (t, J=7.6 Hz, 1H), 6.38 (d, J=8.5 Hz, 1H), 5.63 (d, J=7.9 Hz, 1H).

Scheme 6. Synthesis of [Ir(L2)(acac)] and [Ir(L2)(pic)] complexes

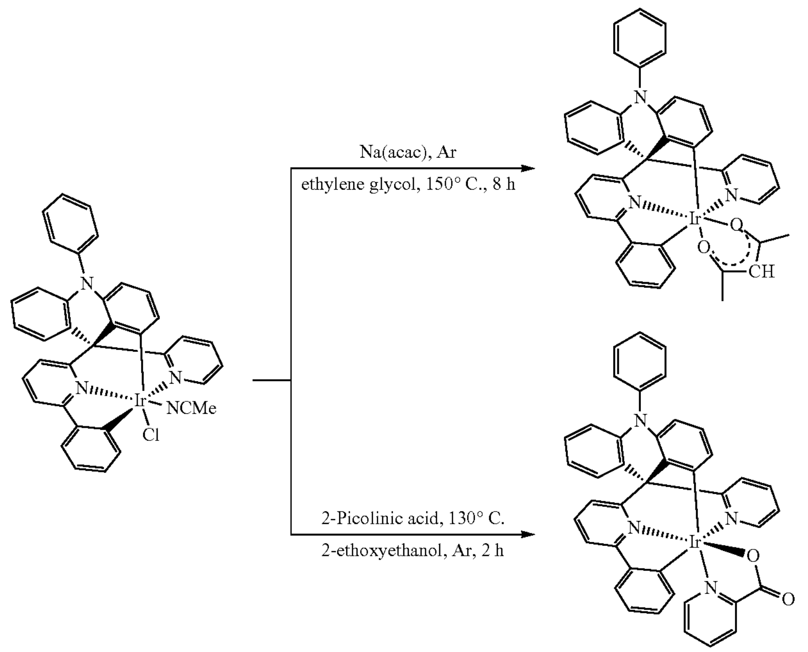

Preparation of [Ir(L2)(acac)]

[Ir(L2)(MeCN)Cl] (30 mg, 0.04 mmol), sodium 2,4-pentanedionate hydrate (10 mg, 0.08 mmol) and 4 mL ethylene glycol was stirred at 150° C. under Ar atmosphere for about 8 h. After cooling to room temperature, the mixture was washed with water and extracted with DCM, dried over $MgSO_4$. The solvent was removed under vacuum and the residue was purified by silica gel column chromatography with PE/DCM=1:1 as eluent to afford yellow-green solid [Ir(L2)(acac)] (5 mg, 16%).

$^1$H NMR (400 MHz, Chloroform-d) δ 8.36 (d, J=5.3 Hz, 1H), 7.65 (t, J=7.8 Hz, 1H), 7.60 (d, J=7.5 Hz, 2H), 7.57-7.49 (m, 4H), 7.48-7.41 (m, 3H), 7.28 (d, J=4.8 Hz, 1H), 7.23-7.08 (m, 6H), 7.03 (t, J=7.3 Hz, 1H), 6.97 (t, J=7.5 Hz, 1H), 6.48 (t, J=7.7 Hz, 1H), 6.35 (d, J=8.5 Hz, 1H), 5.56 (d, J=8.0 Hz, 1H), 5.46 (s, 1H), 2.17 (s, 3H), 1.64 (s, 4H). $^{13}$C NMR (126 MHZ, $CDCl_3$) δ 184.8, 184.7, 171.2, 161.9, 161.3, 160.3, 151.6, 146.7, 142.6, 141.2, 139.6, 137.5, 136.4, 135.3, 135.2, 133.6, 131.2, 130.9, 129.6, 129.1, 128.1, 127.5, 125.9, 125.7, 123.4, 123.3, 121.5, 121.1, 119.4, 117.6, 116.9, 115.8, 115.6, 110.0, 101.4, 64.9, 28.3, 28.2. HR-MS (ESI) m/z: calculated for $C_{40}H_{30}IrN_3O_2$ $[M+H]^+$, 778.2046; observed $[M+H]^+$, 778.2033.

Preparation of [Ir(L2) (pic)]

[Ir(L2)(MeCN)Cl] (37 mg, 0.045 mmol), 2-picolinic acid (12 mg, 0.10 mmol) and $NaHCO_3$ (17 mg, 0.18 mmol) was Scheme 7. Synthesis of [Ir(L2)(ppy)]

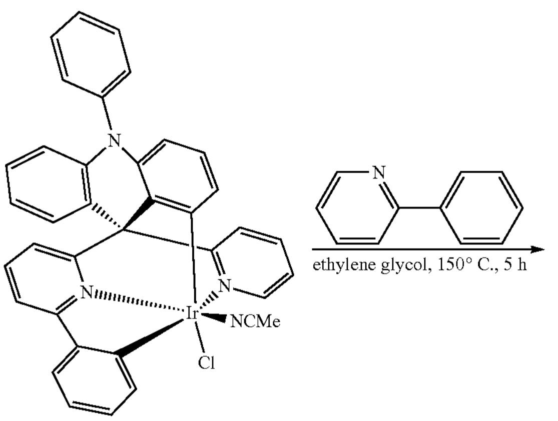

-continued

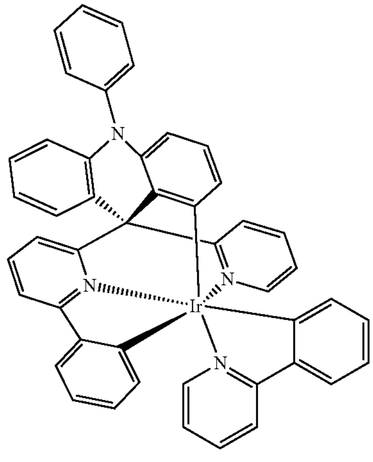

-continued

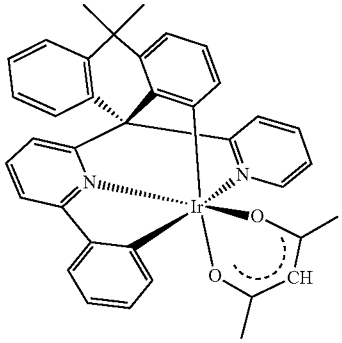

Preparation of [Ir(L2)(ppy)]

[Ir(L2)(MeCN)Cl] (30 mg, 0.04 mmol), 2-phenylpyridine (0.12 mmol) and 4 mL ethylene glycol was stirred at 150° C. under Ar atmosphere for about 10 h. After cooling to room temperature, the mixture was washed with water and extracted with DCM, dried over $MgSO_4$. The solvent was removed under vacuum and the residue was purified by silica gel column chromatography with (PE/DCM=1:1 to EA/DCM=1:10) as eluent to afford [Ir(L2)(ppy)] (10%) 1H NMR (400 MHz, Chloroform-d) δ 8.18-8.11 (m, 1H), 7.89 (d, J=8.6 Hz, 2H), 7.73-7.40 (m, 14H), 7.24-7.14 (m, 4H), 7.05-6.99 (m, 1H), 6.90-6.83 (m, 1H), 6.75-6.63 (m, 3H), 6.57-6.49 (m, 2H), 6.34 (d, J=8.4 Hz, 1H), 5.62 (d, J=7.9 Hz, 1H). HR-MS (ESI) m/z: calculated for C46H31IrN4 [M+H]+, 833.2256; observed [M+H]$_+$, 833.2247.

Scheme 8. Synthesis of [Ir(L3)(acac)]

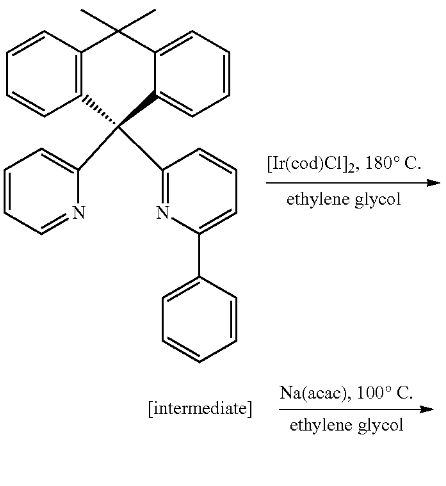

Preparation of [Ir(L3)(acac)]

A mixture of L3 (150 mg, 0.34 mmol) and $[Ir(cod)Cl]_2$ (250 mg, 0.37 mmol) in ethylene glycol (8 mL) was stirred at 190° C. under Ar atmosphere for about 20 h. After cooling to room temperature, the mixture was washed with water and extracted with DCM, the organic layer was dried over anhydrous $MgSO_4$. The crude intermediate mixture and sodium 2,4-pentanedionate hydrate (125 mg, 1.0 mmol) in ethylene glycol (15 mL) was stirred at 1000° C. under Ar atmosphere overnight. After cooling to room temperature, the mixture was washed with water and extracted with DCM, the organic layer was dried over anhydrous $MgSO_4$. The solvent was removed under reduced pressure and the residue was purified by silica gel column chromatography with PE/DCM=1:1 as eluent to afford yellow solid [Ir(L3)(acac)] (35 mg, 14%). 1H NMR (500 MHz, Chloroform-d) δ 8.34 (d, J=4.7 Hz, 1H), 7.79 (d, J=8.0 Hz, 1H), 7.63 (d, J=7.4 Hz, 1H), 7.59 (dd, J=12.4, 7.5 Hz, 2H), 7.54-7.42 (m, 4H), 7.40 (d, J=7.9 Hz, 1H), 7.31 (t, J=8.0 Hz, 1H), 7.11 (q, J=6.9, 6.1 Hz, 2H), 7.05 (d, J=8.3 Hz, 1H), 6.97 (dd, J=11.8, 7.6 Hz, 2H), 6.86 (d, J=8.0 Hz, 1H), 6.80 (t, J=7.5 Hz, 1H), 5.47 (s, 1H), 2.18 (s, 3H), 1.65 (s, 3H), 1.56 (s, 3H), 1.54 (s, 3H).

Scheme 9. Synthesis of L4 and L5.

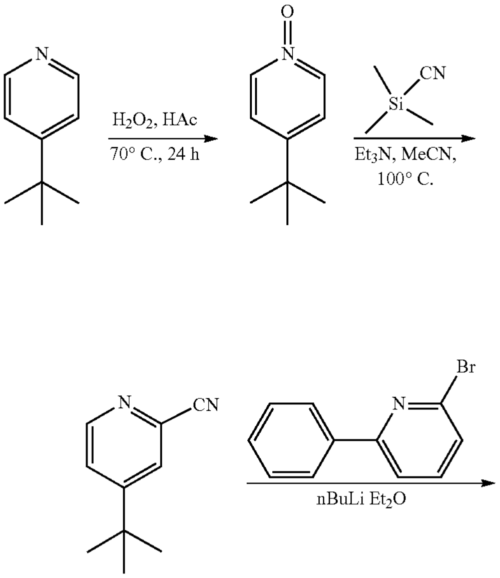

-continued

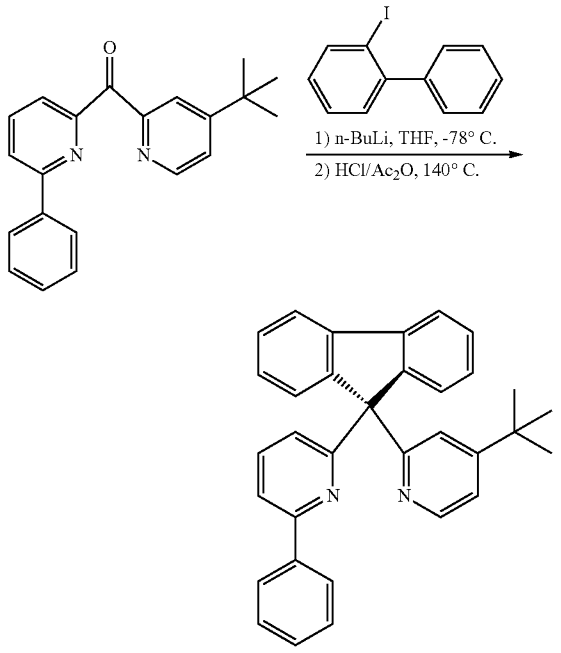

L4

-continued

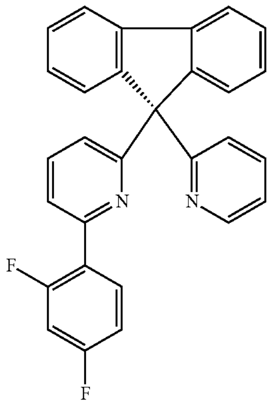

L5

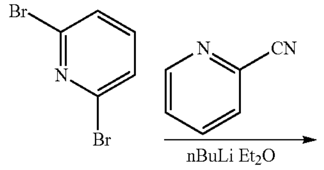

L4 was prepared following the procedure described for L1 replacing (6-phenylpyridin-2-yl) (pyridin-2-yl) methanone with (4-(tert-butyl)pyridin-2-yl) (6-phenylpyridin-2-yl) methanone. 1H NMR (300 MHZ, $CDCl_3$) δ 8.46 (d, J=5.2 Hz, 1H), 7.90 (d, J=7.6 Hz, 2H), 7.86 (dd, J=7.8, 1.6 Hz, 2H), 7.79 (d, J=7.4 Hz, 2H), 7.54-7.25 (m, 9H), 7.19 (s, 1H), 7.07 (dd, J=5.2, 1.7 Hz, 1H), 6.93 (d, J=7.2 Hz, 1H), 1.17 (s, 9H).

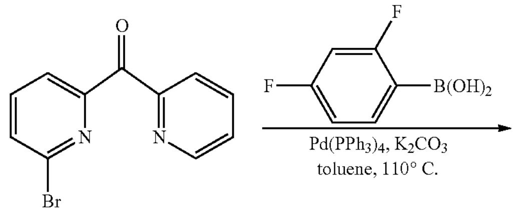

L5 was prepared following the procedure described for L1 replacing (6-phenylpyridin-2-yl) (pyridin-2-yl) methanone with (6-(2,4-difluorophenyl)pyridin-2-yl) (pyridin-2-yl) methanone. $^{1}$H NMR (500 MHZ, $CDCl_3$) δ 8.59 (d, J=4.1 Hz, 1H), 7.84 (d, J=7.6 Hz, 2H), 7.82-7.75 (m, 3H), 7.61 (dd, J=7.9, 1.5 Hz, 1H), 7.51 (t, J=7.8 Hz, 1H), 7.46 (td, J=7.8, 1.9 Hz, 1H), 7.41 (td, J=7.5, 1.0 Hz, 2H), 7.32 (td, J=7.5, 1.0 Hz, 2H), 7.09 (ddd, J=7.5, 4.8, 0.9 Hz, 1H), 7.05 (d, J=8.0 Hz, 1H), 6.98 (d, J=7.8 Hz, 1H), 6.90-6.81 (m, 2H). $^{19}$F NMR (377 MHz, $CDCl_3$) δ=−110.1, −112.0.

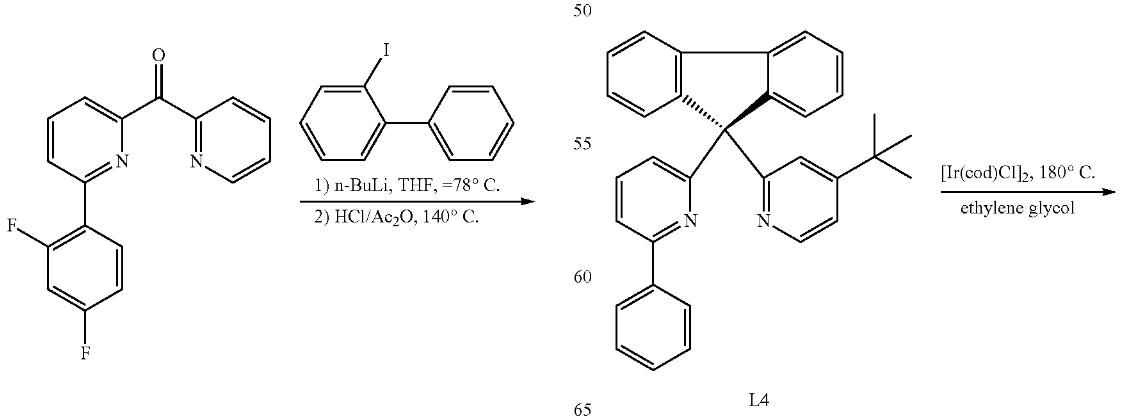

L4

-continued

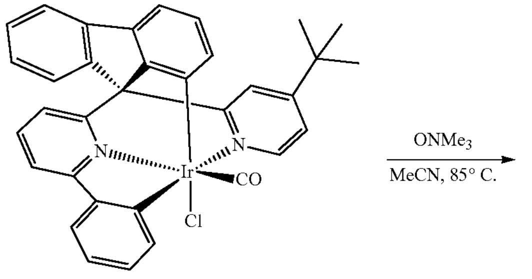

Ir(L4)(CO)Cl

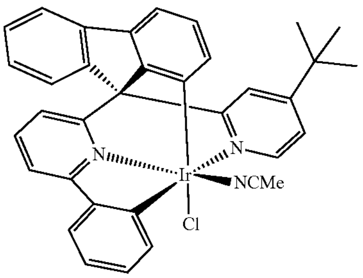

Ir(L4)(MeCN)Cl

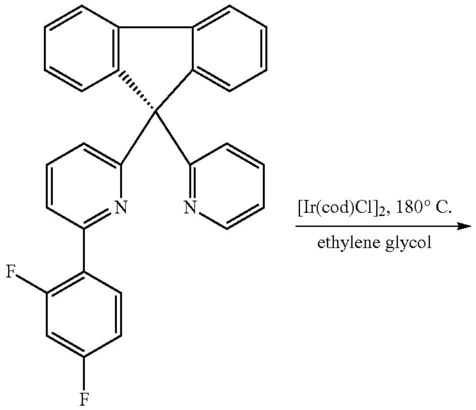

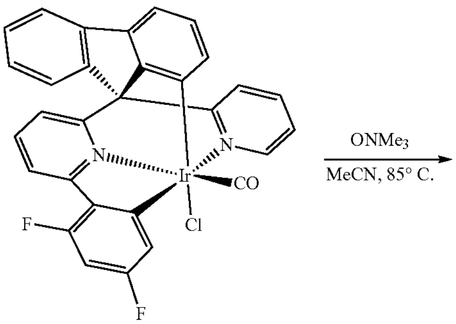

Ir(L5)(CO)Cl

-continued

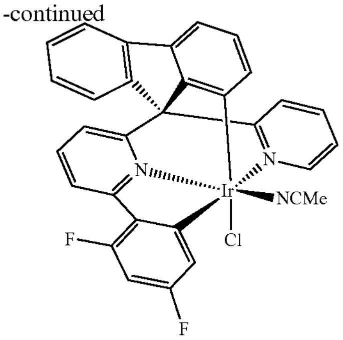

Ir(L5)(MeCN)Cl

Preparation of [Ir(L4)(CO)Cl]

[Ir(L4)(CO)Cl] was prepared following the procedure described for [Ir(L2)(CO)Cl] replacing L2 with L4. $^1$H NMR (500 MHZ, $CDCl_3$) δ 9.24 (d, J=6.0 Hz, 1H), 8.22 (d, J=7.4 Hz, 1H), 8.04 (d, J=7.4 Hz, 1H), 7.99 (d, J=1.8 Hz, 1H), 7.85 (d, J=7.3 Hz, 1H), 7.69 (dt, J=7.6, 3.9 Hz, 1H), 7.64 (t, J=7.5 Hz, 1H), 7.59 (t, J=7.8 Hz, 2H), 7.53 (t, J=7.0 Hz, 2H), 7.48 (d, J=7.6 Hz, 1H), 7.33 (d, J=7.3 Hz, 1H), 7.24 (d, J=2.0 Hz, 1H), 7.21 (td, J=7.5, 1.0 Hz, 1H), 7.03 (t, J=7.5 Hz, 1H), 6.98 (t, J=7.4 Hz, 1H), 1.22 (s, 9H).

Preparation of [Ir(L5)(CO)Cl]

[Ir(L5)(CO)Cl] was prepared following the procedure described for [Ir(L2)(CO)Cl] replacing L2 with L5. $^1$H NMR (400 MHz, Chloroform-d) δ 9.38 (d, J=5.1 Hz, 1H), 8.25 (d, J=7.2 Hz, 1H), 8.02 (t, J=8.2 Hz, 2H), 7.88 (d, J=7.0 Hz, 1H), 7.82 (td, J=7.9, 1.6 Hz, 1H), 7.77-7.64 (m, 3H), 7.64-7.52 (m, 3H), 7.39 (d, J=7.0 Hz, 1H), 7.35-7.29 (m, 1H), 7.05 (t, J=7.5 Hz, 1H), 6.61-6.52 (m, 1H). $^{19}$F NMR (377 MHZ, $CDCl_3$) δ=−106.7, −108.6.

Preparation of [Ir(L4)(MeCN)Cl]

[Ir(L4)(MeCN)Cl] was prepared following the procedure described for [Ir(L1)(MeCN)Cl] replacing [Ir(L1)(CO)Cl] with [Ir(L4)(CO)Cl].

$^1$H NMR (400 MHZ, $CDCl_3$) δ 9.24 (d, J=6.0 Hz, 1H), 8.22 (d, J=7.4 Hz, 1H), 8.05 (d, J=7.5 Hz, 1H), 7.99 (d, J=1.9 Hz, 1H), 7.86 (d, J=7.0 Hz, 1H), 7.73-7.57 (m, 6H), 7.53-7.49 (m, 1H), 7.33 (d, J=7.4 Hz, 1H), 7.25-7.20 (m, 2H), 7.07 (t, J=7.6 Hz, 1H), 6.99 (dd, J=8.5, 6.3 Hz, 1H), 2.01 (s, 3H), 1.22 (s, 9H).

Preparation of [Ir(L5)(MeCN)Cl]

[Ir(L5) (MeCN)Cl] was prepared following the procedure described for [Ir(L1) (MeCN)Cl] replacing [Ir(L1) (CO)Cl] with [Ir(L5)(CO)Cl].

$^1$H NMR (500 MHZ, $CDCl_3$) δ 9.30 (d, J=5.1 Hz, 1H), 8.26 (d, J=7.1 Hz, 1H), 7.91 (d, J=8.0 Hz, 1H), 7.84 (d, J=6.0 Hz, 2H), 7.72 (t, J=7.9 Hz, 1H), 7.65 (dt, J=23.5, 7.4 Hz, 2H), 7.53 (t, J=7.9 Hz, 1H), 7.48 (d, J=7.7 Hz, 2H), 7.41 (d, J=6.6 Hz, 1H), 7.28-7.25 (m, 2H), 6.98 (t, J=7.4 Hz, 1H), 6.48 (t, J=10.1 Hz, 1H), 2.80 (s, 3H).

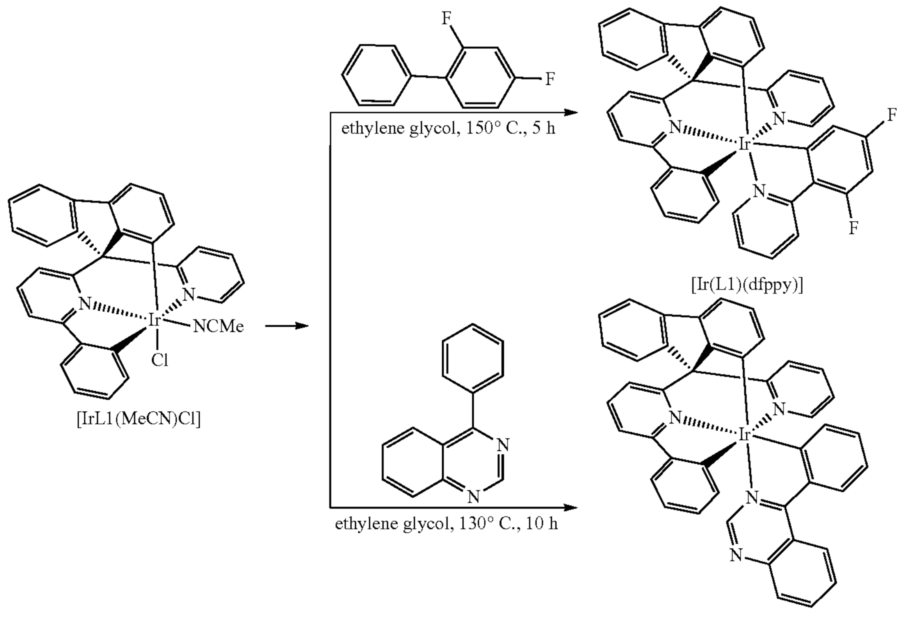

[IrL1(MeCN)Cl]

[Ir(L1)(dfppy)]

[Ir(L1)(mpq)]

Preparation of [Ir(L1)(dfppy)]

[Ir(L1) (MeCN)Cl] (30 mg, 0.045 mmol), 2-(2,4-difluorophenyl)pyridine (dfppy) (26 mg, 0.0136 mmol) were stirred in 4 mL ethylene glycol at 120° C. under Ar atmosphere overnight. After cooling to room temperature, the mixture was washed with water and extracted with DCM, dried over $MgSO_4$. The solvent was removed under reduced pressure and the residue was purified by silica gel column chromatography with Hex/DCM=1:1 as eluent to afford yellow-green solid [Ir(L1) (dfppy)] (20 mg, 57%). 1H NMR (400 MHz, $CD_2Cl_2$) δ 8.36 (t, J=8.3 Hz, 2H), 8.07 (d, J=7.8 Hz, 1H), 8.00 (dd, J=7.2, 1.1 Hz, 1H), 7.93-7.82 (m, 3H), 7.77-7.63 (m, 5H), 7.63-7.56 (m, 2H), 7.47 (d, J=4.7 Hz, 1H), 7.32 (d, J=7.4 Hz, 1H), 7.08 (t, J=7.4 Hz, 1H), 6.82 (ddd, J=7.0, 5.6, 1.1 Hz, 1H), 6.78-6.66 (m, 2H), 6.46 (dd, J=8.9, 2.4 Hz, 1H), 6.29-6.20 (m, 1H). 19F NMR (377 MHz, $CDCl_3$) δ=−110.1, −111.0.

Preparation of [Ir(L1)(mpq)]

[Ir(L1)(MeCN)Cl] (21 mg, 0.032 mmol), 4-phenylquinazoline (mpq) (13 mg, 0.10 mmol) were stirred in 4 mL ethylene glycol at 130° C. under Ar atmosphere overnight. After cooling to room temperature, the mixture was washed with water and extracted with DCM, dried over $MgSO_4$. The solvent was removed under reduced pressure and the residue was purified by silica gel column chromatography with Hex/DCM=2:3 as eluent to afford yellow-green solid [Ir(L1) (mpq)] (15 mg, 60%). 1H NMR (500 MHz, $CD_2Cl_2$) δ 8.99 (d, J=8.4 Hz, 1H), 8.61 (d, J=7.9 Hz, 1H), 8.56 (d, J=7.3 Hz, 1H), 8.41 (d, J=7.4 Hz, 1H), 8.09 (d, J=8.1 Hz, 1H), 8.07 (s, 1H), 7.99 (d, J=7.3 Hz, 1H), 7.89 (d, J=7.4 Hz, 2H), 7.83 (t, J=7.5 Hz, 1H), 7.81-7.76 (m, 1H), 7.73-7.61 (m, 5H), 7.58-7.53 (m, 1H), 7.50-7.44 (m, 2H), 7.36-7.28 (m, 3H), 7.06 (t, J=7.4 Hz, 1H), 6.95-6.90 (m, 1H), 6.74-6.65 (m, 2H), 6.66-6.61 (m, 1H).

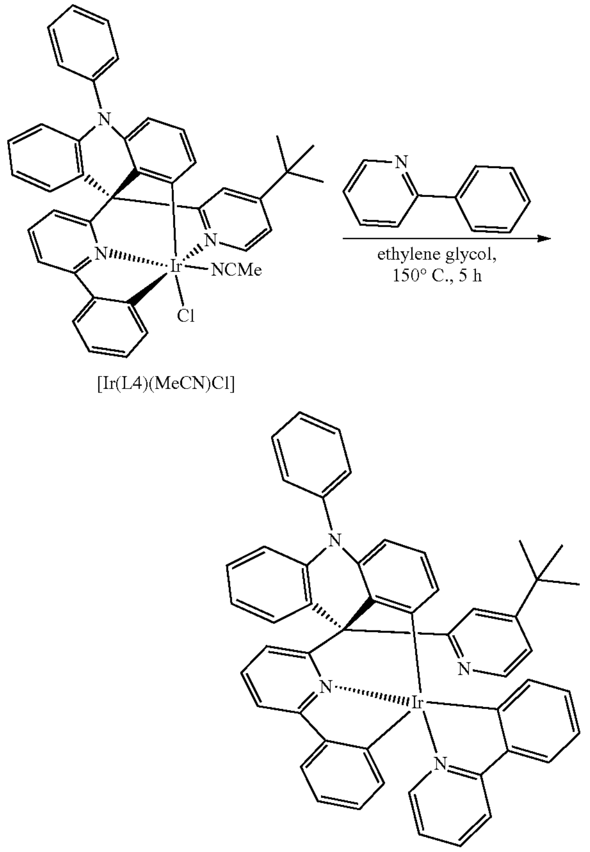

[Ir(L4)(MeCN)Cl]

[Ir(L4)(ppy)]

Preparation of [Ir(L4)(ppy)]

[Ir(L4) (ppy)] was prepared following the procedure described for [Ir(L1)(dfppy)] replacing [Ir(L1)(MeCN)Cl] and dfppy with [Ir(L1)(MeCN)Cl] and ppy.

$^{1}$H NMR (500 MHz, $CD_2Cl_2$) δ 8.26 (d, J=7.4 Hz, 1H), 8.23 (d, J=7.0 Hz, 1H), 7.95 (d, J=1.8 Hz, 1H), 7.83 (dd, J=11.9, 6.9 Hz, 3H), 7.76 (d, J=7.2 Hz, 1H), 7.57 (dt, J=7.4, 3.8 Hz, 1H), 7.55-7.42 (m, 5H), 7.40-7.31 (m, 3H), 7.16 (d, J=7.2 Hz, 1H), 7.12 (td, J=7.3, 1.3 Hz, 1H), 7.08 (dd, J=10.5, 4.2 Hz, 1H), 6.90 (t, J=7.3 Hz, 1H), 6.82 (dd, J=7.3, 1.3 Hz, 1H), 6.65-6.59 (m, 2H), 6.59-6.53 (m, 1H), 1.00 (s, 9H).

TABLE 1

Photophysical properties of Ir(III) complexes

| Emitter | Medium | $\lambda_{abs}$/nm ($\varepsilon$/×$10^3$ $mol^{-1}$ $dm^3$ $cm^{-1}$) | $\lambda_{max}$/nm ($\Phi$; $\tau$/μs) | $k_r$/ ×$10^5$ $s^{-1}$ | $k_{nr}$/ ×$10^5$ $s^{-1}$ |
|---|---|---|---|---|---|
| Ir(L1) (dfppy) | Toluene | 291 (29.9), 346 (8.96), 382 (7.5), 394.1 (7.39) | 533 (0.82, 1.7) | 4.8 | 1.1 |
| | 5% in PMMA | | 534 (0.79, 1.6) | 4.9 | 1.3 |

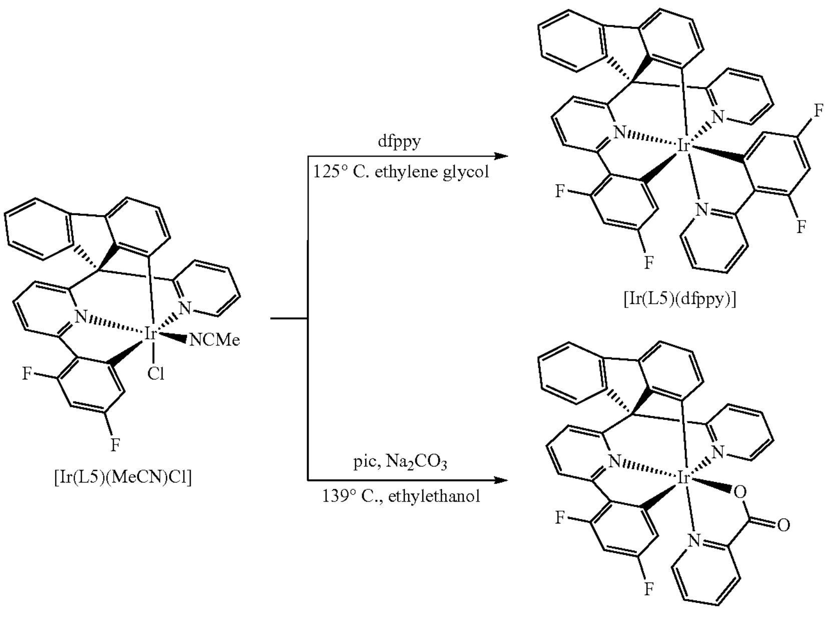

[Ir(L5)(MeCN)Cl]

[Ir(L5)(dfppy)]

[Ir(L5)(pic)]

[Ir(L5) (dfppy)] was prepared following the procedure described for [Ir(L1)(dfppy)] replacing [Ir(L1)(MeCN)Cl] with [Ir(L5)(MeCN)Cl]. $^{1}$H NMR (400 MHz, $CD_2Cl_2$) δ 8.36 (t, J=8.3 Hz, 2H), 8.07 (d, J=7.8 Hz, 1H), 8.00 (dd, J=7.2, 1.1 Hz, 1H), 7.93-7.82 (m, 3H), 7.77-7.63 (m, 5H), 7.63-7.56 (m, 2H), 7.47 (d, J=4.7 Hz, 1H), 7.32 (d, J=7.4 Hz, 1H), 7.08 (t, J=7.4 Hz, 1H), 6.82 (ddd, J=7.0, 5.6, 1.1 Hz, 1H), 6.78-6.66 (m, 2H), 6.46 (dd, J=8.9, 2.4 Hz, 1H), 6.29-6.20 (m, 1H).

[Ir(L5)(pic)] was prepared following the procedure described for [Ir(L1)(pic)] replacing [Ir(L1)(MeCN)Cl] with [Ir(L5)(MeCN)Cl]. $^{1}$H NMR (500 MHz, $CD_2Cl_2$) δ 8.35 (t, J=5.4 Hz, 1H), 8.29 (t, J=5.4 Hz, 1H), 7.98 (dd, J=8.2, 3.5 Hz, 1H), 7.95 (t, J=4.4 Hz, 1H), 7.92 (td, J=7.8, 1.4 Hz, 1H), 7.88 (dd, J=8.2, 2.2 Hz, 1H), 7.75-7.63 (m, 1H), 7.58-7.54 (m, 1H), 7.32-7.22 (m, 1H), 7.04 (dt, J=5.6, 2.1 Hz, 1H), 7.00 (t, J=7.4 Hz, 1H), 6.40 (ddd, J=11.8, 7.2, 2.5 Hz, 1H). $^{19}$F NMR (377 MHz, $CDCl_3$) δ=−105.8, −111.0.

TABLE 1-continued

Photophysical properties of Ir(III) complexes

| Emitter | Medium | $\lambda_{abs}$/nm ($\varepsilon$/×$10^3$ $mol^{-1}$ $dm^3$ $cm^{-1}$) | $\lambda_{max}$/nm ($\Phi$; $\tau$/μs) | $k_r$/ ×$10^5$ $s^{-1}$ | $k_{nr}$/ ×$10^5$ $s^{-1}$ |
|---|---|---|---|---|---|
| | 5% MCP | | 539 (0.83, 1.4) | 5.9 | 1.2 |
| | 77K 2-MeTHF | | 509(5.5), 540 (sh) | — | — |
| Ir(L1) (acac) | $CH_2Cl_2$ | 255 (38.0), 288 (36.0), 336 (8.7), 387 (5.7), 462(br) (1.0), 499 (0.5) | 567 (0.673; 3.4) | 2.0 | 1.0 |
| | Toluene | 292 (13.2), 342 (4.1), 397 (2.9) | 550 (0.61, 2.9) | 2.1 | 1.3 |
| | 5% in PMMA | | 551 (0.31, 2.6) | 1.2 | 2.7 |
| Ir(L1) (acac-tBu) | $CH_2Cl_2$ | 258 (37.7), 345 (8.1), 398 (4.1) | 567 (0.62; 3.8) | 1.6 | 1 |
| | Toluene | 292 (23.4), 353 (7.7), 400 (5.5) | 551 (0.7; 3.2) | 2.2 | 0.9 |
| | 5% in PMMA | | 554 (0.68; 2.1) | 3.2 | 1.5 |
| | 5% MCP | | 553 (0.53; 2.3) | 2.3 | 2 |

TABLE 1-continued

| Photophysical properties of Ir(III) complexes | | | | | |
|---|---|---|---|---|---|
| Emitter | Medium | $\lambda_{abs}$/nm ($\varepsilon$/×$10^3$ $mol^{-1}$ $dm^3$ $cm^{-1}$) | $\lambda_{max}$/nm ($\Phi$; $\tau$/μs) | $k_r$/ ×$10^5$ $s^{-1}$ | $k_{nr}$/ ×$10^5$ $s^{-1}$ |
| | 77K 2-MeTHF | | 527 (13.5), 563 (sh) | | |
| Ir(L1) (acac-mes) | Toluene | 290 (34.0), 344 (10.0), 397 (6.8) | 528 (0.06, 0.27) | 2.2 | 34.8 |
| | 5% in PMMA | | 535 (0.37, 1.3) | 2.8 | 4.8 |
| | 77K 2-MeTHF | | 515(9.0), 555(sh) | | |
| Ir(L1) (piq) | $CH_2Cl_2$ | 278 (34.7), 331 (14.6), 349 (12), 409 (10.2), 465 (4.1) | 647(0.48; 2.0) | 2.4 | 2.6 |
| | Toluene | 291 (29.1), 335 (14.2), 349 (11.9), 420 (9.0) 474 (3.2) | 630 (0.52; 2.1) | 2.5 | 2.3 |
| | 5% in PMMA | | 627 (0.46, 1.5) | 3.1 | 3.6 |
| | 77K 2-MeTHF | | 603 (3.0), 650 | | |
| Ir(L1) (dpfiq) | $CH_2Cl_2$ | 273 (40.4), 335 (29.3), 421 (9.6), 475 (5.3) | 650 (0.45; 1.6) | 2.4 | 3.4 |
| | Toluene | 297 (39.0), 338 (30.6), 360 (18.0), 428 (9.8) 474 (4.3) | 641 (0.50, 1.8) | 2.8 | 2.8 |
| | 5% in PMMA | | 640 (0.38, 1.4) | 2.7 | 4.4 |
| | 5% in MCP | | 647 (0.38, 1.1) | 3.5 | 5.6 |
| Ir(L1) (mpq) | $CH_2Cl_2$ | 250 (49.1), 339 (17.6), 353 (13,2), 454 (7.2), 483 (5.1) | 719 (0.05; 0.17) | 2.9 | 55.8 |
| | Toluene | 291 (33.1), 340 (18.0) 352 (13.8), 460 (7.5), 488 (5.4) | 694 (0.13; 0.33) | 3.9 | 26.4 |
| | 5% in PMMA | | 681 (0.21; 0.45) | 4.7 | 17.5 |
| | 5% in MCP | | 690 (0.31; 0.70) | 4.4 | 9.8 |
| Ir(L2) (acac) | 5% PMMA | | 560 (0.50, 2.4) | 2.1 | 2.1 |
| Ir(L3) (acac) | $CH_2Cl_2$ | 299 (31.8), 349 (11.5), 383 (10.0) | 570(0.68, 3.4) | 2 | 0.94 |
| | 5% in PMMA | | 564 (0.60; 3.3) | 1.8 | 1.2 |
| | 77K MeTHF | | 528(11.5), 564 | | |
| Ir(L4) (ppy) | $CH_2Cl_2$ | 282 (34.0), 355 (8.4), 386 (8.5) | 565 (0.69; 1.86) | 3.7 | 1.66 |
| | Toluene | 292 (30.0), 357 (8.8), 393 (8.9) | 550 (0.73; 1.66) | 4.4 | 1.63 |
| | 5% in PMMA | | 555 (0.76; 1.65) | 4.6 | 1.45 |
| | 77K 2-MeTHF | | 525 (6.0); 550 | | |
| Ir(L5) (dfppy) | $CH_2Cl_2$ | 278 (40.9), 335 (10.7), 369 (8.8) | 524 (0.75; 2.3) | 3.3 | 1.1 |
| | Toluene | 288 (39.0), 339 (11.2), 373 (9.2), 383 (8.6) | 518 (0.70; 1.8) | 3.9 | 1.7 |
| | 5% in PMMA | | 528 (0.91; 2.2) | 4.1 | 0.41 |
| | 5% in MCP | | 522 (0.88; 1.8) | 4.9 | 0.67 |
| | 77K 2-MeTHF | | 492 (5.1), 520(sh) | | |
| Ir(L5) (pic) | $CH_2Cl_2$ | 250 (49.1), 339 (17.6), 353 (13,2), 454 (7.2), 483 (5.1) | 719 (0.05; 0.17) | 2.9 | 55.8 |
| | Toluene | 291 (33.1), 340 (18.0) 352 (13.8), 460 (7.5), 488 (5.4) | 694 (0.13; 0.33) | 3.9 | 26.4 |
| | 5% in PMMA | | 681 (0.21; 0.45) | 4.7 | 17.5 |
| | 5% in MCP | | 690 (0.31; 0.70) | 4.4 | 9.8 |

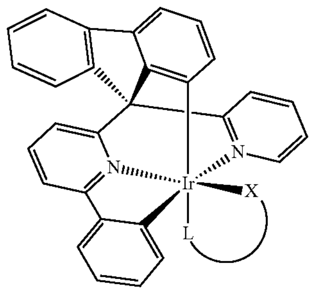

Ir(L1)L^X

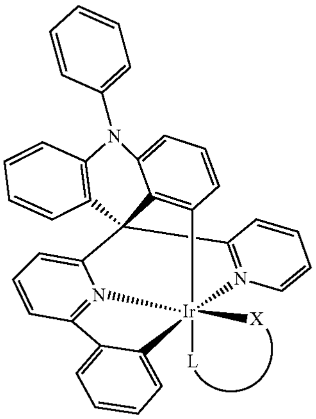

Ir(L2)L^X

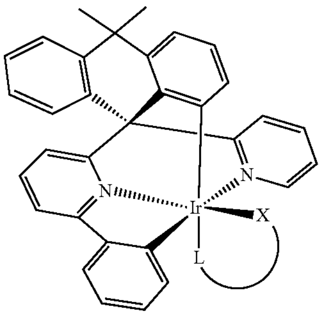

Ir(L3)L^X

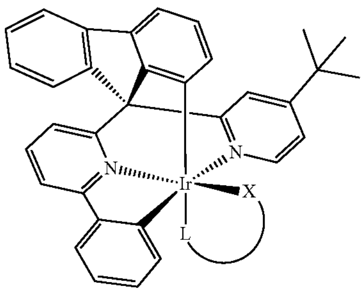

Ir(L4)L^X

-continued

Ir(L5)L^X

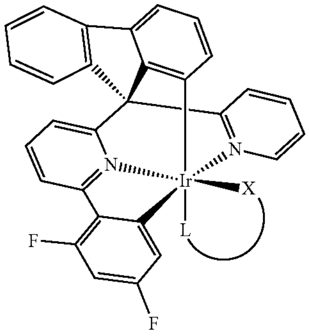

 = 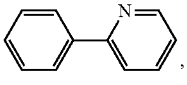 , 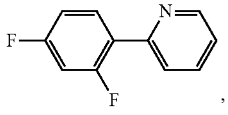 , ppy dfppy

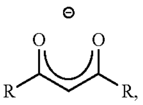

acac acac (R = Me)

acac-tBu, (R = tBu)

acac-mes, (R = mes)

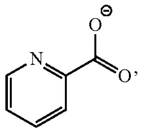

pic

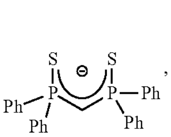 ,

SPN

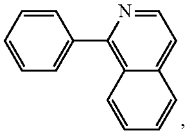 , 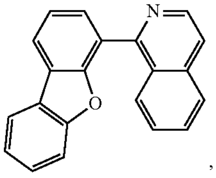 , piq dpfiq

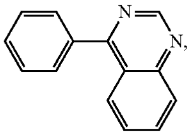

mpq

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

While the invention is explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. An iridium containing emitter, comprising:

a coordination complex with an octahedral coordination geometry comprising a central iridium atom and a tetradentate cyclometalated ligands including at least one spiro linkage and a bidentate ligand, the iridium containing emitter comprising a general structure of

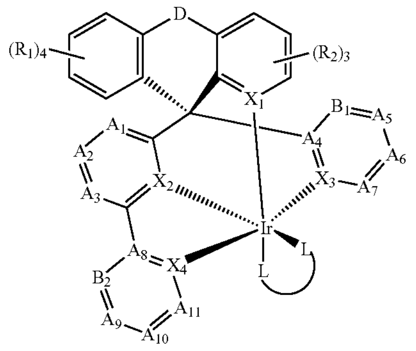

wherein each $R_1$, $R_2$ in $(R_1)_4$ and $(R_2)_3$, respectively, independently represents hydrogen, optionally substituted $C_1$-$C_4$ alkyl, optionally substituted aryl, heteroaryl, halogen, acyl, alkoxy, acyloxy, amino, nitro, acylamino, aralkyl, cyano, carboxyl, thiol, styryl, aminocarbonyl, carbamoyl, aryloxycarbonyl, phenoxycarbonyl, or an alkoxycarbonyl group; each pair of adjacent R groups in $(R_1)_4$, and $(R_2)_3$ can independently form 5-8 member ring(s);

D represents a C—C bond, O, S, $NR_{3a}$, $C(R_{3b})(R_{3b})$, wherein each of $R_{3a}$ and $R_{3b}$ independently represents hydrogen, optionally substituted phenyl, heteroaryl or optionally substituted $C_1$-$C_4$ alkyl; each pair of adjacent R groups in $R_{3a}$ and $R_{3b}$ can independently form 5-8 member ring(s);

wherein each $A_1$-$A_{11}$, $B_1$ and $B_2$ independently represents N, O, S, C, $NR_{4a}$, $C(R_{4b})(R_{4b})$, wherein each of $R_{4a}$ and $R_{4b}$ independently represents hydrogen or optionally substituted $C_1$-$C_4$ alkyl, optionally substituted aryl, heteroaryl, halogen, acyl, alkoxy, acyloxy, amino, nitro, acylamino, aralkyl, cyano, carboxyl, thiol, styryl, aminocarbonyl, carbamoyl, aryloxycarbonyl, phenoxycarbonyl, or an alkoxycarbonyl group; each pair of adjacent R groups in $R_{4a}$ and $R_{4b}$ can independently form 5-8 member ring(s);

wherein $B_1$ or $B_2$ can be absent and in this case the carbocyclic or heterocyclic group is a 5-member ring;

wherein $X_1$—$X_4$ independently represents C or N and at least one of $X_1$—$X_4$ is C; and L^L is a bidentate ligand; wherein each L in L^L represents a phenyl, naphthalenyl, dibenzofuranyl, pyridinyl, pyrimidyl, pyrazolyl, quinazolinyl, quinolinyl, isoquinolinyl, imidazolyl, triazolyl, thiophenyl, benzothiazolyl, or benzimidazolyl moiety, which are optionally substituted with halogen, $C_1$-$C_4$ alkyl or $C_1$-$C_4$ haloalkyl; or L^L represents an acetylacetonyl, 2,2,6,6-tetramethylheptane-3,5-dionyl, phenyl-substituted β-ketoiminate, phenyl-substituted β-diketiminate, picolinate or tetraphenyldithioimidodiphosphinate moiety.

2. An iridium containing emitter, comprising:

a coordination complex with an octahedral coordination geometry comprising a central iridium atom and a tetradentate cyclometalated ligands including at least one spiro linkage and a bidentate ligand, the iridium containing emitter comprising a general structure of

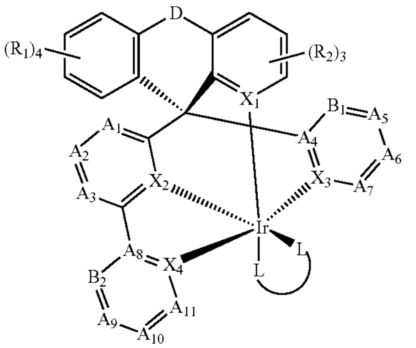

wherein each $R_1$, $R_2$ in $(R_1)_4$ and $(R_2)_3$, respectively, independently represents hydrogen, optionally substituted $C_1$-$C_4$ alkyl, optionally substituted aryl, heteroaryl, halogen, acyl, alkoxy, acyloxy, amino, nitro, acylamino, aralkyl, cyano, carboxyl, thiol, styryl, aminocarbonyl, carbamoyl, aryloxycarbonyl, phenoxycarbonyl, or an alkoxycarbonyl group; each pair of adjacent R groups in $(R_1)_4$, and $(R_2)_3$ can independently form 5-8 member ring(s);

D represents a C—C bond, O, S, $NR_{3a}$, $CR_{3b}$, wherein each of $R_{3a}$ and $R_{3b}$ independently represents hydrogen, optionally substituted phenyl, heteroaryl or optionally substituted $C_1$-$C_4$ alkyl;

wherein each $A_1$-$A_{10}$, $B_1$ and $B_2$ independently represents N, O, S, C, $NR_{4a}$, $CR_{4b}$, wherein each of $R_{4a}$ and $R_{4b}$ independently represents hydrogen or optionally substituted $C_1$-$C_4$ alkyl, optionally substituted aryl, heteroaryl, halogen, acyl, alkoxy, acyloxy, amino, nitro, acylamino, aralkyl, cyano, carboxyl, thiol, styryl, aminocarbonyl, carbamoyl, aryloxycarbonyl, phenoxycarbonyl, or an alkoxycarbonyl group; each pair of adjacent R groups in $R_{4a}$ and $R_{4b}$ can independently form 5-8 member ring(s);

wherein $B_1$ or $B_2$ can be absent and in this case the carbocyclic or heterocyclic group is a 5-member ring;

wherein $X_1$—$X_4$ independently represents C or N and at least one of $X_1$—$X_4$ is C; and L^L is a bidentate ligand; L in L^L represents a phenyl, dibenzofuranyl, pyridinyl, isoquinolinyl, imidazolylidene or benimidazolylidene moiety, or L^L represents an acetylacetonyl, 2,2,6,6-tetramethylheptane-3,5-dionyl, picolinate or tetraphenyldithioimidodiphosphinate moiety.

3. The iridium containing emitter according to claim 1, wherein $R_1$ and $R_2$ are hydrogen, $X_1$ is carbon and D is a C—C bond, O, S, NPh or $C(Me)_2$.

4. The iridium containing emitter according to claim 1, wherein $A_1$-$A_{11}$ and $B_1$ and $B_2$ are C or $CR_{4b}$, and $X_2$ and $X_3$ are N.

5. The iridium containing emitter according to claim 1, wherein the bidentate ligand L^L is selected from 2-phenylpyridine, 1-phenylisoquinoline, acetylacetonate, 2-(2,4-difluorophenyl)pyridine, 2,2,6,6-tetramethylheptane-3,5-dionate, 1,3-dimesitylpropane-1,3-dione, tetraphenyldithioimidodiphosphinate, phenyl-substituted β-ketoiminate, phenyl-substituted β-diketiminate, 1-(dibenzo[b,d]furan-4-yl) isoquinoline, 4-phenylquinazoline, 2-phenylimidazolylidene or picolinic acid.

6. The iridium containing emitter according to claim 1, which is selected from the general structures:

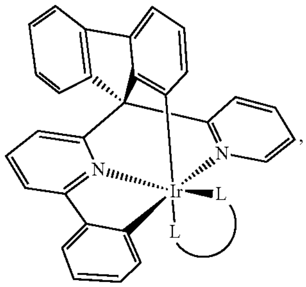
,

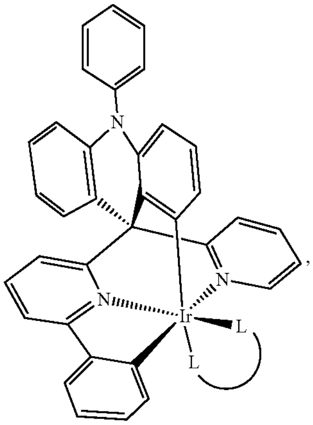
,

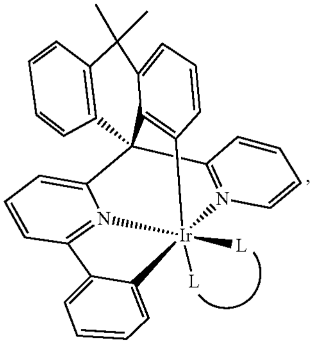
,

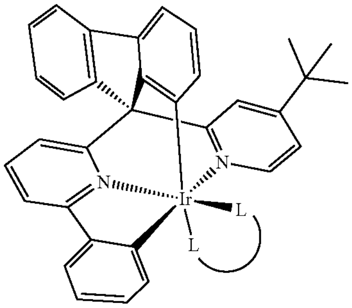
,

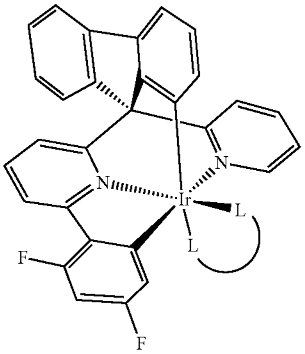
,

-continued
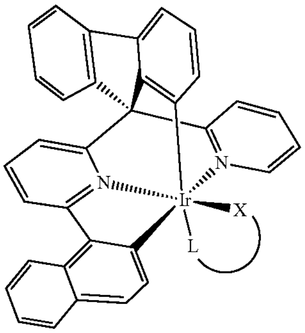
,
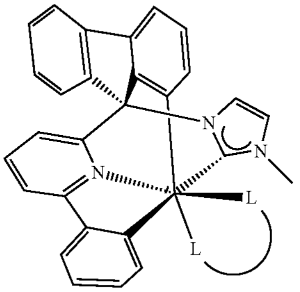
,
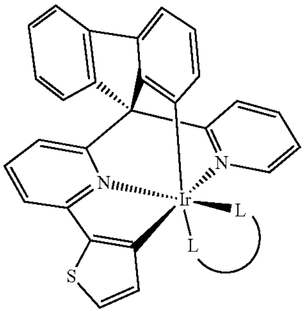
,
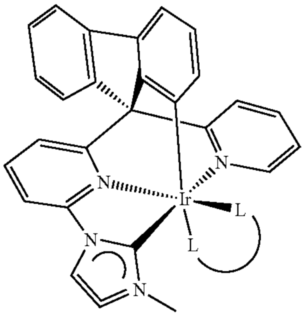
,
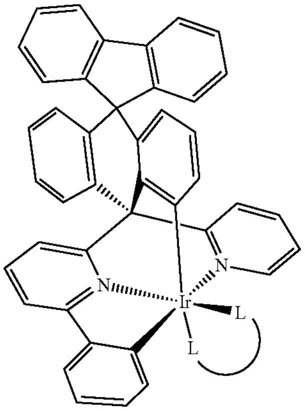
,
-continued
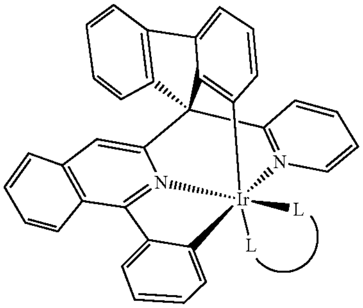
,
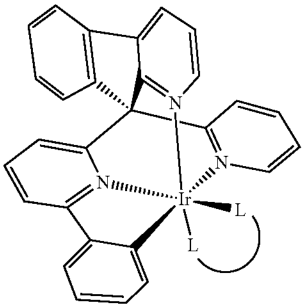
,
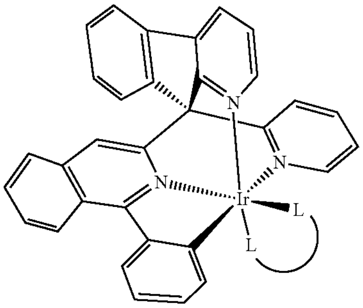
,
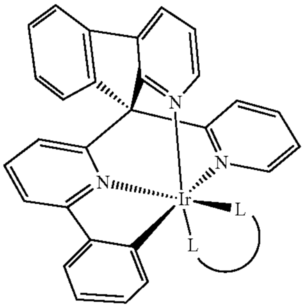
,
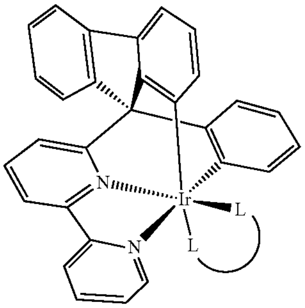
, -continued
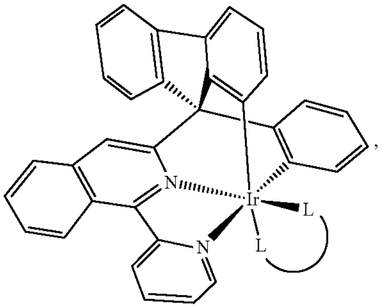
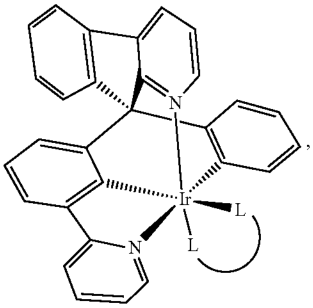
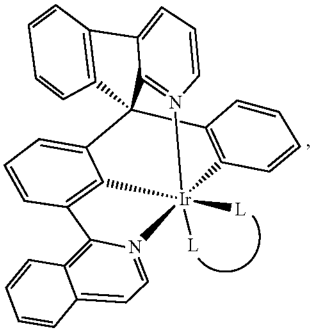
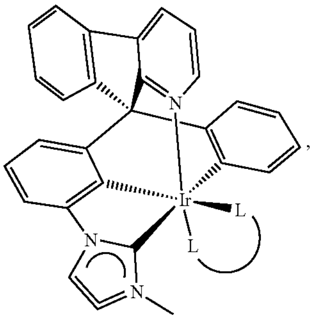
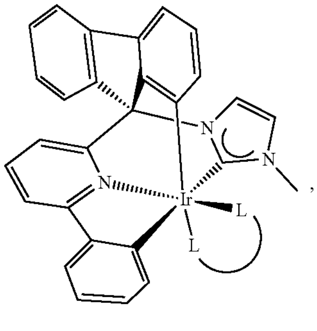
-continued
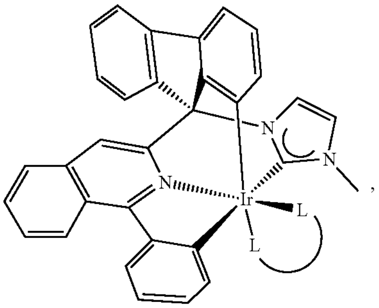
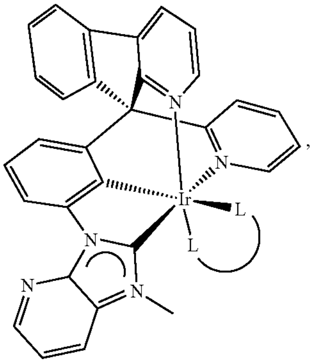
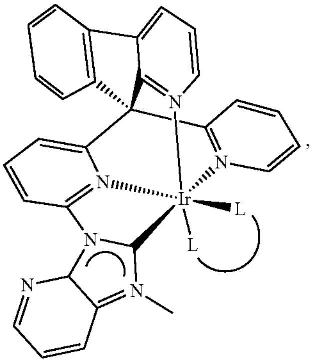
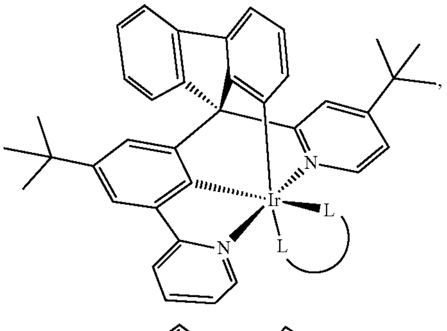
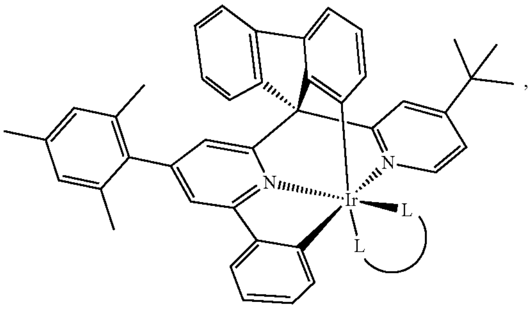

-continued
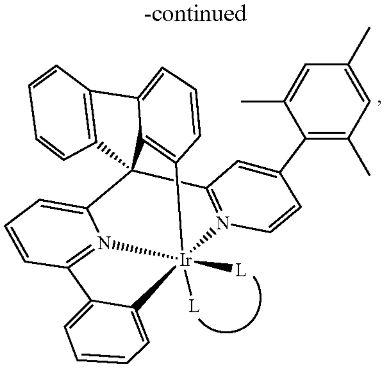
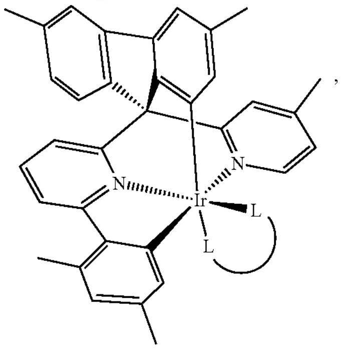
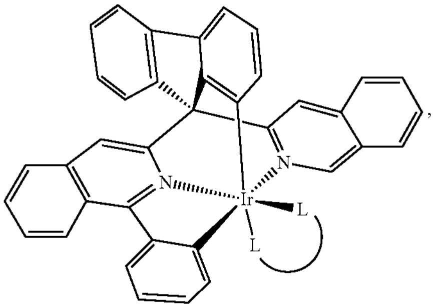
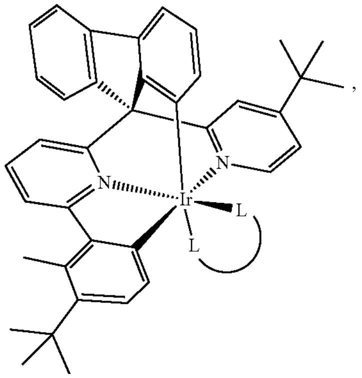
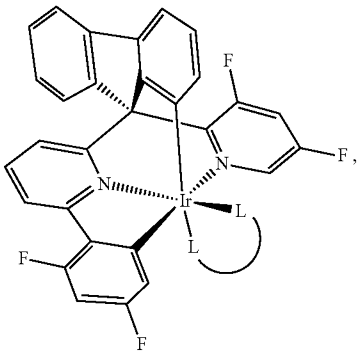
-continued
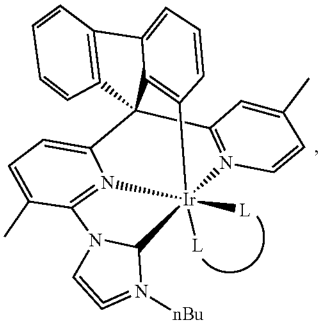
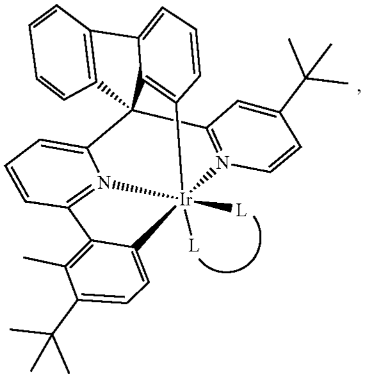
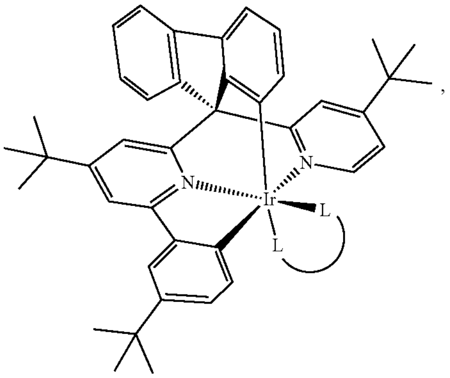
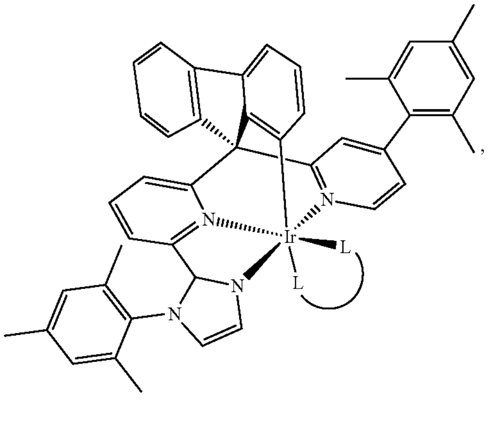

-continued
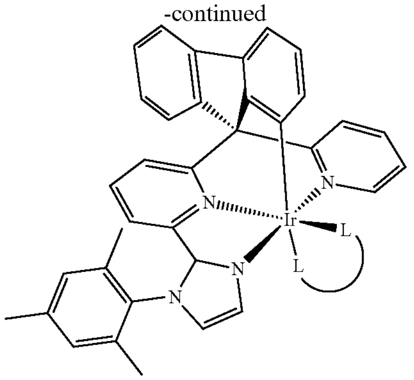
,
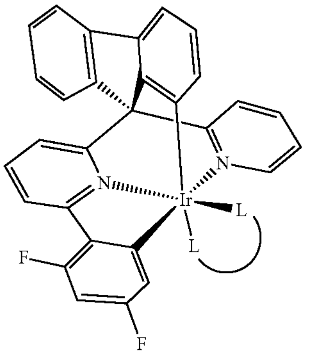
,
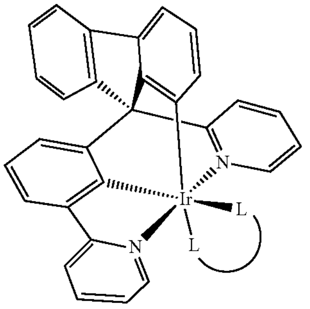
,
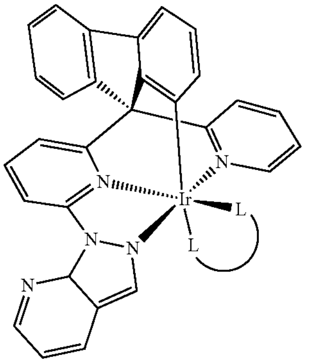
,
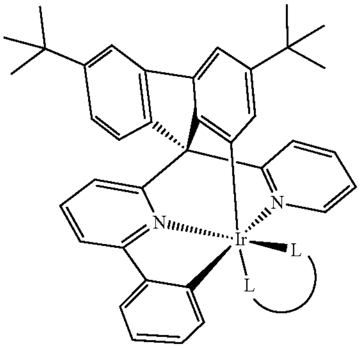
,
-continued
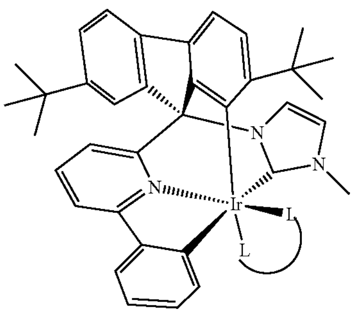
,
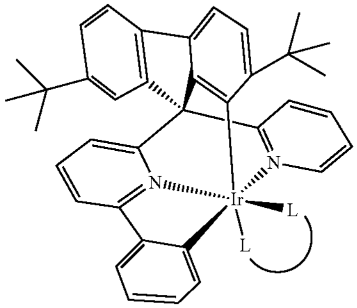
,
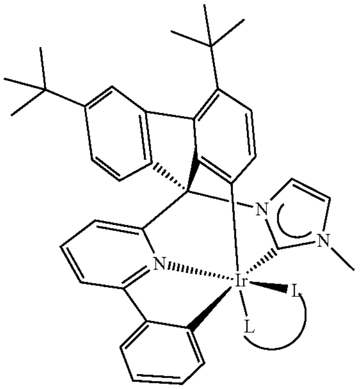
,
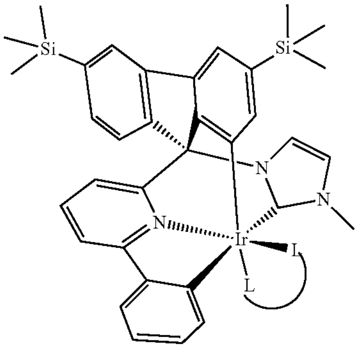
,
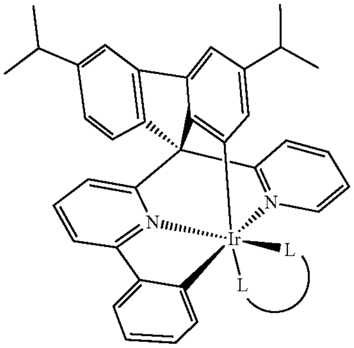
, -continued
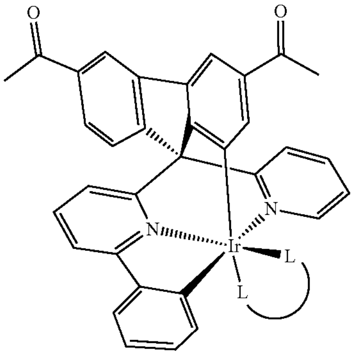
,
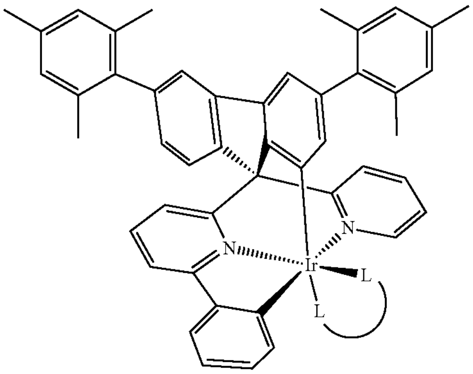
,
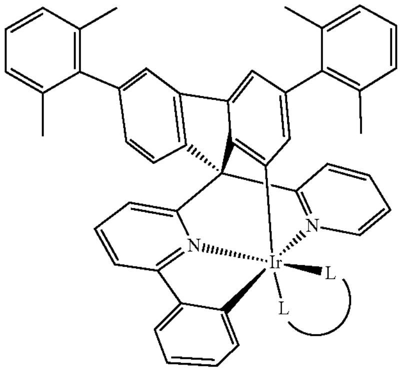
,
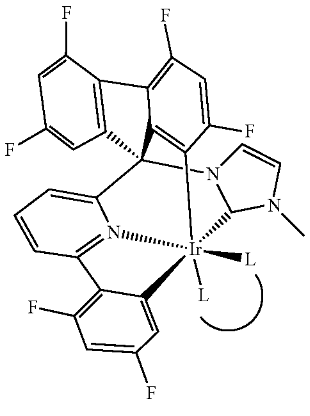
,
-continued
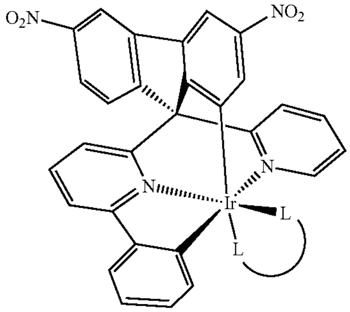
,
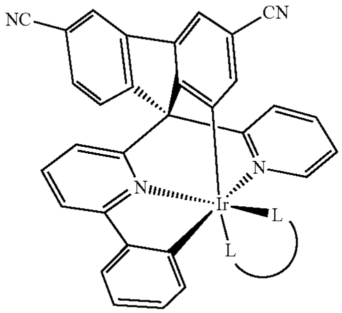
,
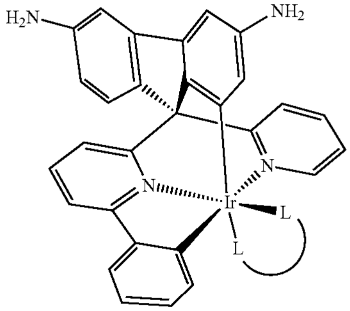
,
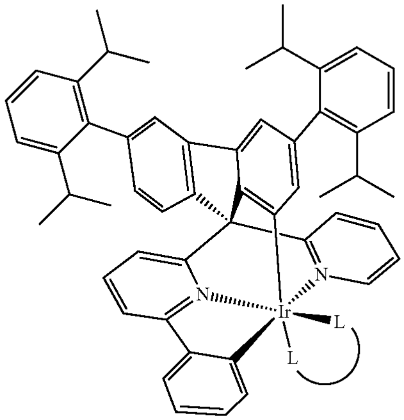
,
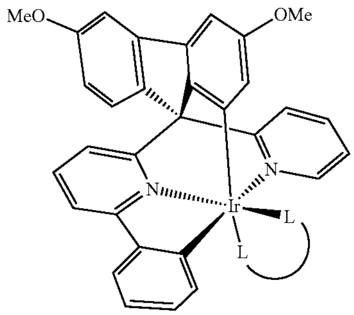
, -continued
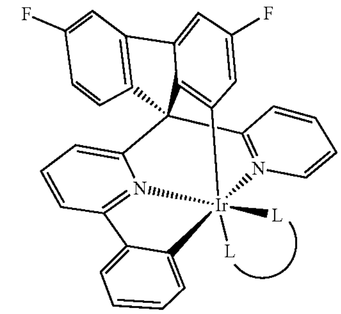
,
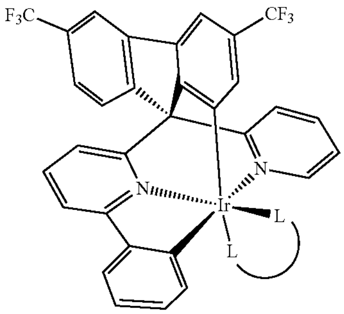
,
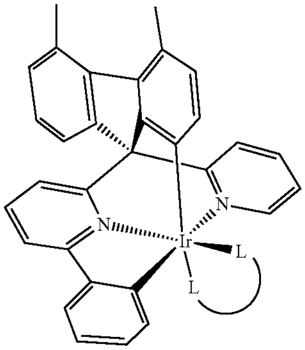
,
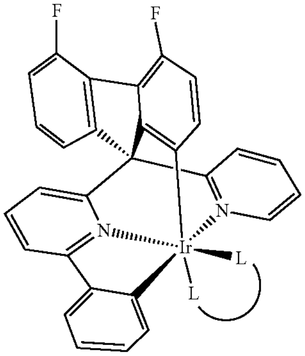
,
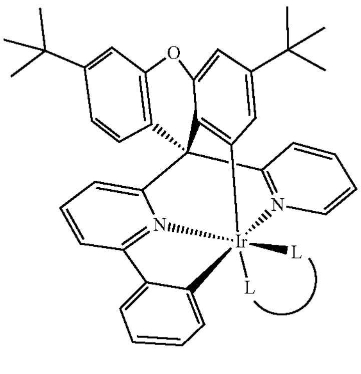
,
-continued
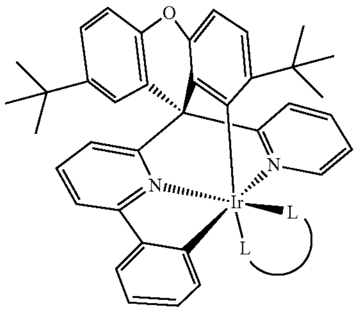
,
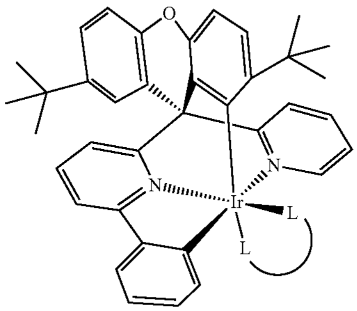
,
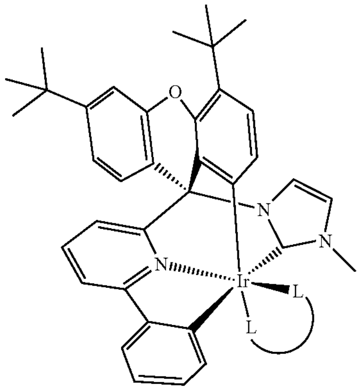
,
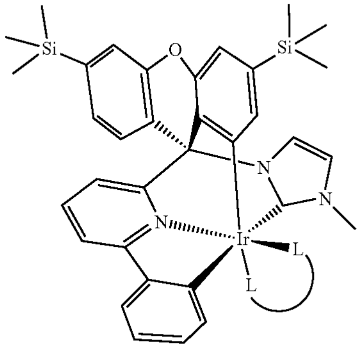
,
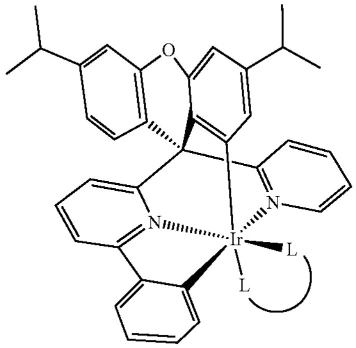
, -continued
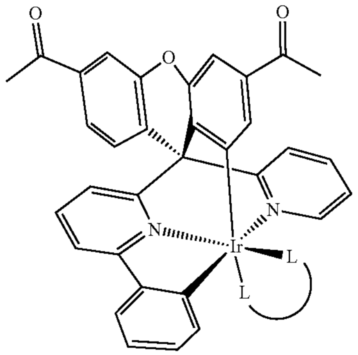
,
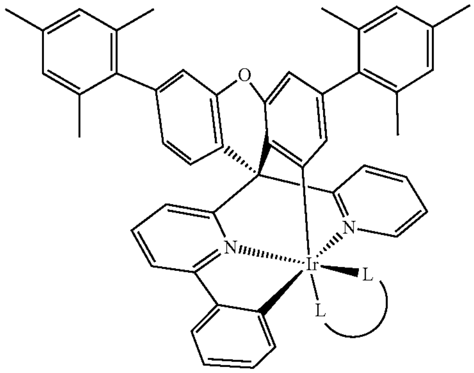
,
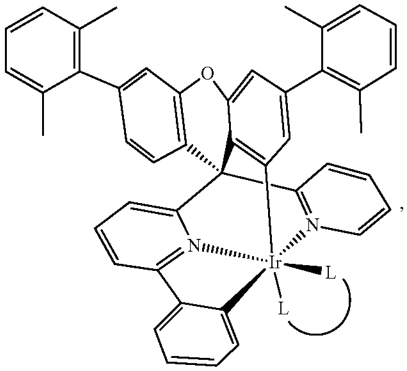
,
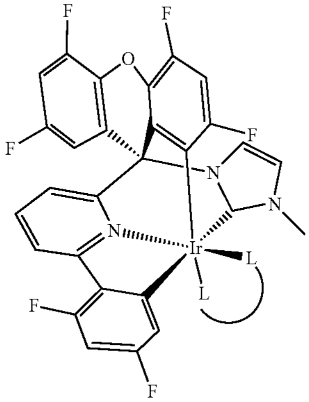
,
-continued
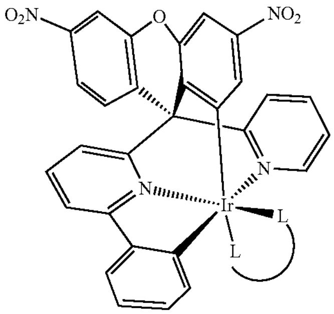
,
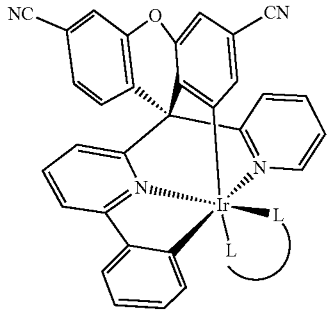
,
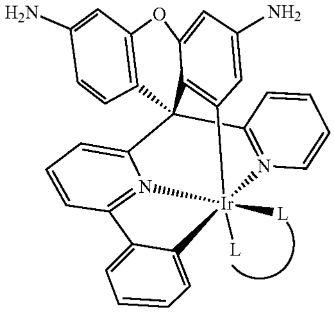
,
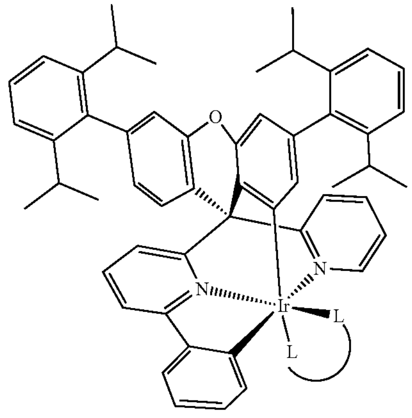
,
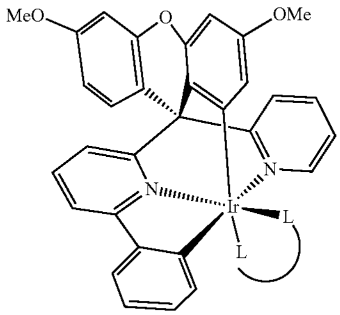
, -continued
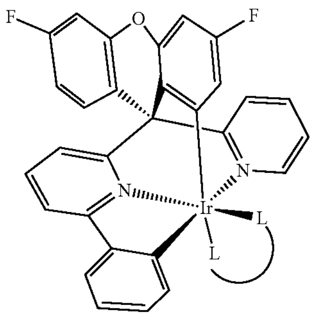
,
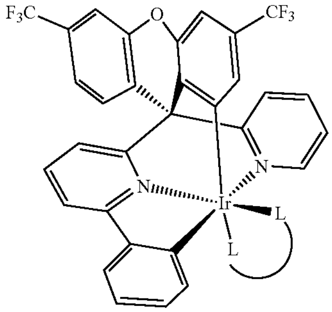
,
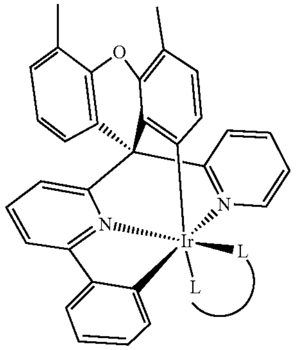
,
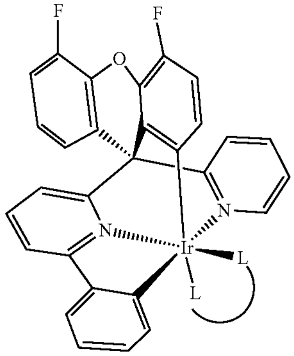
,
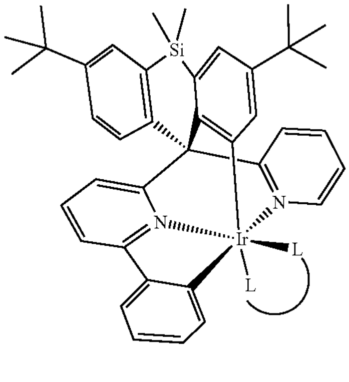
,
-continued
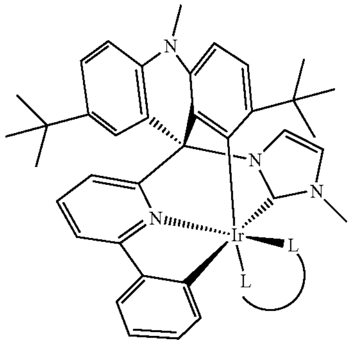
,
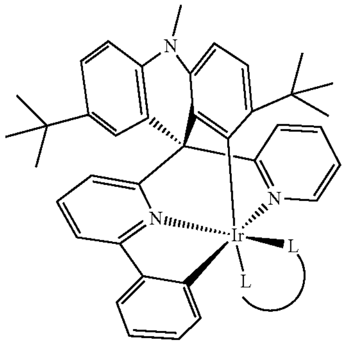
,
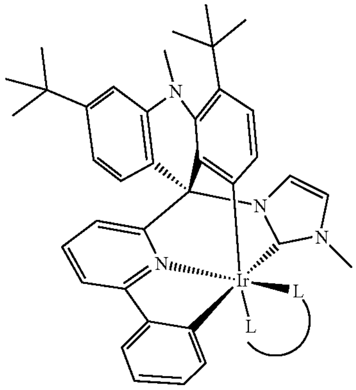
,
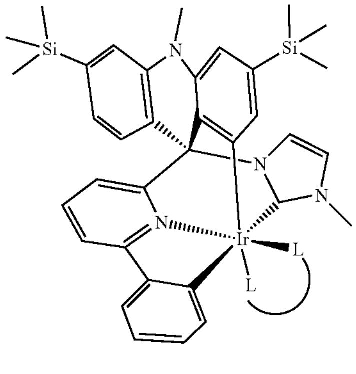
, -continued
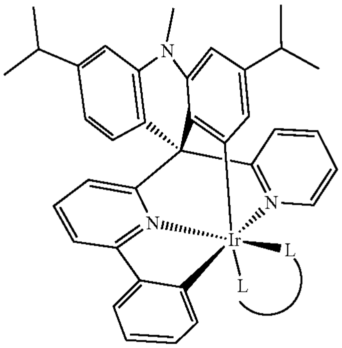
,
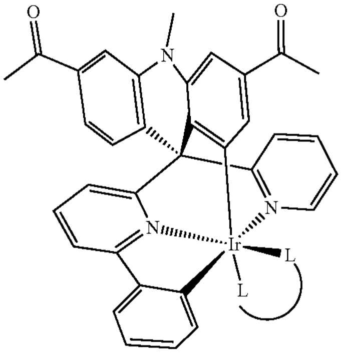
,
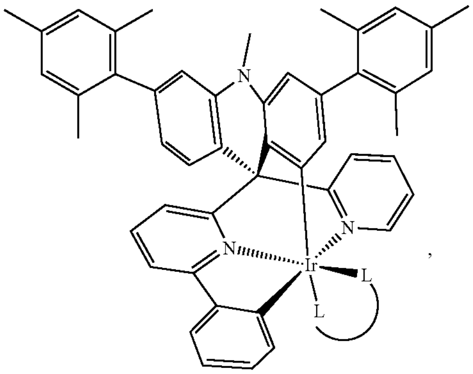
,
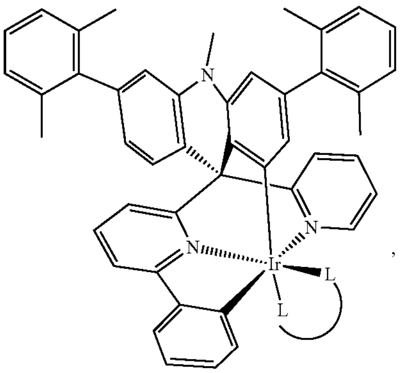
,
-continued
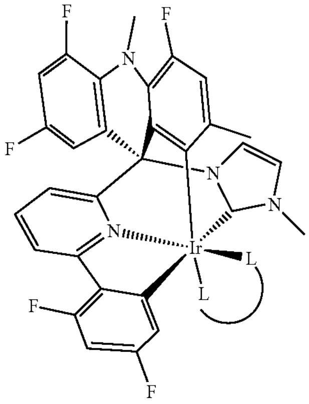
,
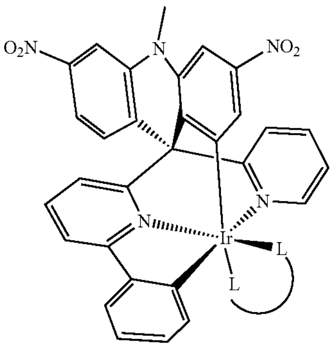
,
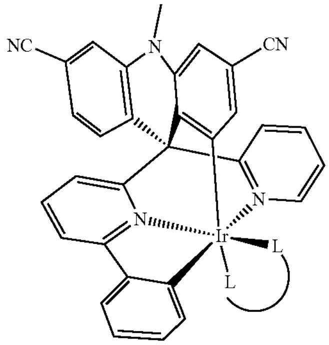
,
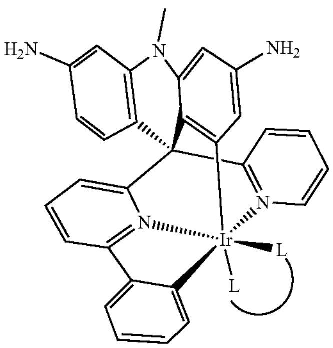
, -continued
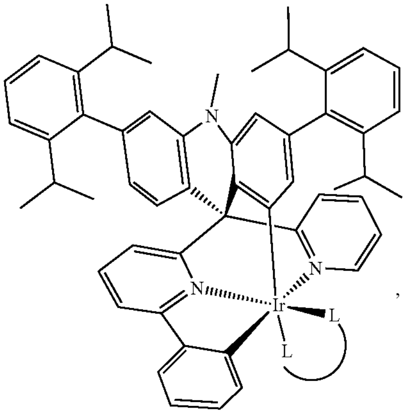
,
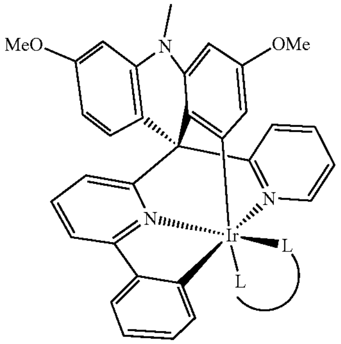
,
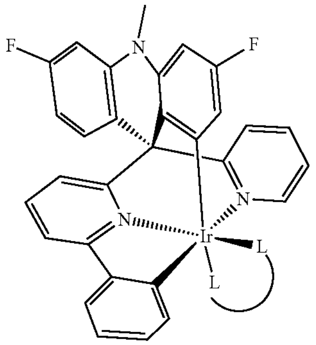
,
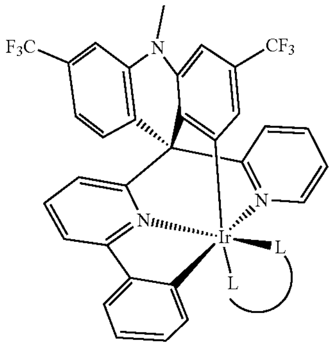
,
-continued
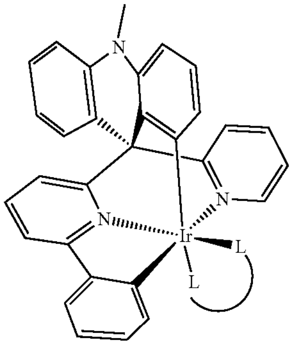
,
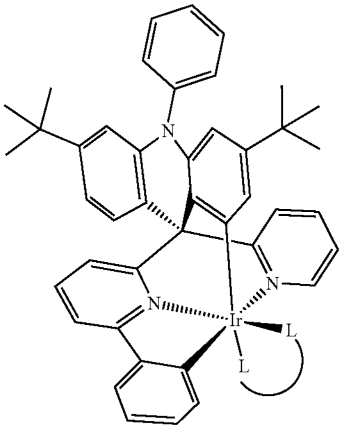
,
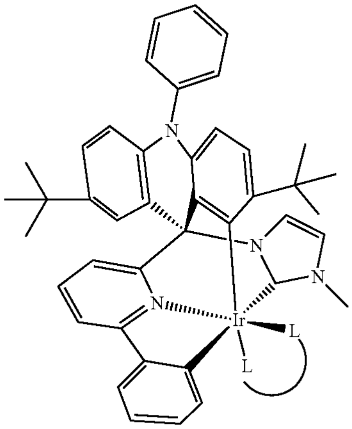
,
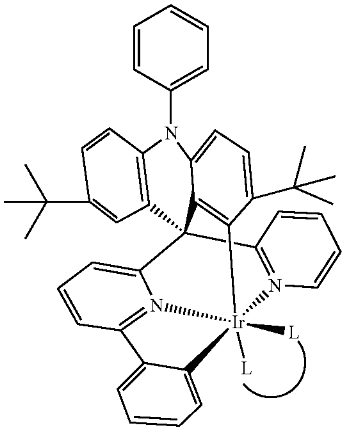
, -continued
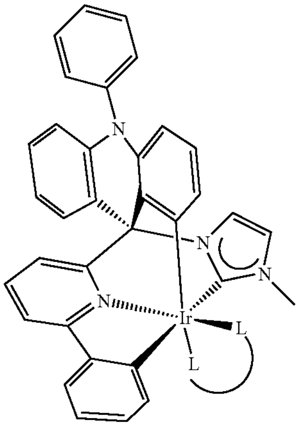
,
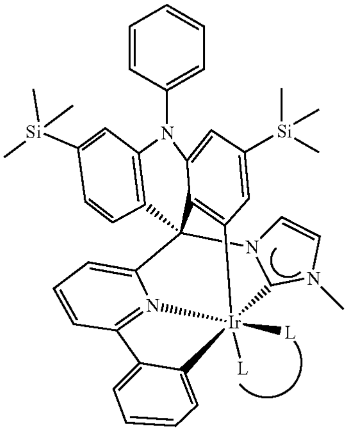
,
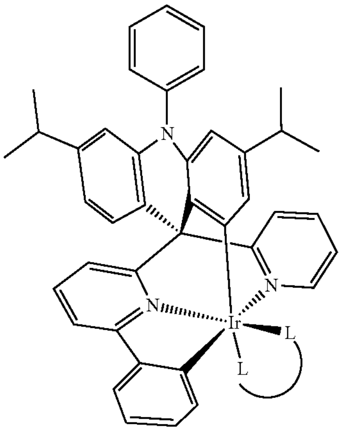
,
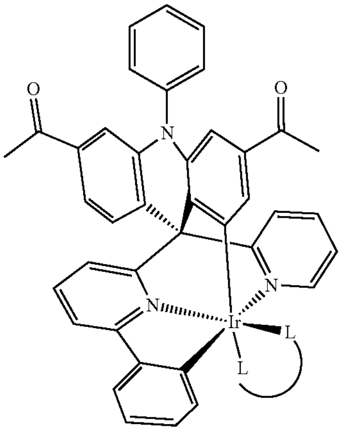
,
-continued
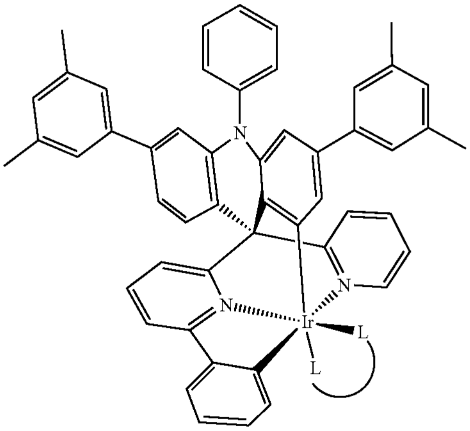
,
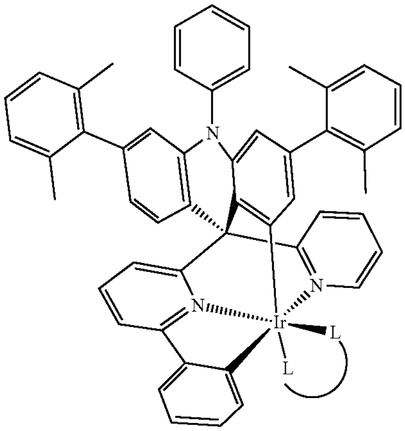
,
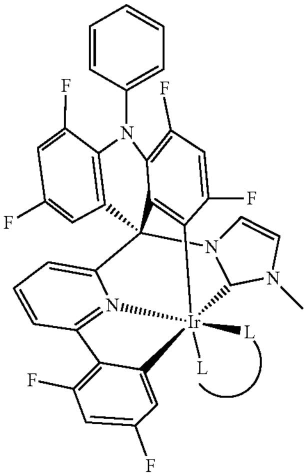

-continued
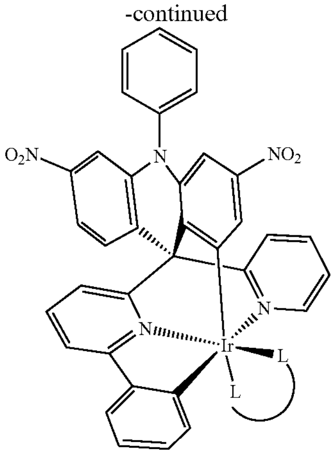
,
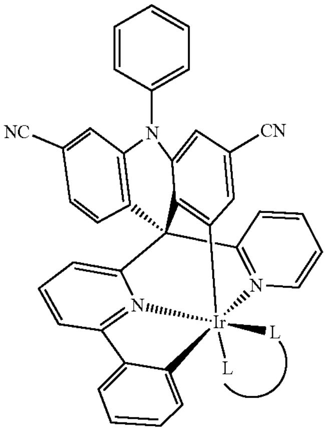
,
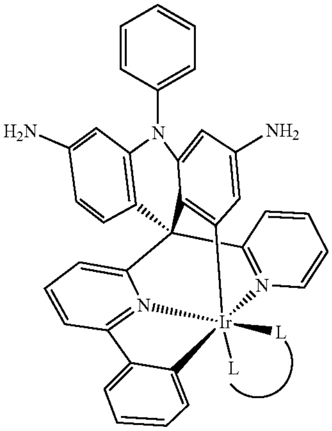
,
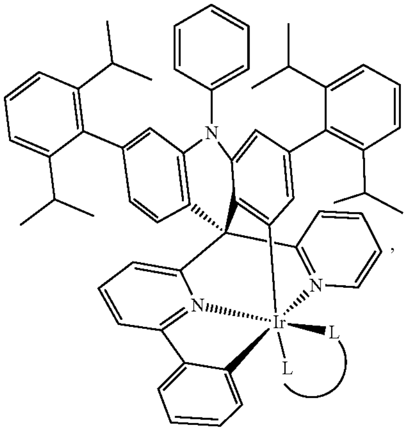
,
-continued
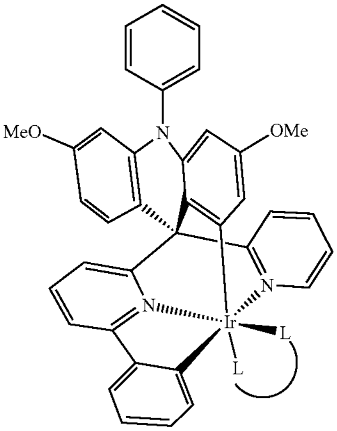
,
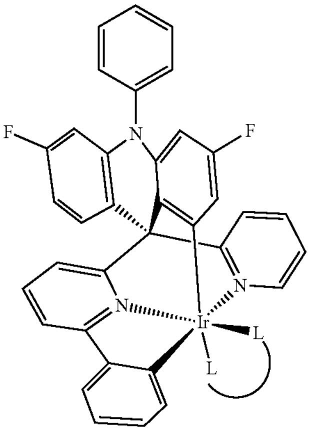
,
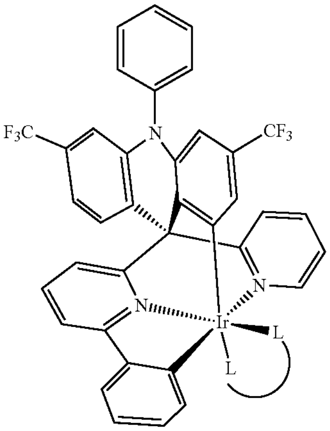
, or -continued
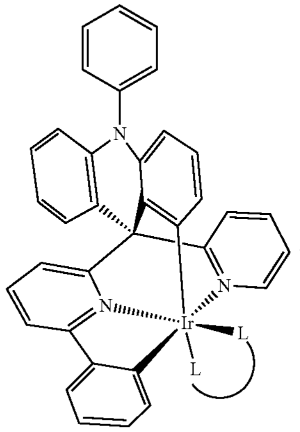
.
7. The iridium containing emitter according to claim 1, wherein L^L is selected from the following structures:
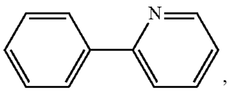
ppy
,
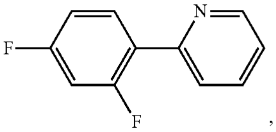
dfppy
,
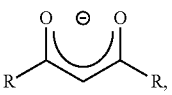
acac
acac (R = Me)
acac-tBu, (R = tBu)
acac-mes, (R = mes)
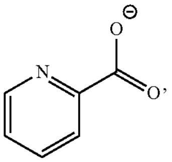
pic
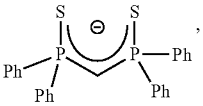
SPN
,
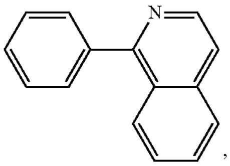
piq
,
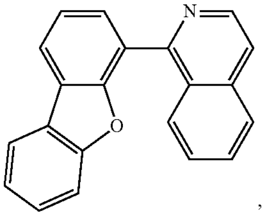
dpfiq
,
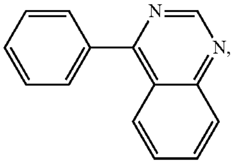
mpq
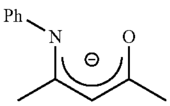
acac
,
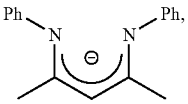
NacNac
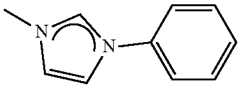
,
-continued
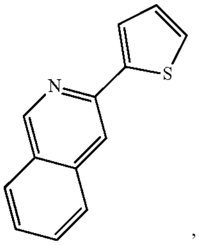
,
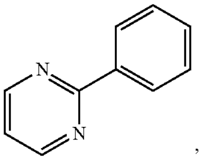
,
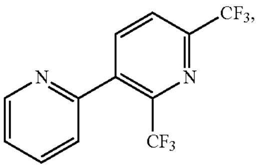
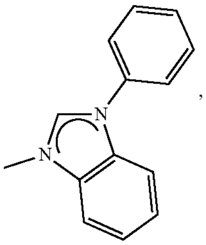
,
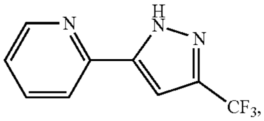
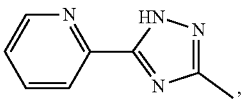
,
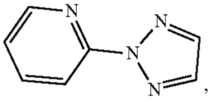
,
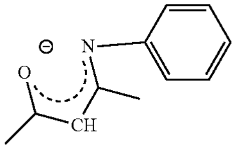
,
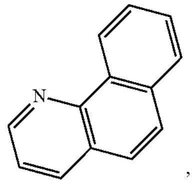
,
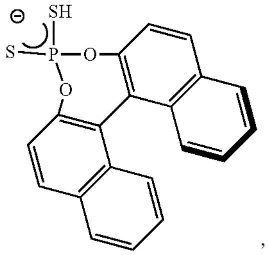
,
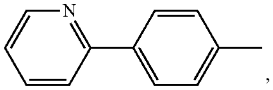
,
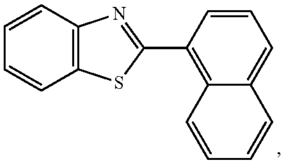
,
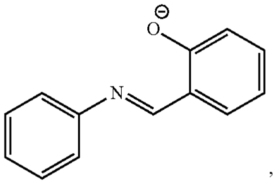
,
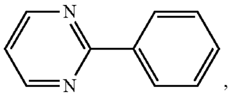
,
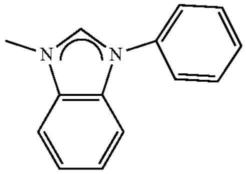
or
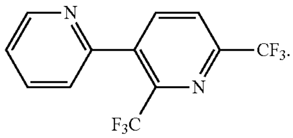

8. The iridium containing emitter according to claim 1, wherein the emitter comprises at least one of the following structures:
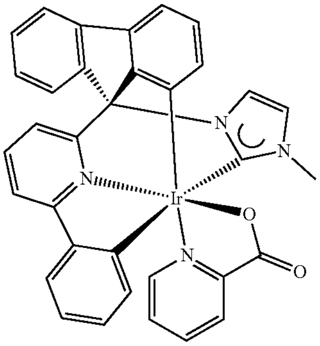
Ir(L1)(pic)
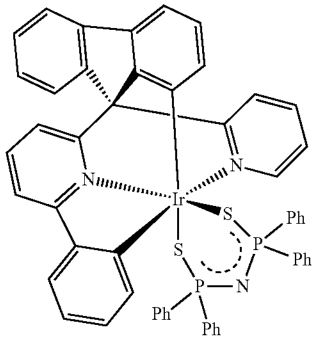
Ir(L1)(SPN)
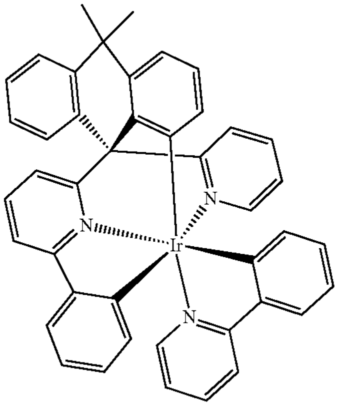
Ir(L3)(ppy)
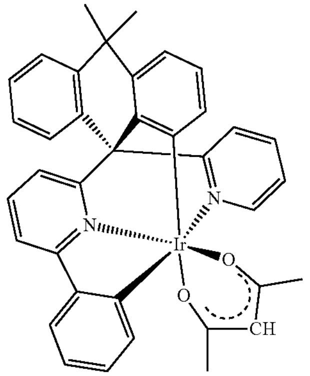
Ir(L3)(acac)
-continued
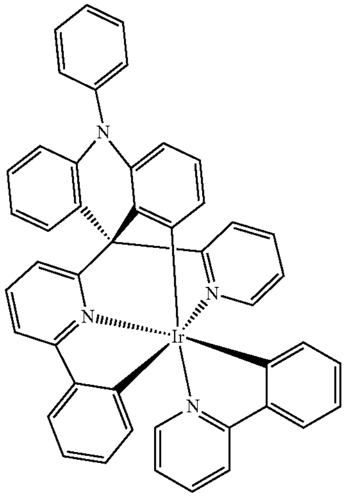
Ir(L2)(ppy)
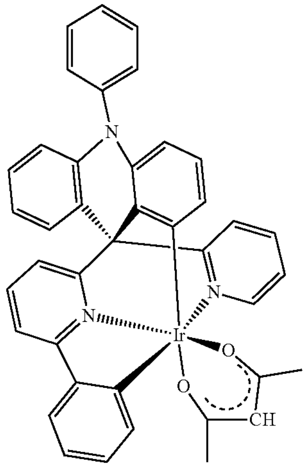
Ir(L2)(acac)
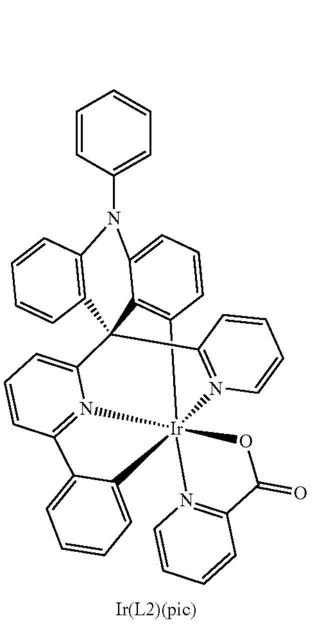
Ir(L2)(pic)

-continued
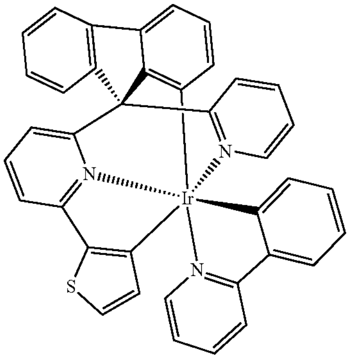
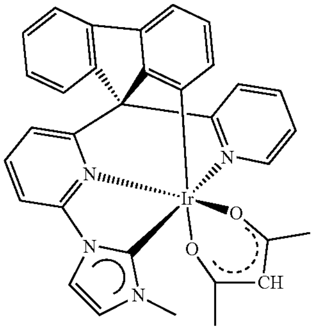
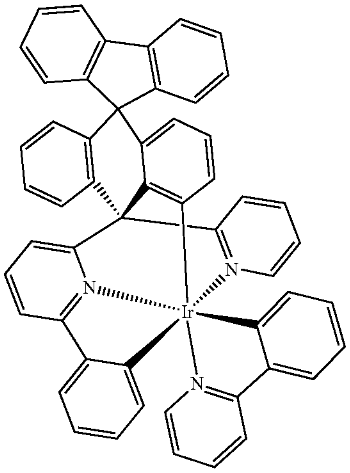
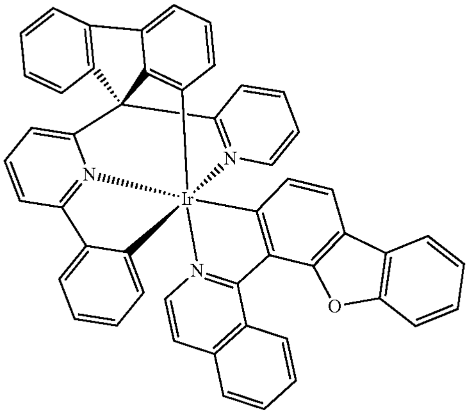
-continued
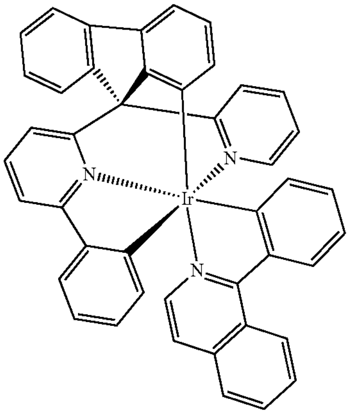
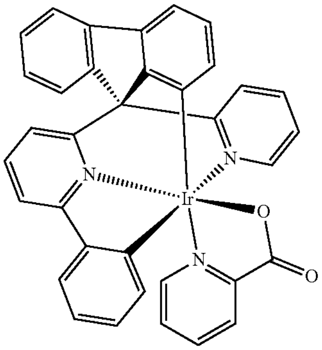
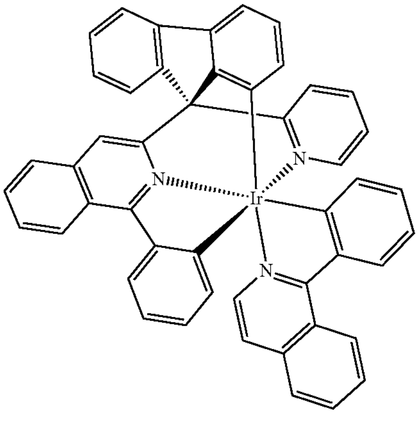
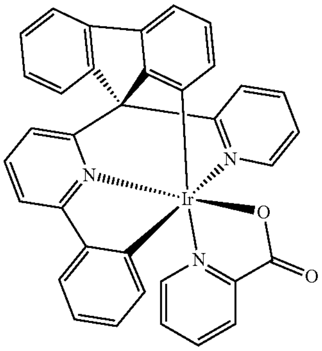

-continued
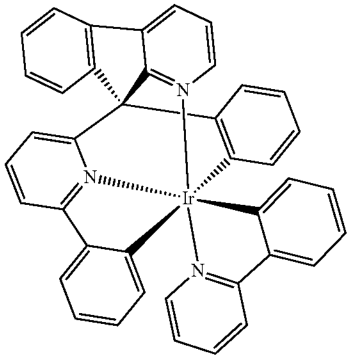
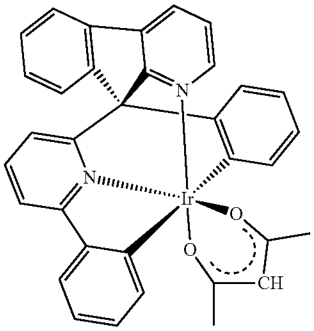
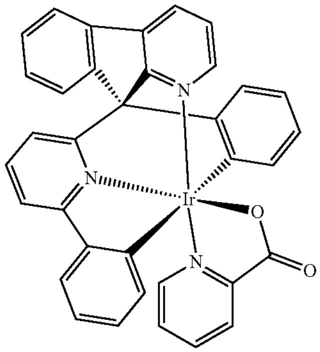
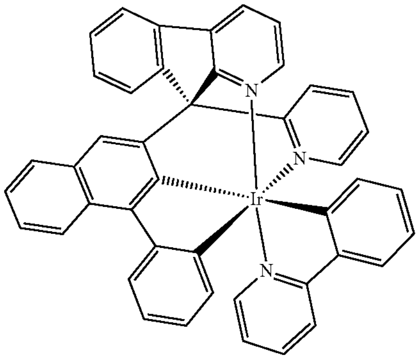
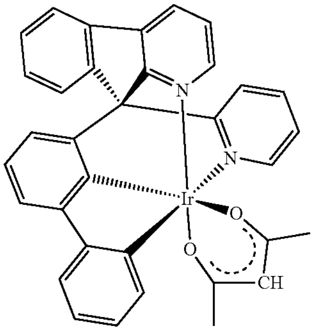
-continued
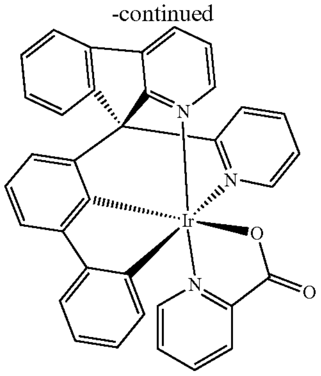
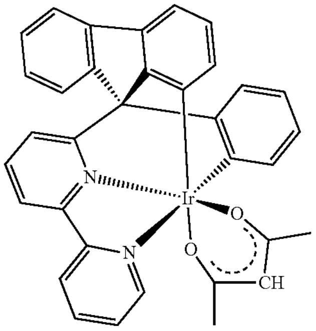
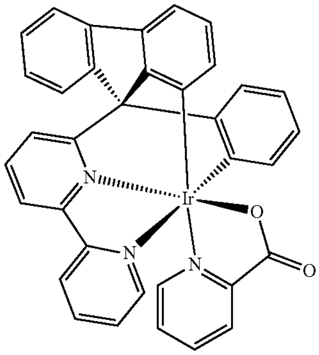
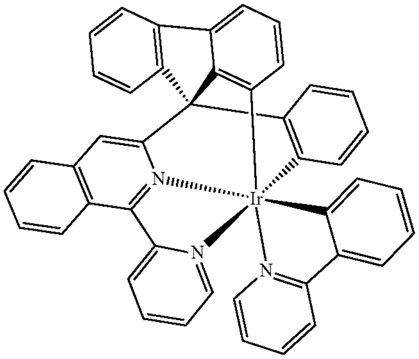
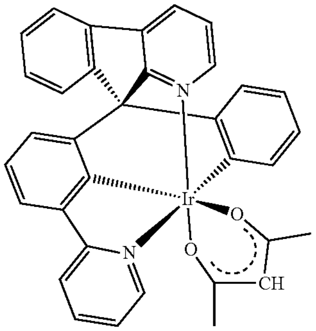

-continued
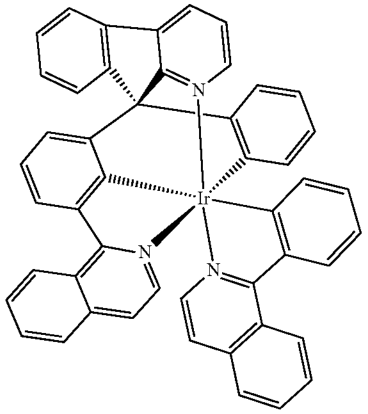
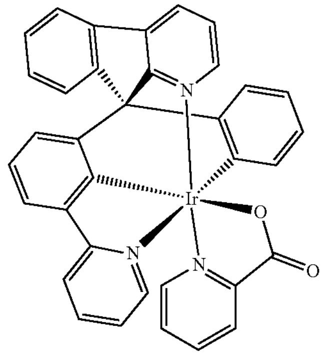
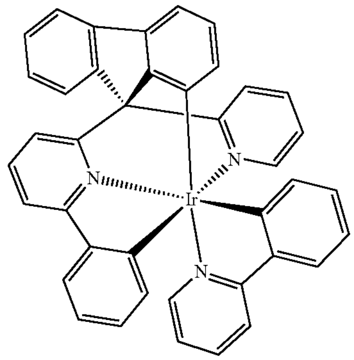
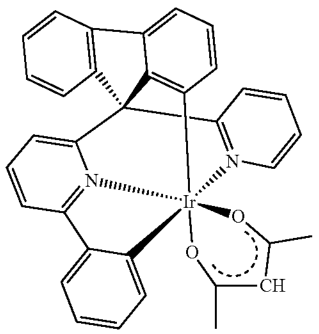
-continued
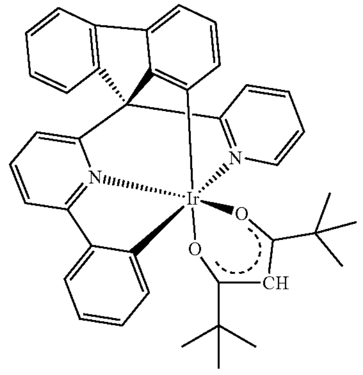
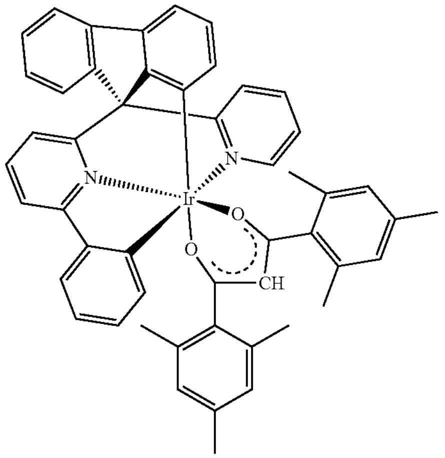
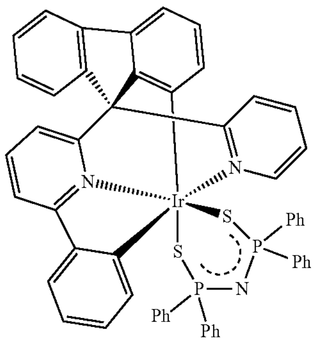
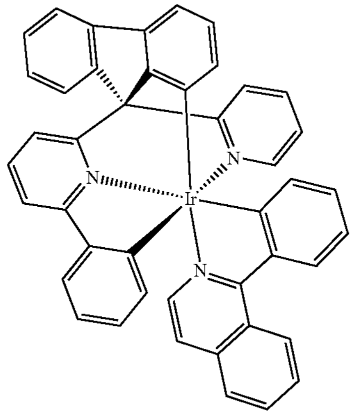

-continued
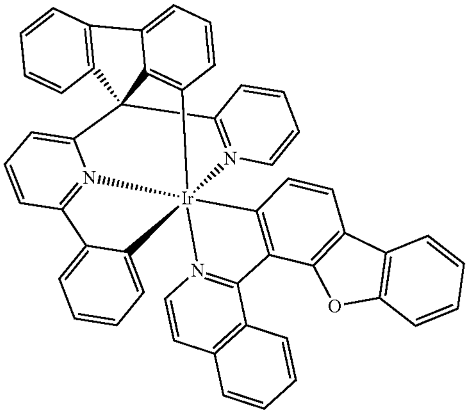
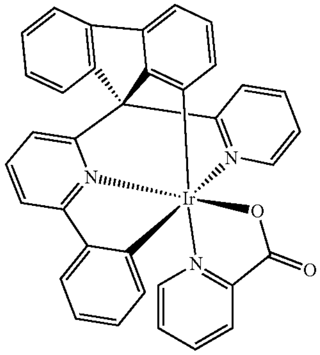
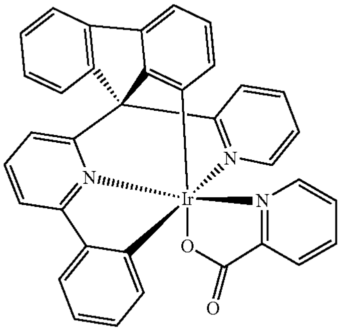
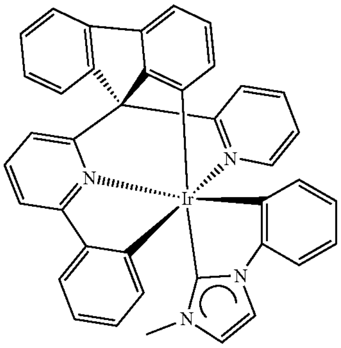
-continued
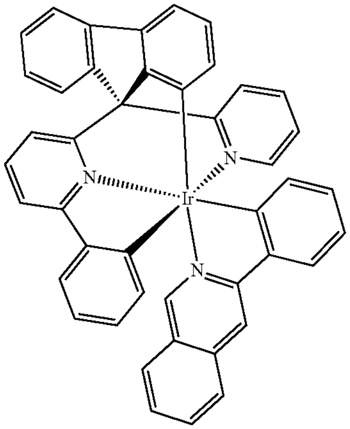
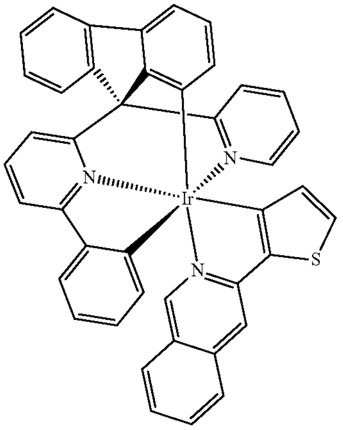
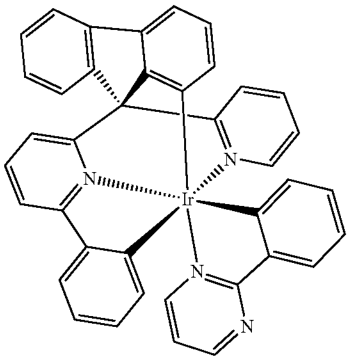
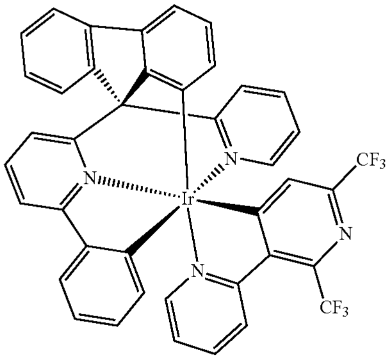

-continued
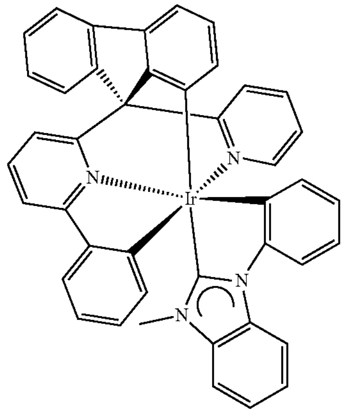
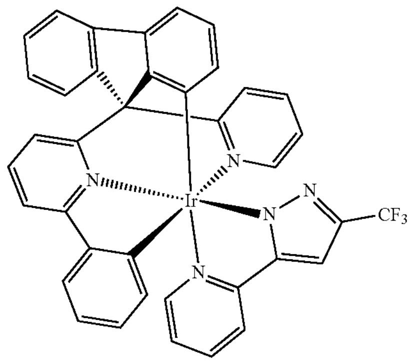
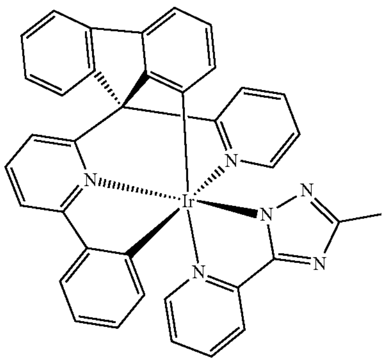
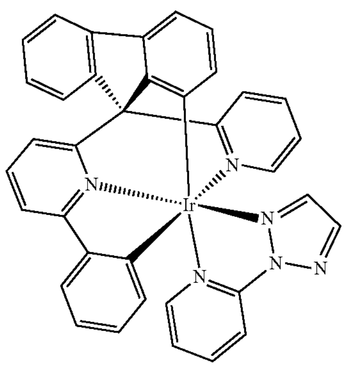
-continued
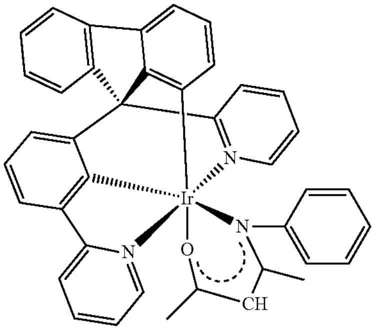
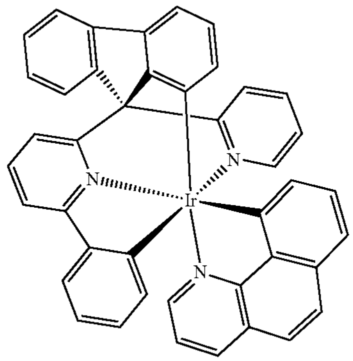
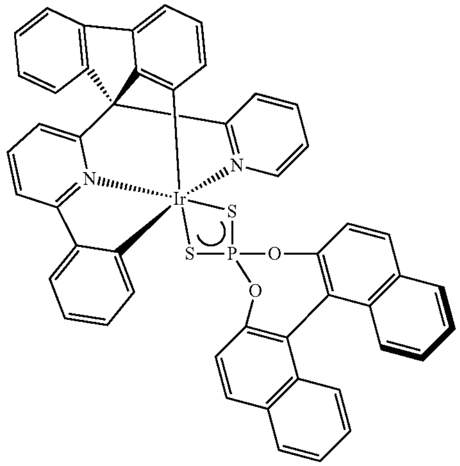
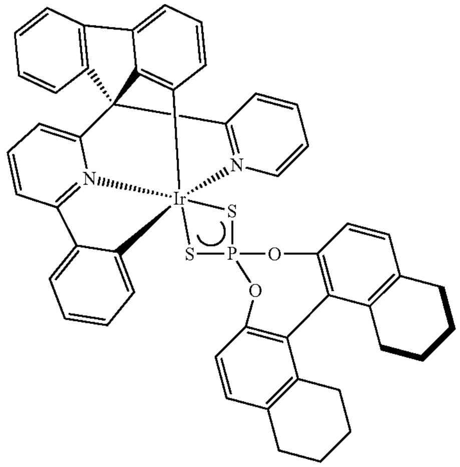

-continued
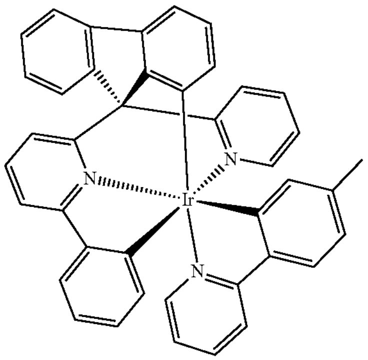
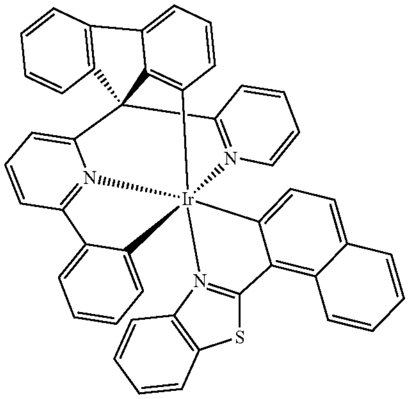
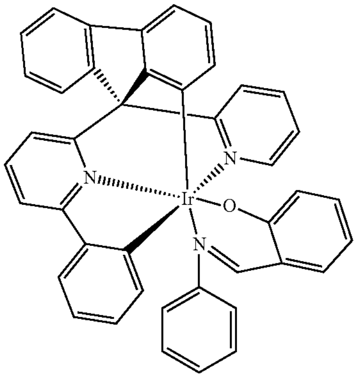
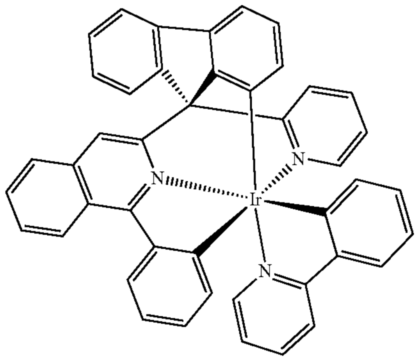
-continued
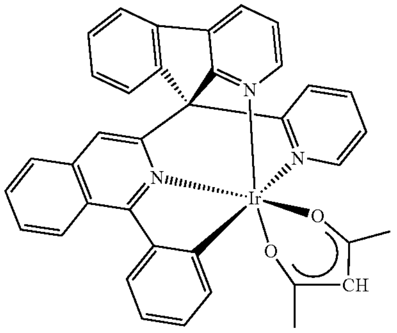
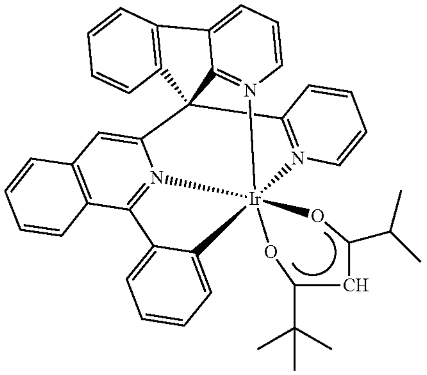
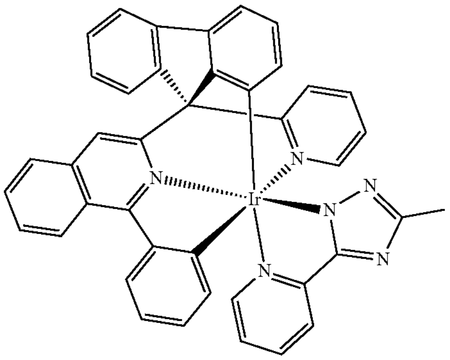
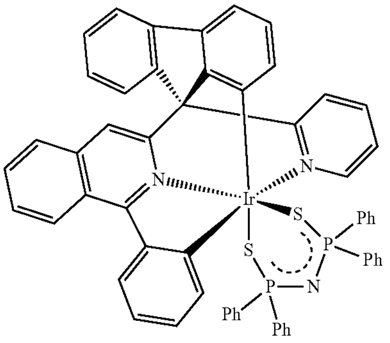

-continued
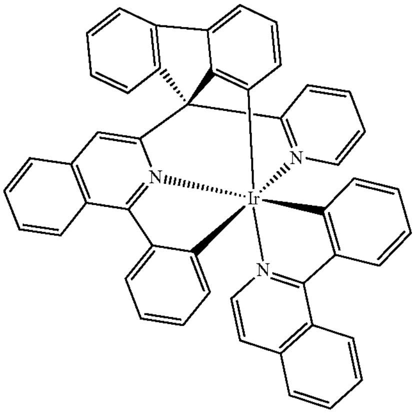
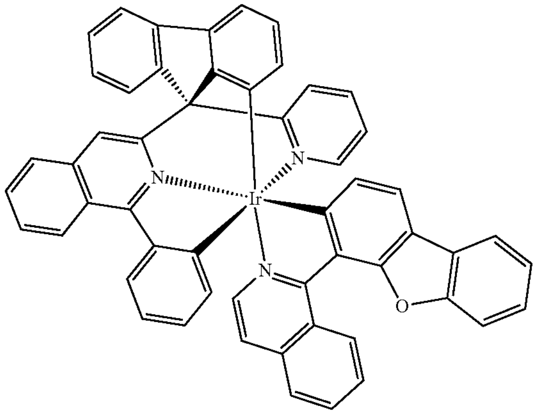
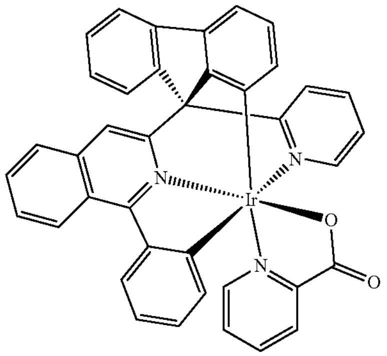
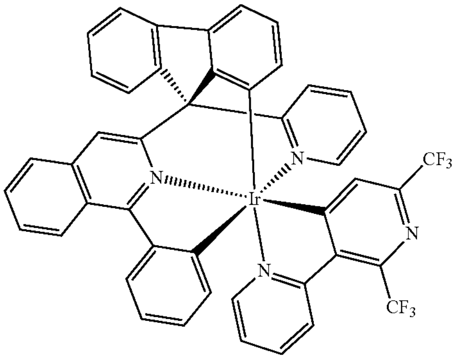
-continued
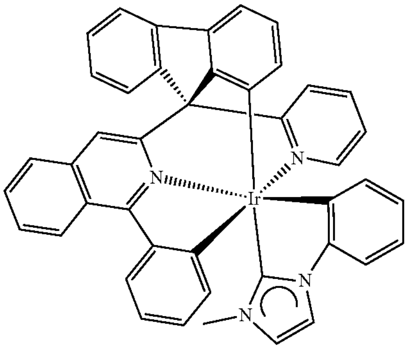
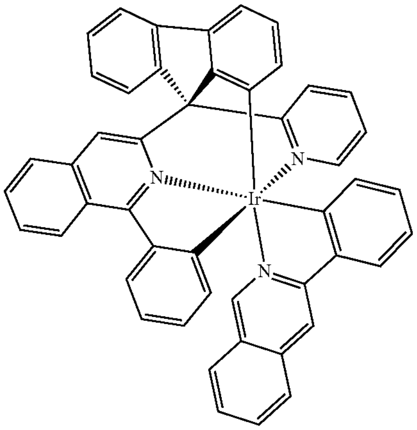
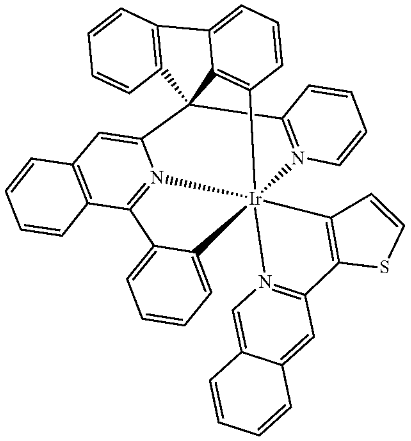
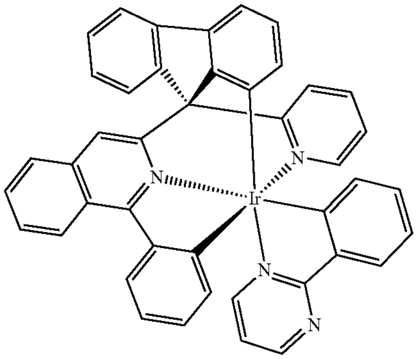

-continued
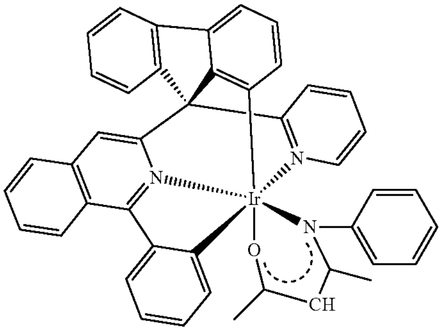
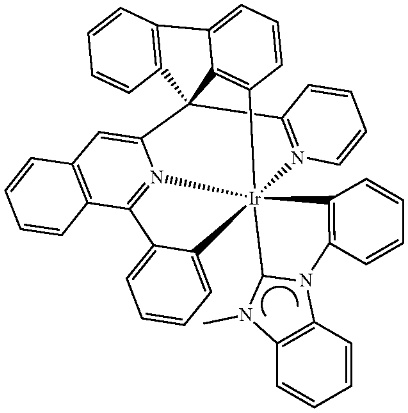
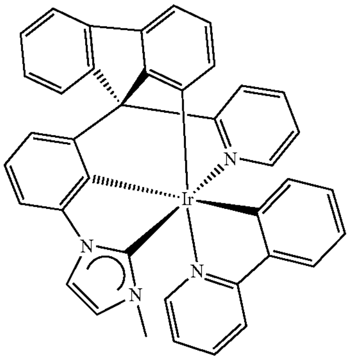
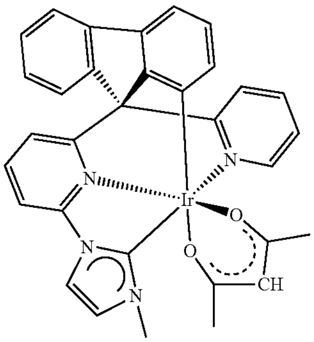
-continued
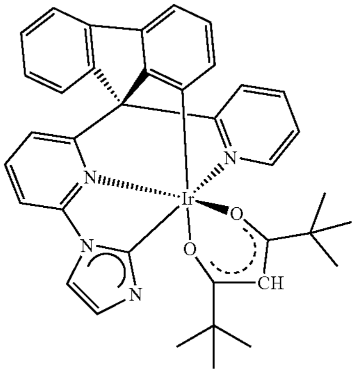
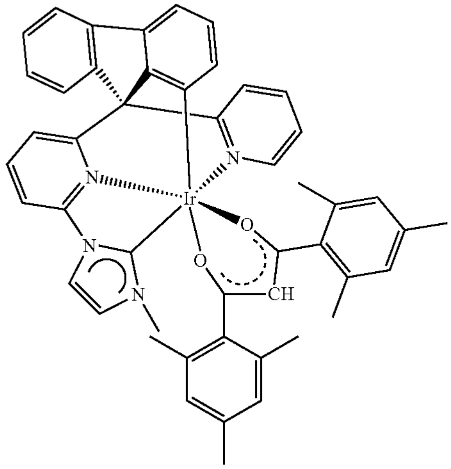
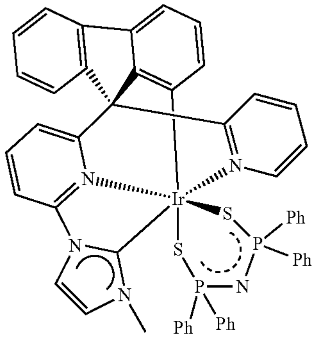
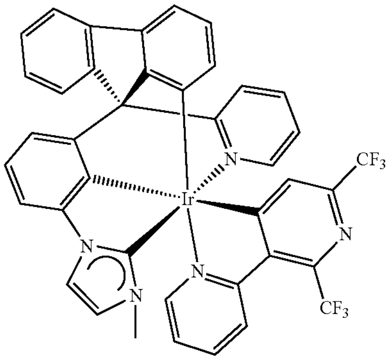

-continued
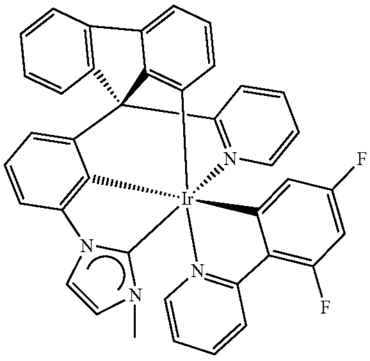
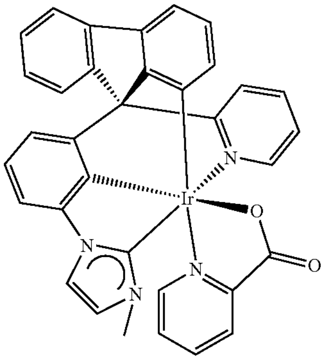
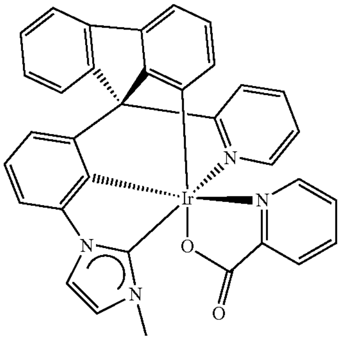
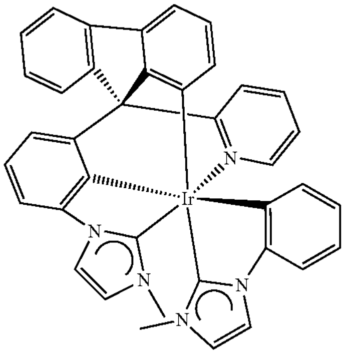
-continued
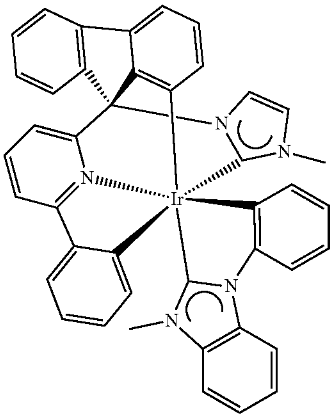
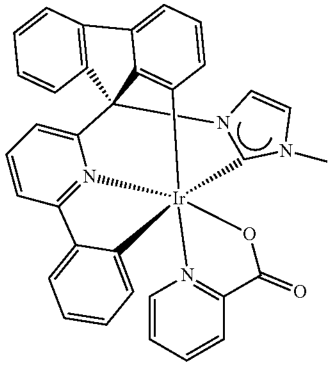
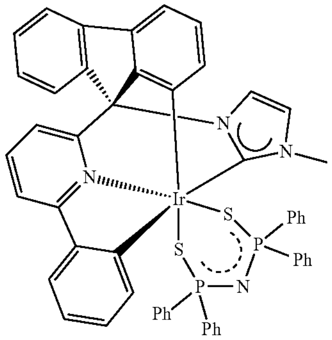
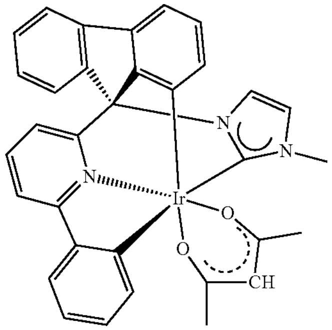

-continued
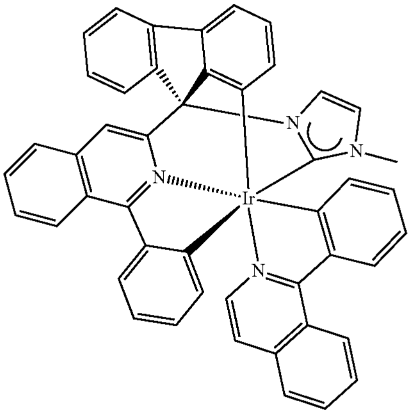
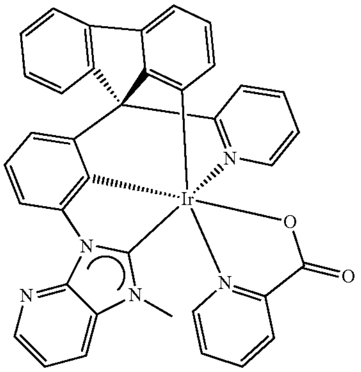
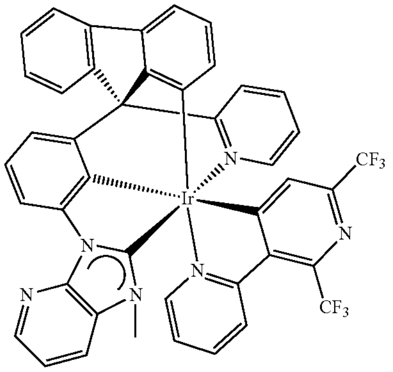
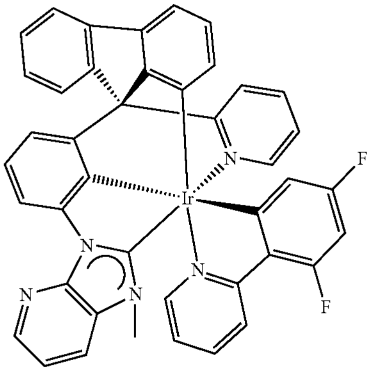
-continued
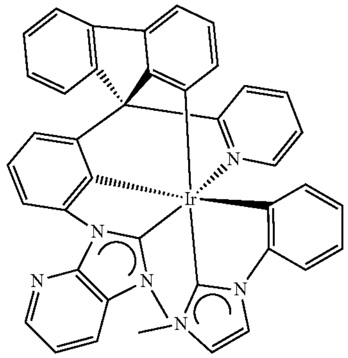
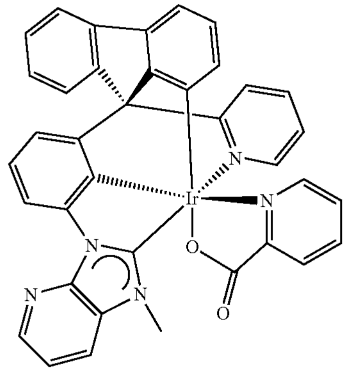
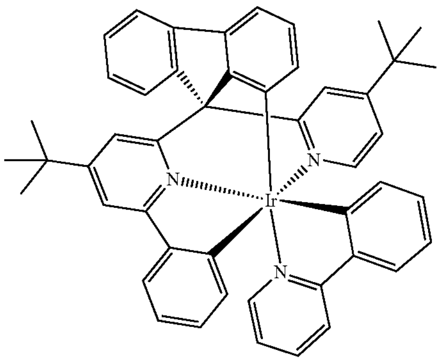
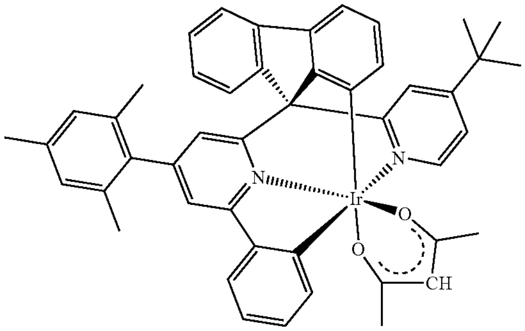

-continued
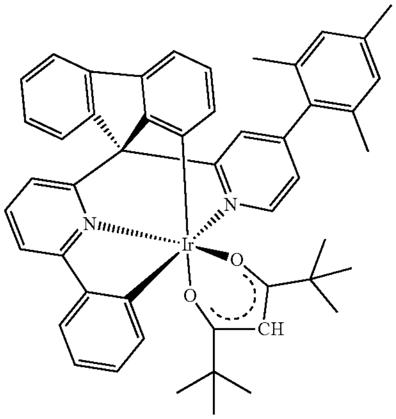
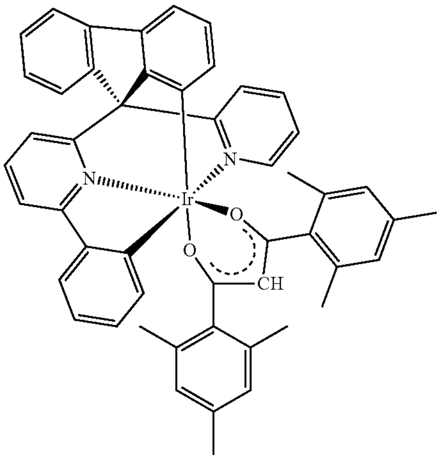
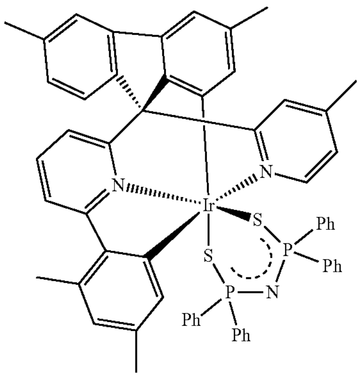
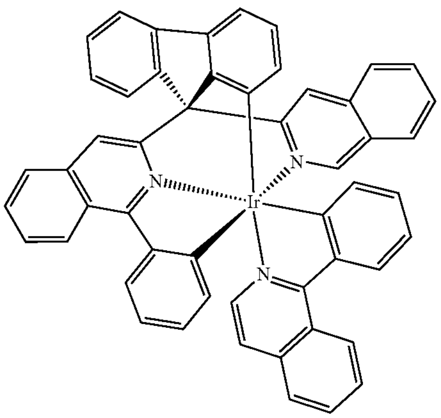
-continued
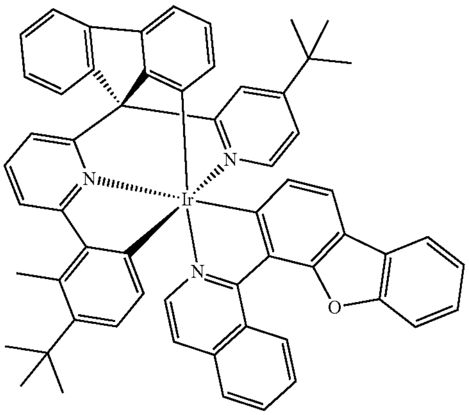
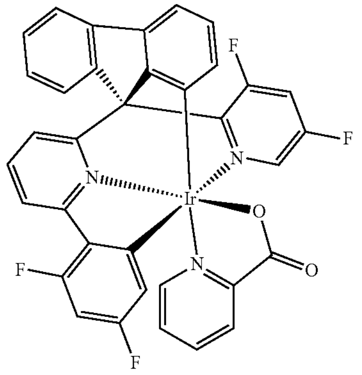
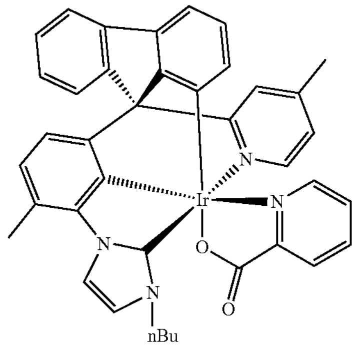
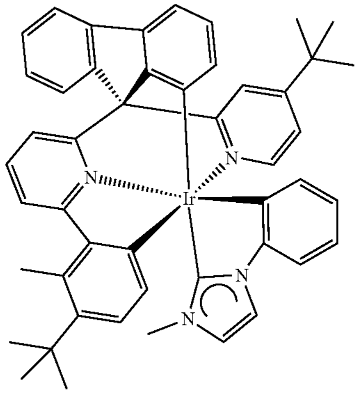

-continued
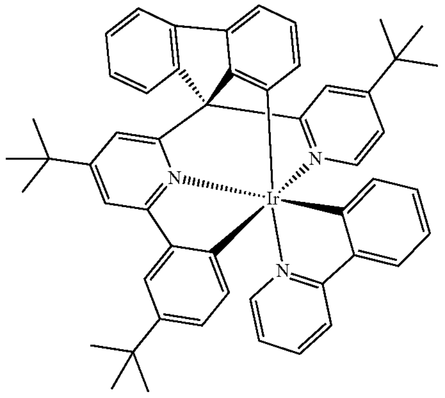
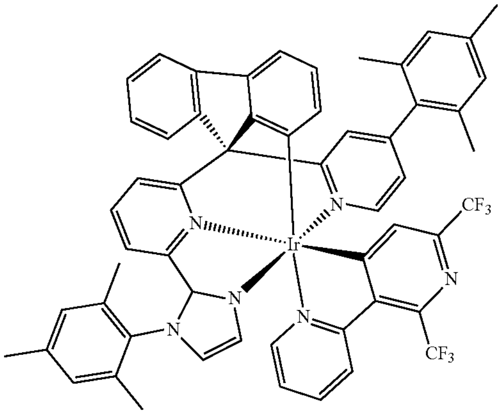
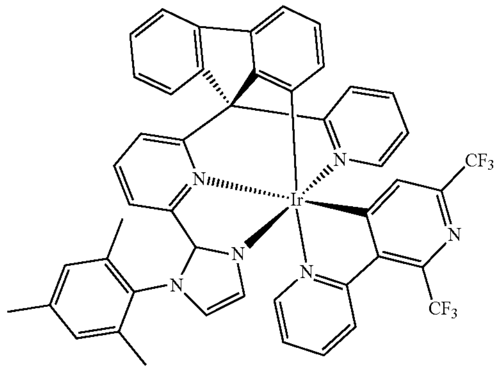
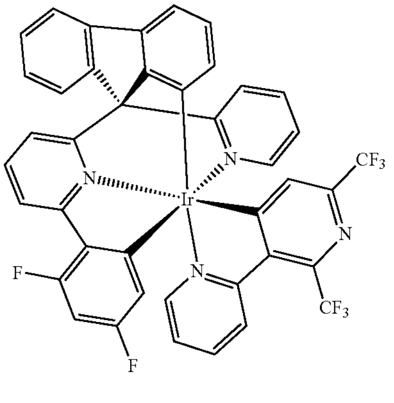
-continued
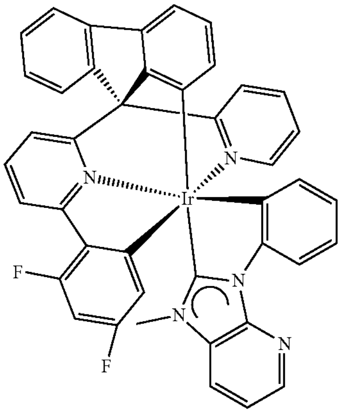
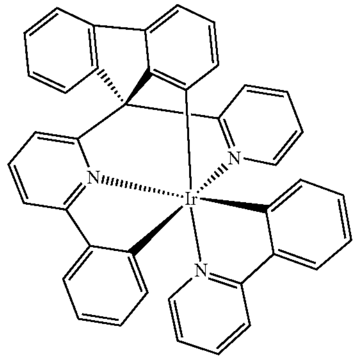
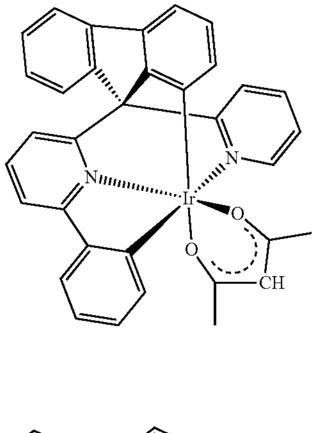
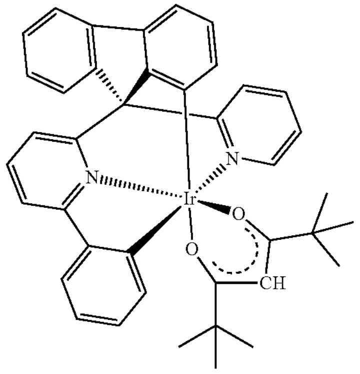

-continued
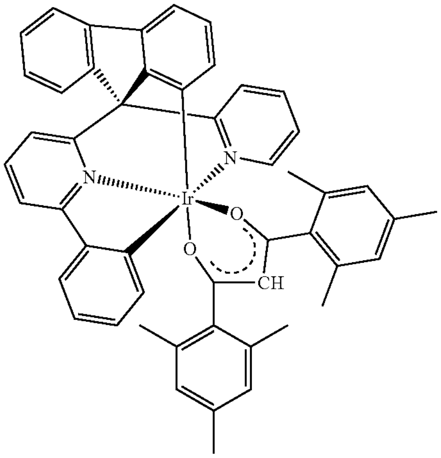
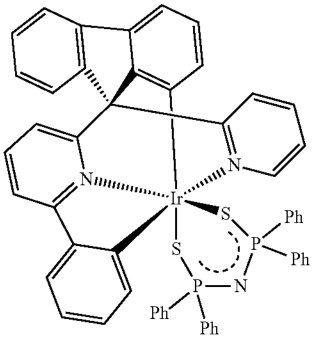
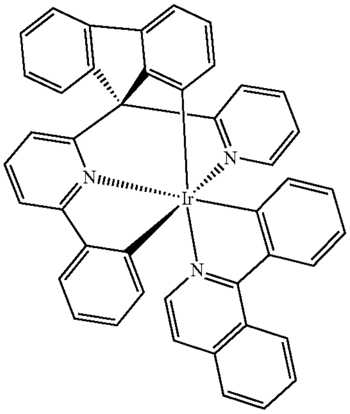
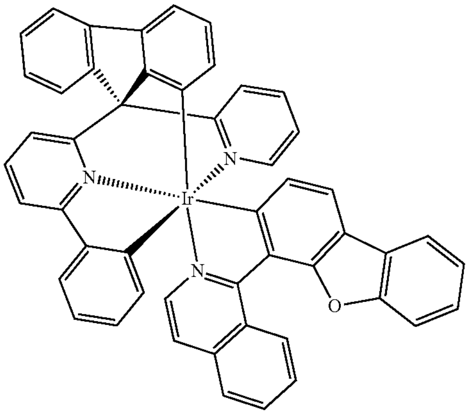
-continued
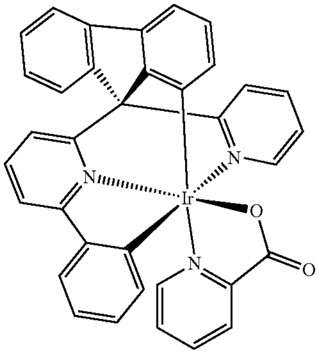
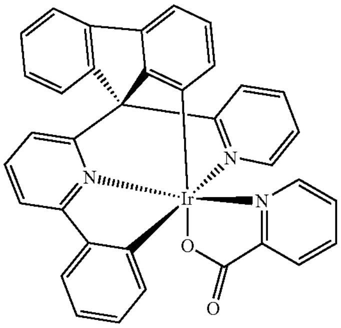
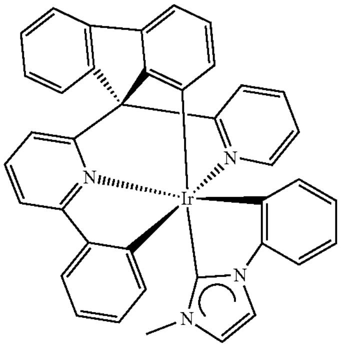
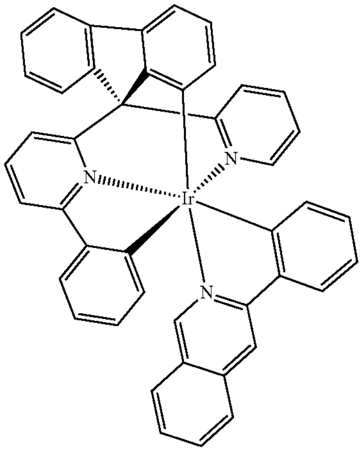

-continued
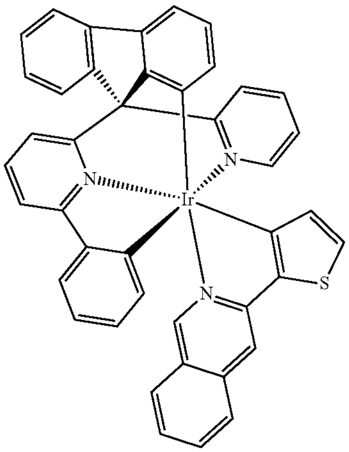
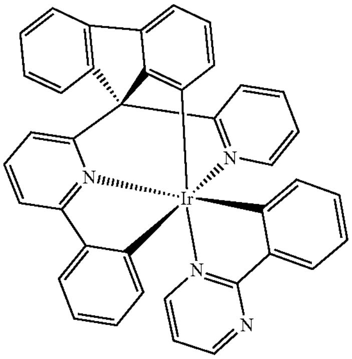
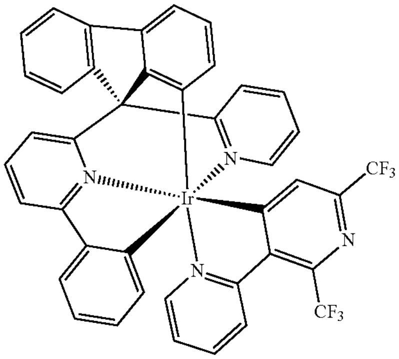
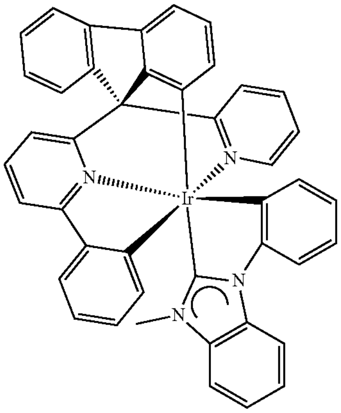
-continued
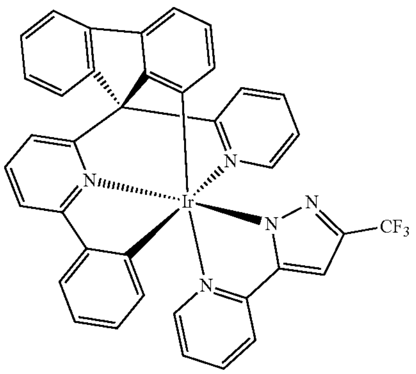
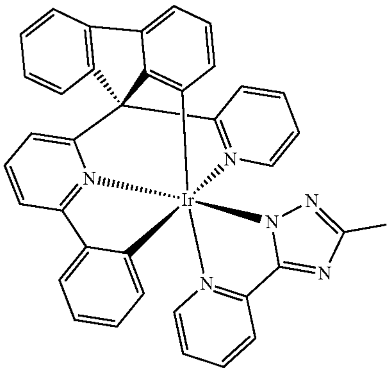
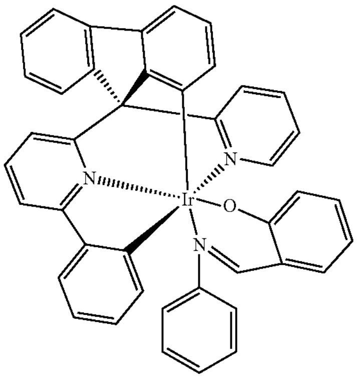
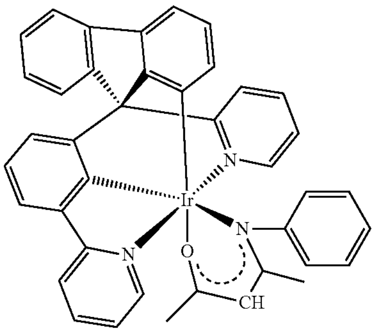

-continued
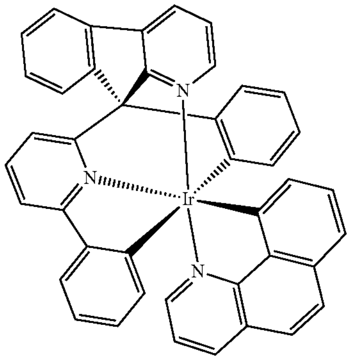
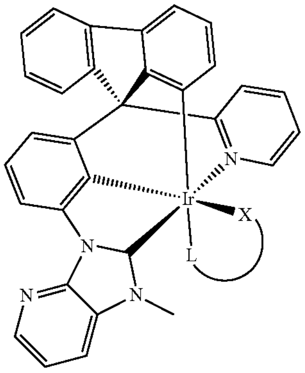
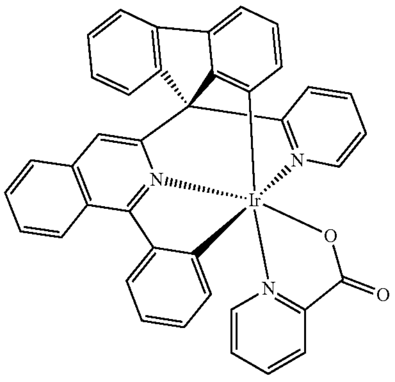
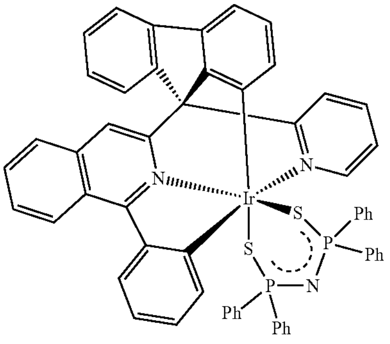
-continued
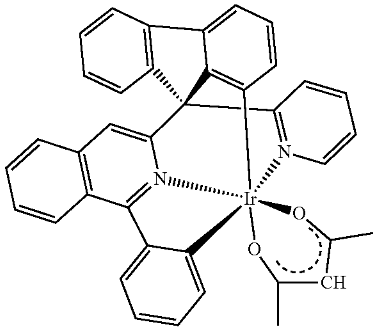
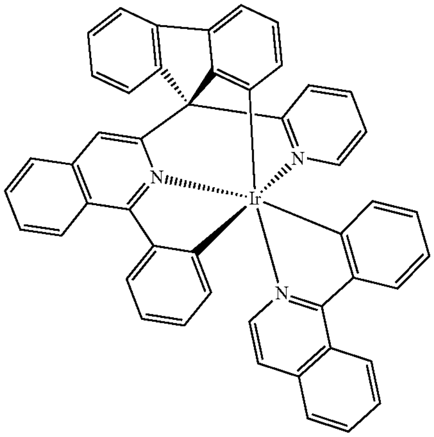
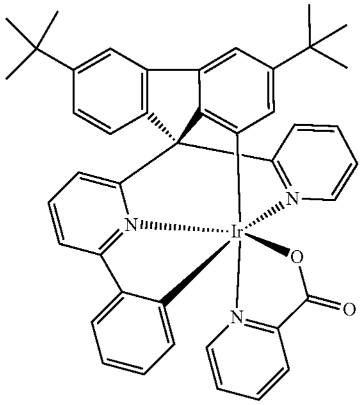
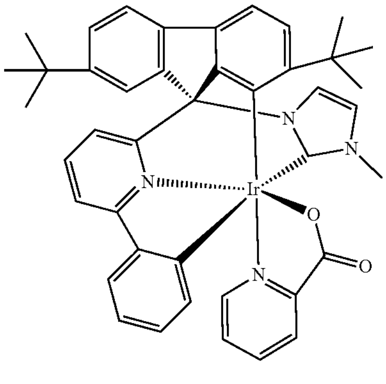

-continued
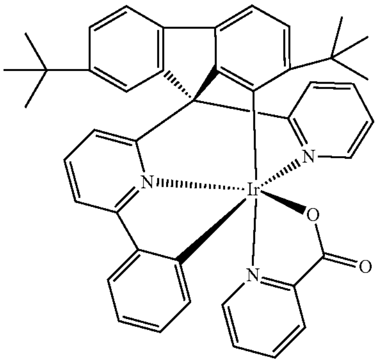
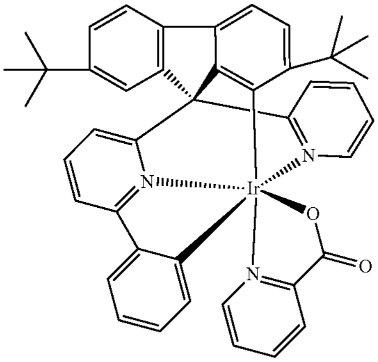
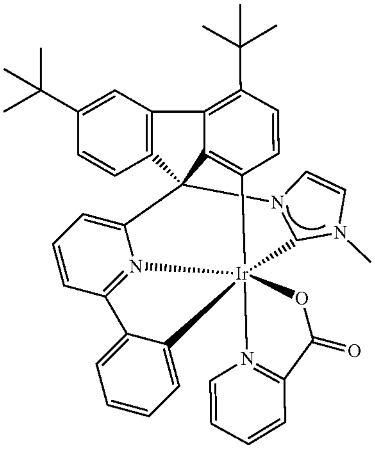
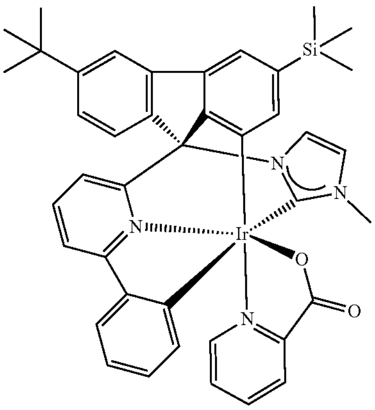
-continued
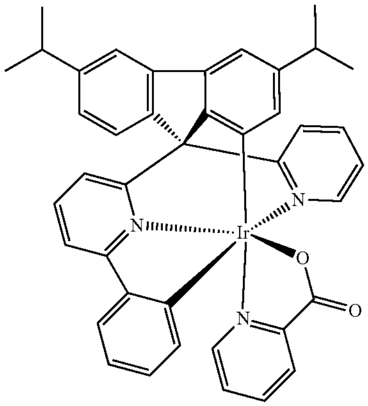
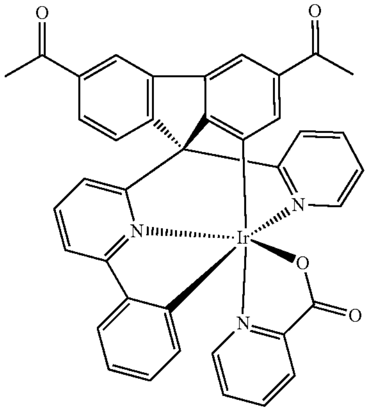
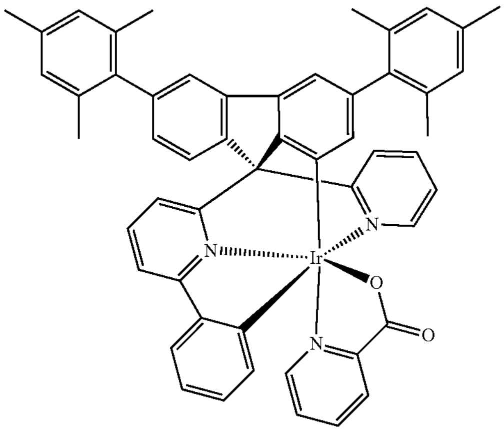
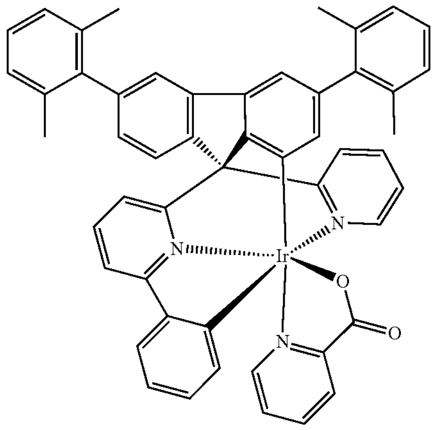

-continued
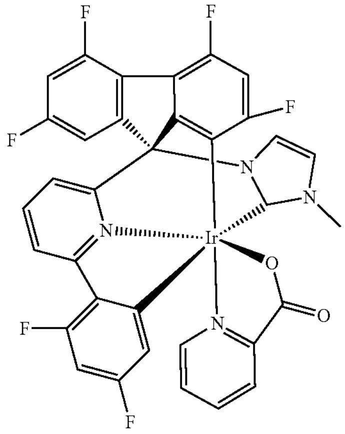
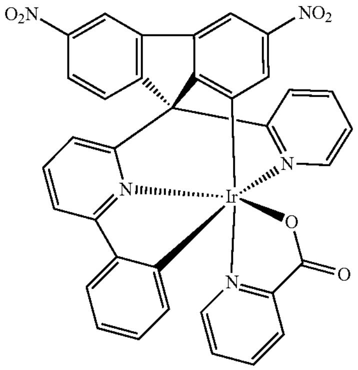
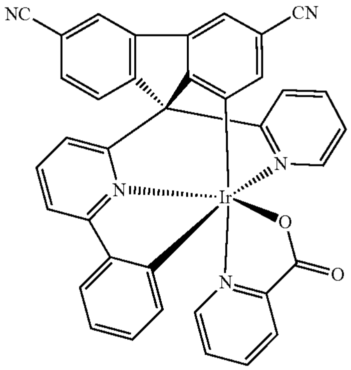
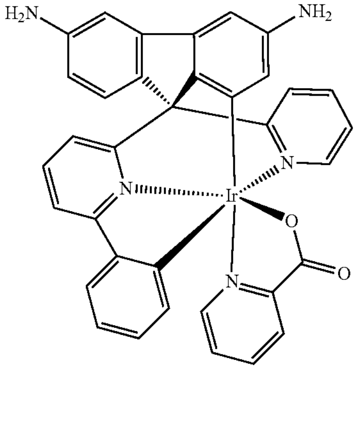
-continued
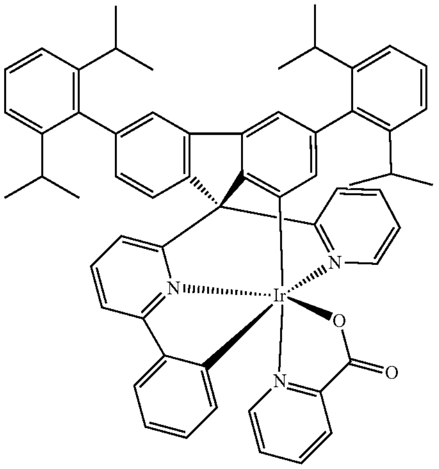
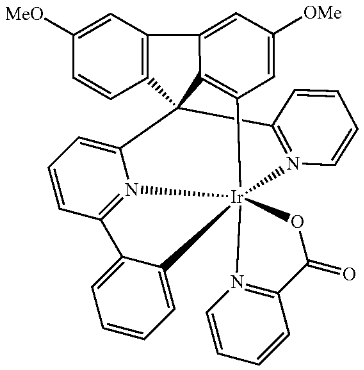
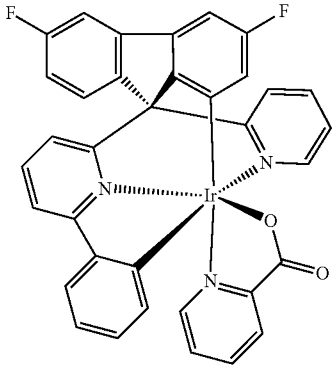
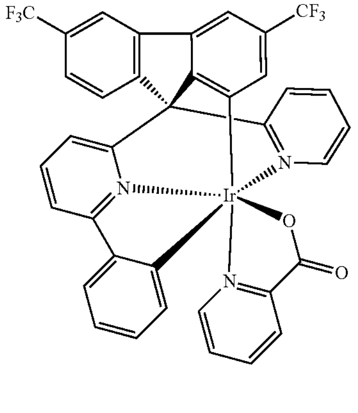

-continued
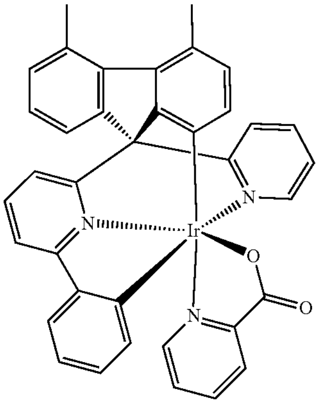
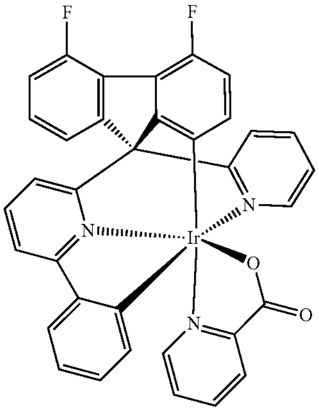
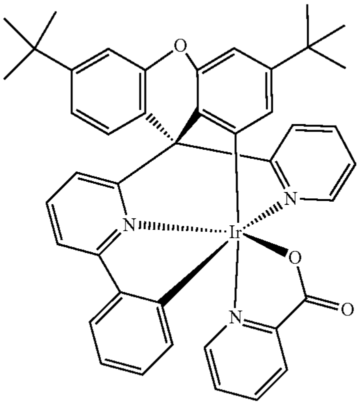
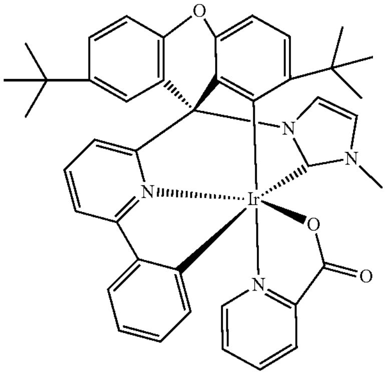
-continued
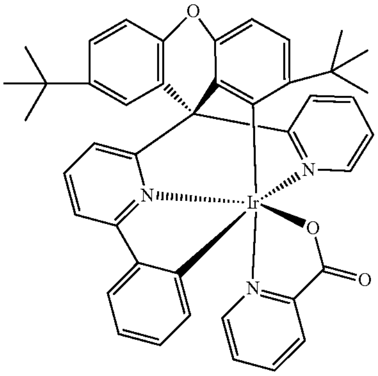
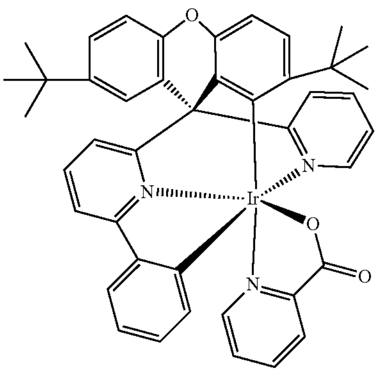
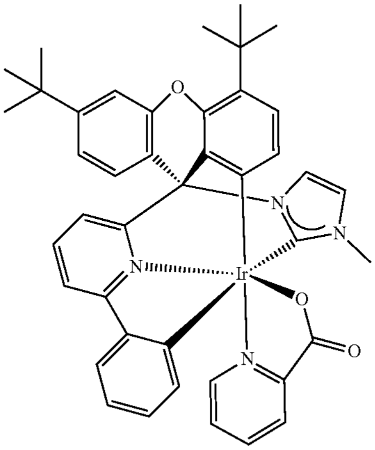
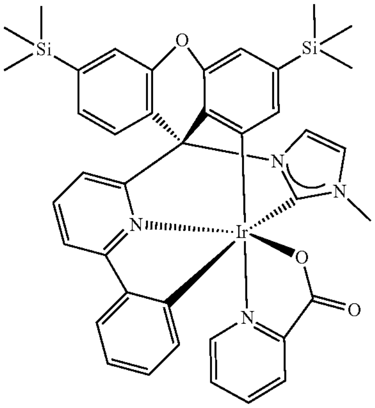

-continued
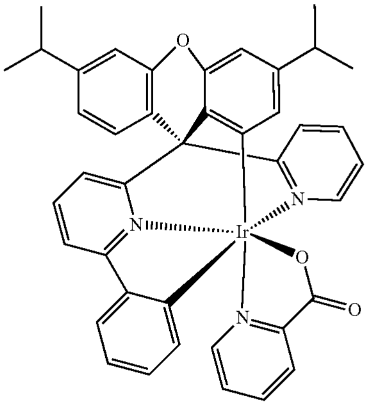
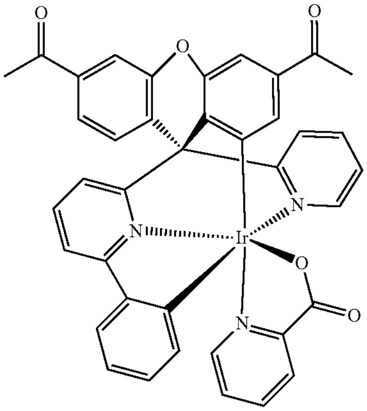
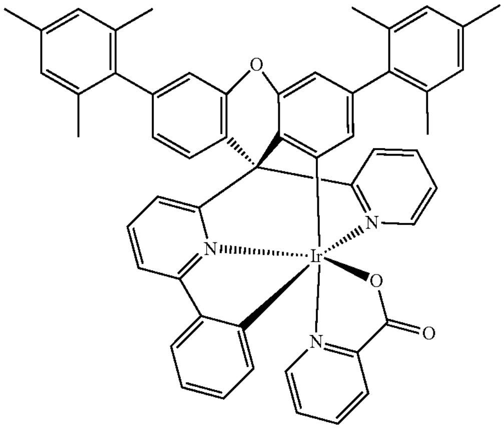
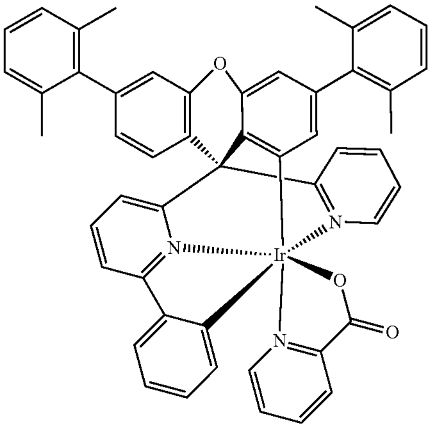
-continued
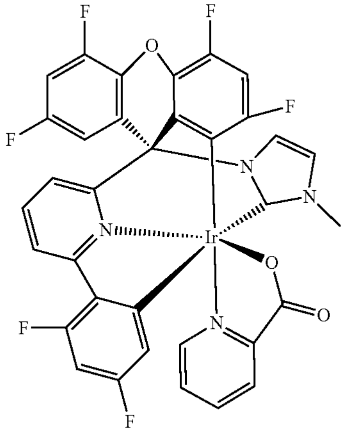
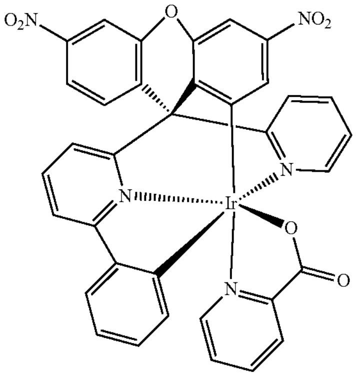
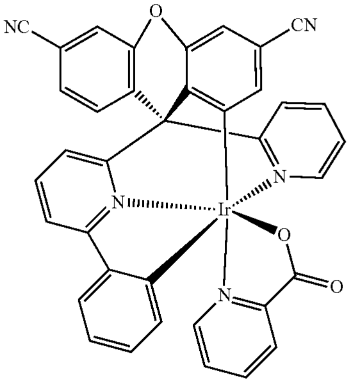
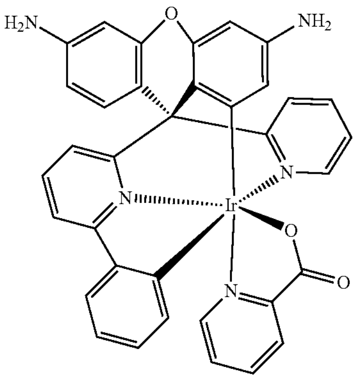

-continued
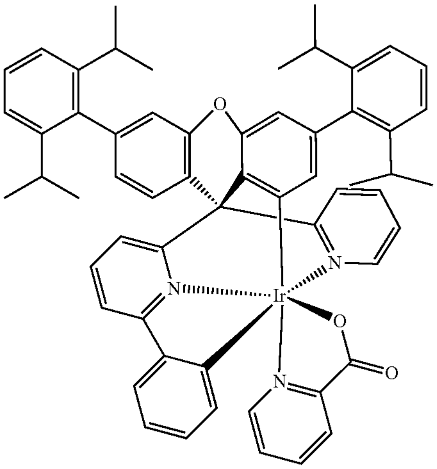
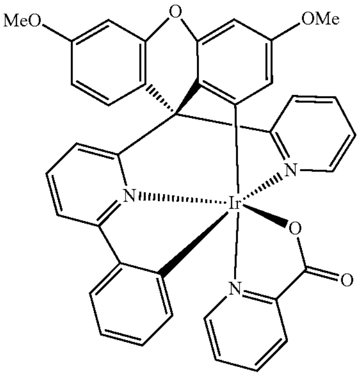
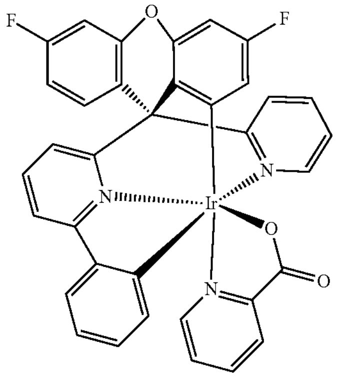
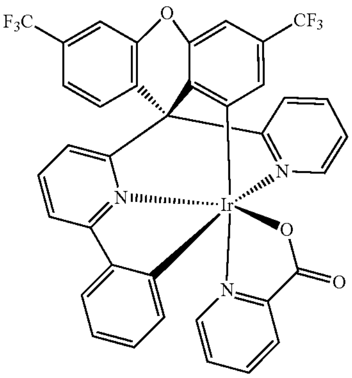
-continued
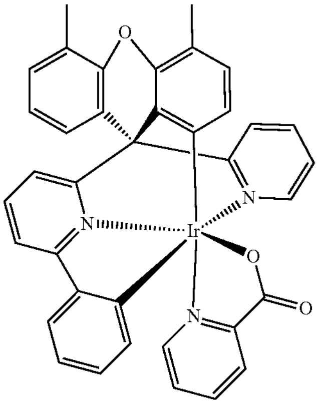
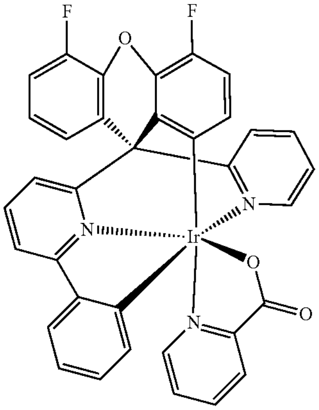
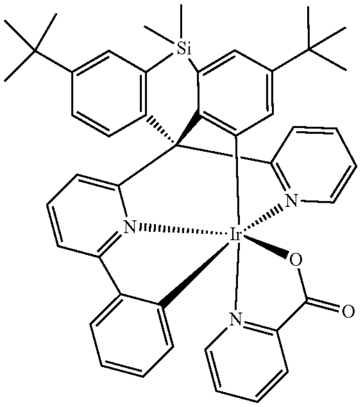
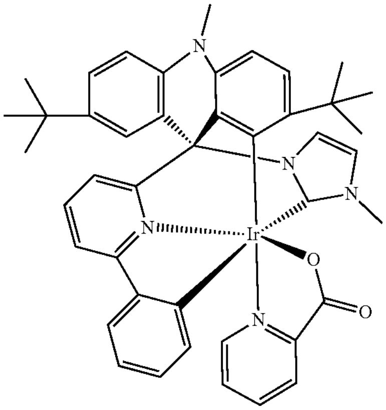

-continued
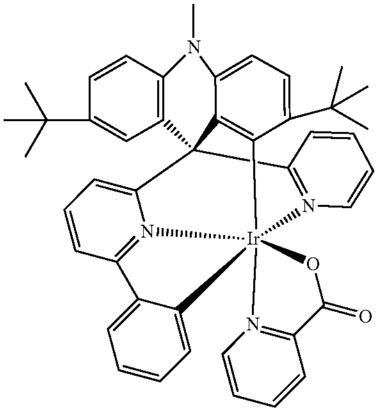
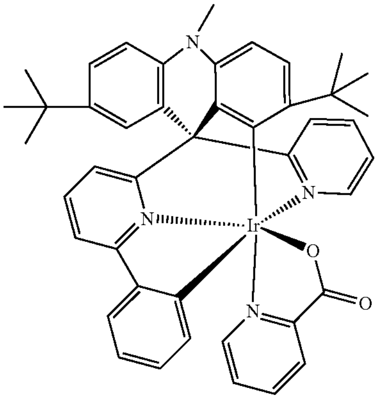
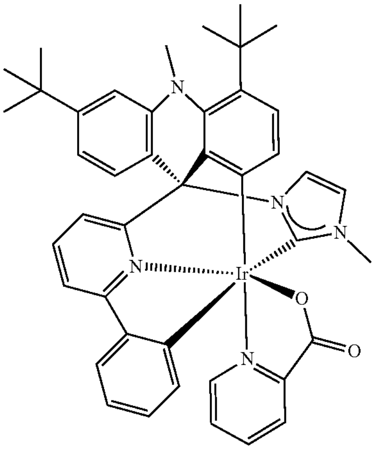
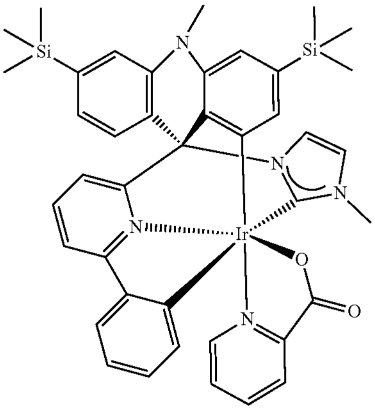
-continued
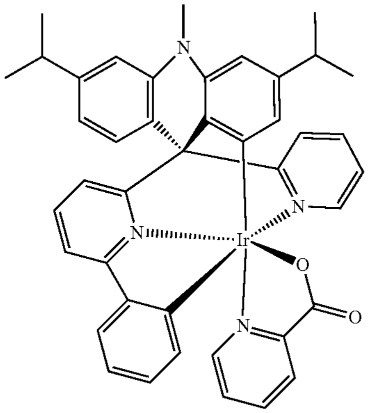
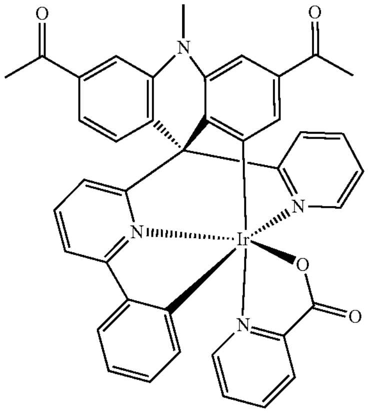
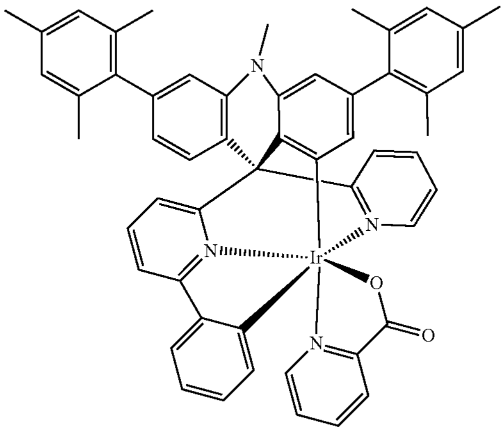
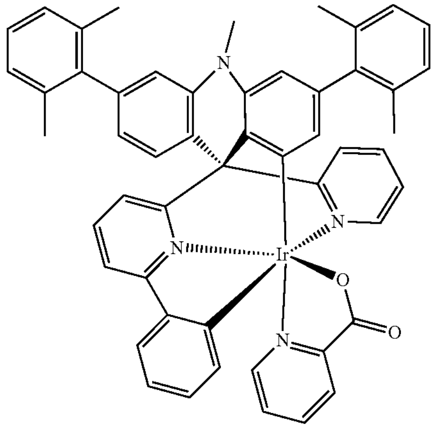

-continued
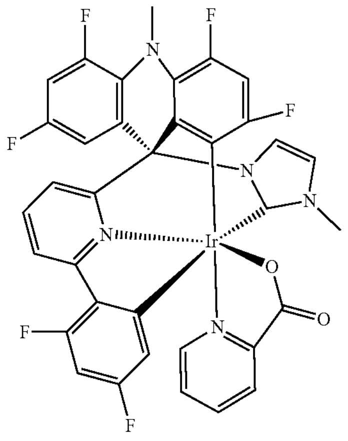
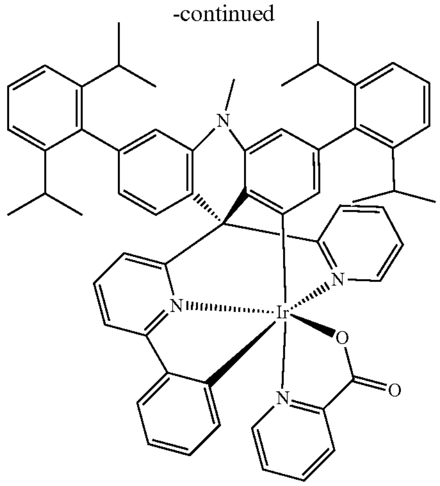
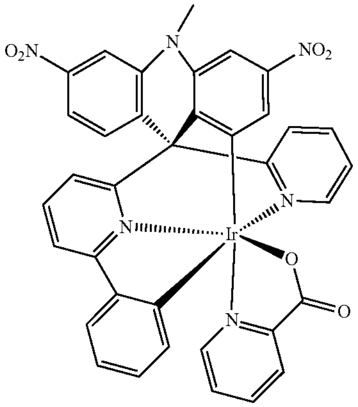
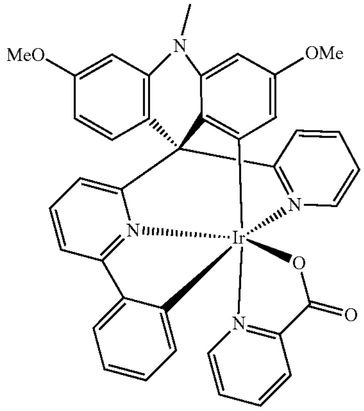
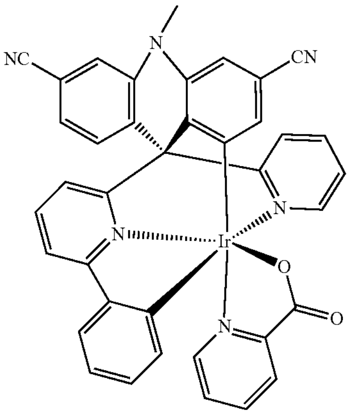
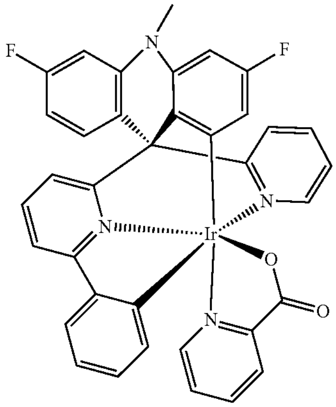
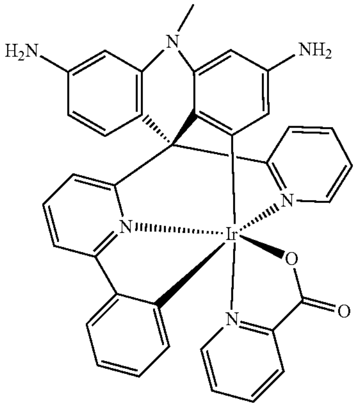
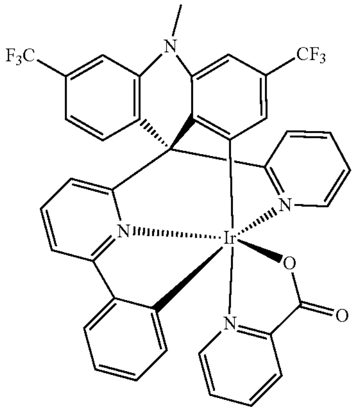

-continued
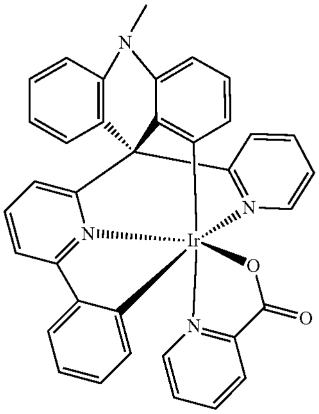
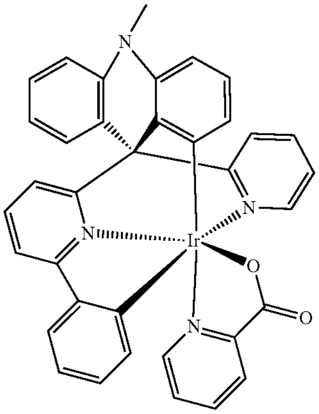
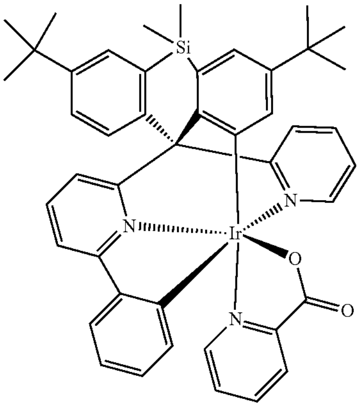
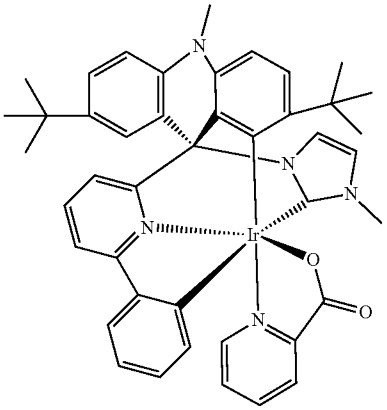
-continued
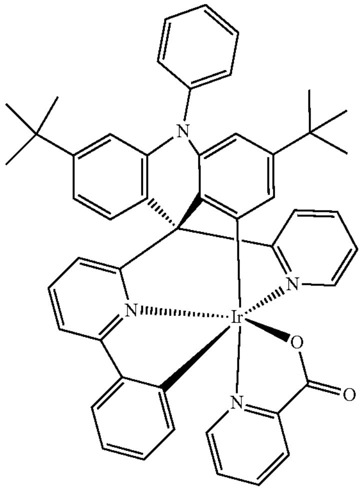
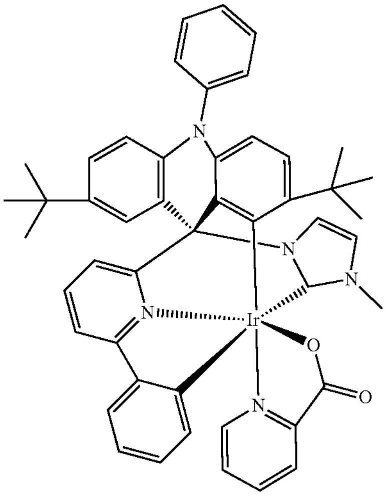
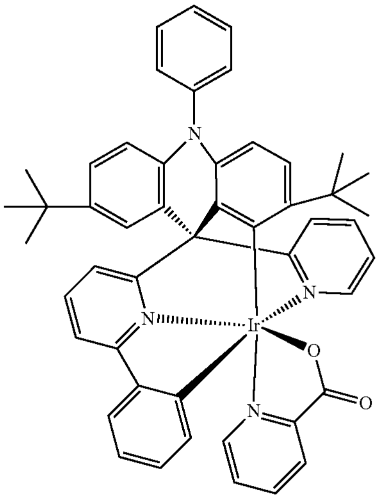

-continued
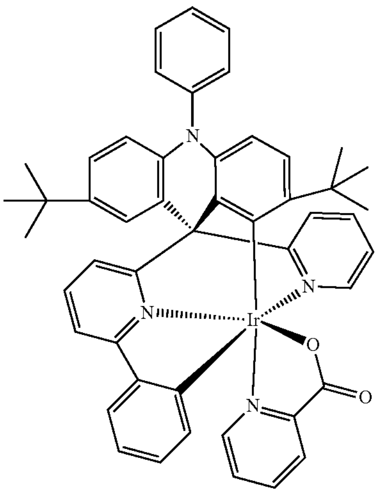
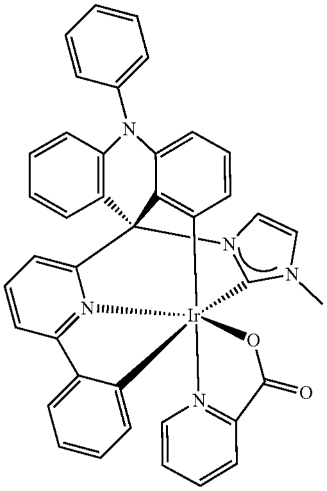
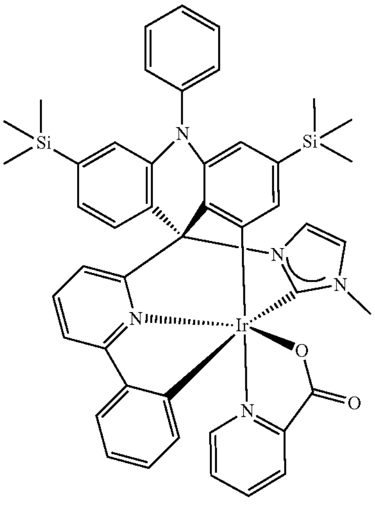
-continued
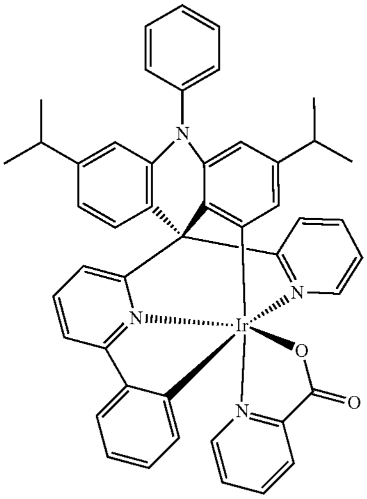
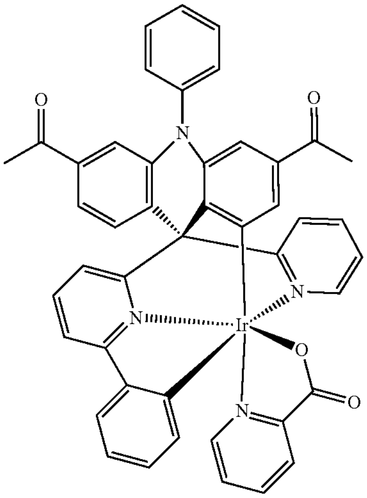
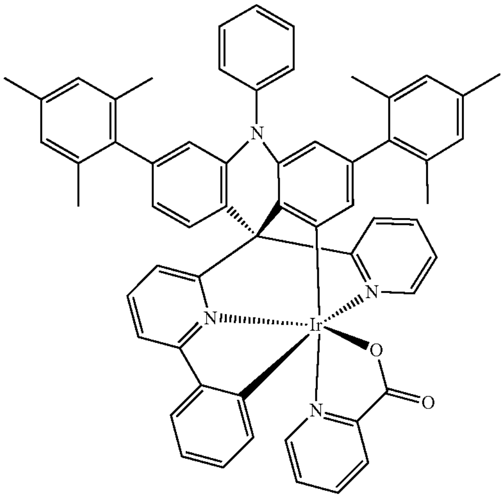

-continued
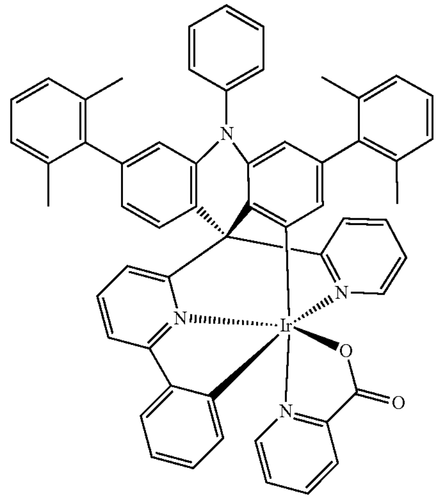
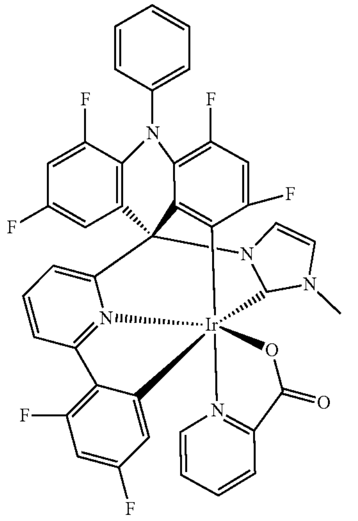
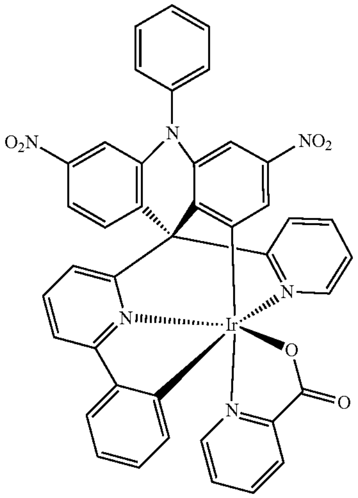
-continued
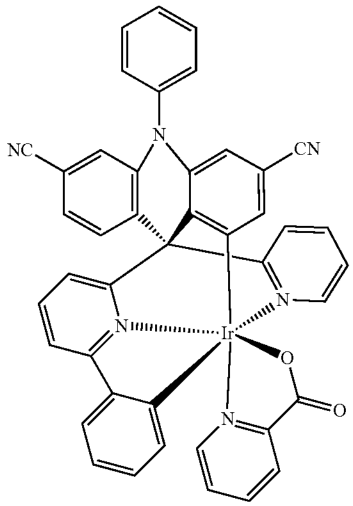
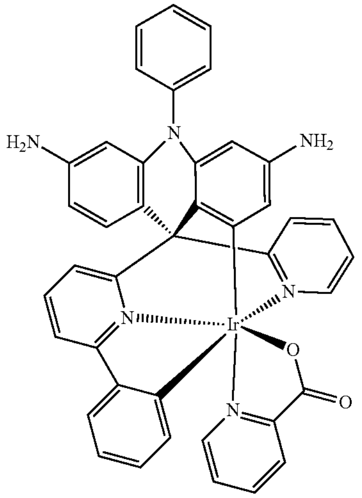
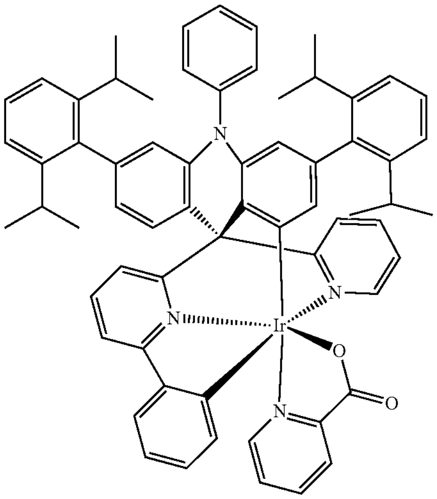

-continued
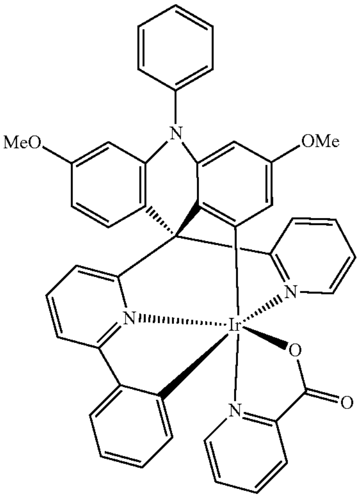
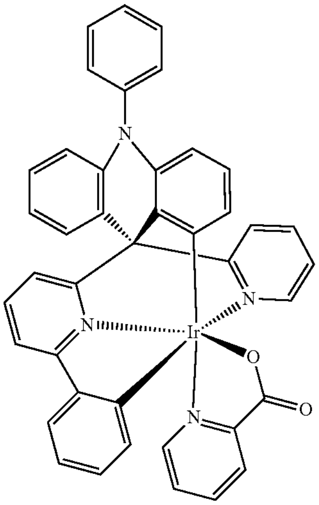
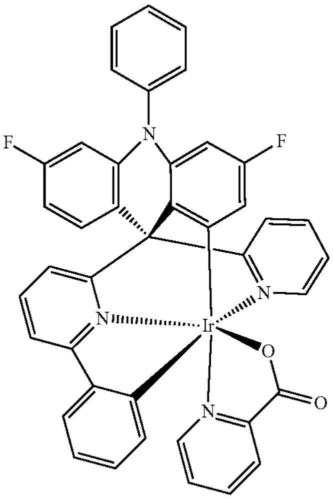
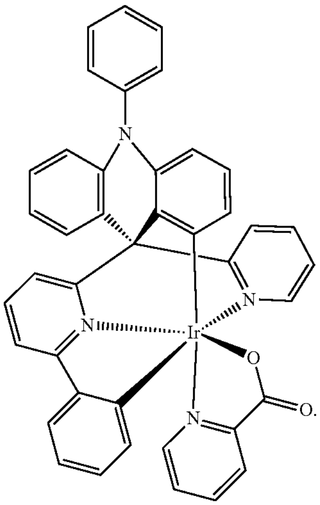
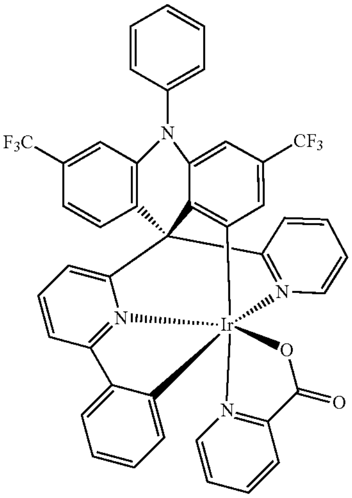
9. The iridium containing emitter according to claim 1, wherein the emitter comprises at least one of the following structures:
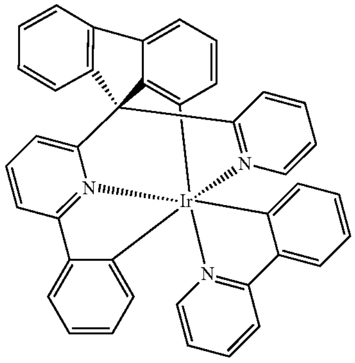
[Ir(L1)(ppy)]

-continued

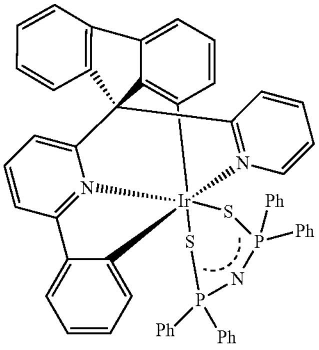

[Ir(L1)(SPN)]

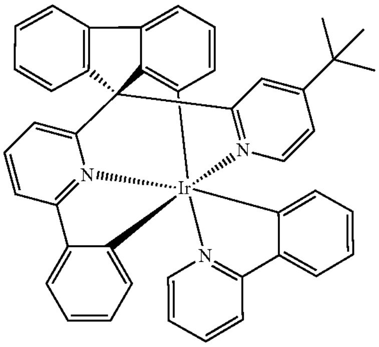

[Ir(L4)(ppy)]

-continued

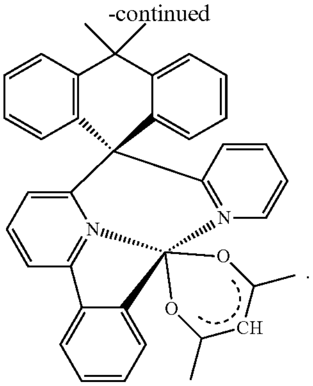

[Ir(L3)(acac)]

10. An organic light emitting device (OLED) comprising: an anode; a cathode; and an organic layer disposed between the anode and the cathode, the organic layer comprising the iridium containing emitter layer according to claim 1 comprising from 0.1% by weight to 25% by weight of the coordination complex comprising the central iridium atom and the tetradentate cyclometalated ligands including at least one spiro linkage and a bidentate ligand.

11. The OLED according to claim 10, wherein the iridium containing emitter layer comprises from 1% by weight to 20% by weight of the coordination complex.

12. The OLED according to claim 10, wherein the coordination complex is a coordination complex with an octahedral coordination geometry comprising a central iridium atom and a tetradentate cyclometalated ligands including at least one spiro linkage and a bidentate ligand.

* * * * *